(12) United States Patent
Song et al.

(10) Patent No.: US 11,404,492 B2
(45) Date of Patent: Aug. 2, 2022

(54) DISPLAY DEVICE

(71) Applicant: Samsung Display Co., Ltd., Yongin-si (KR)

(72) Inventors: Jung Bae Song, Seongnam-si (KR); Shin Moon Kang, Seoul (KR); Da Hye Kim, Goseong-gun (KR); Man Gi Kim, Suwon-si (KR); Sang Joon Ryu, Asan-si (KR); Seung In Baek, Seongnam-si (KR); Dae Woo Lee, Hwaseong-si (KR); Yeon Sung Lee, Suwon-si (KR); Youn Ho Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 200 days.

(21) Appl. No.: 16/728,295

(22) Filed: Dec. 27, 2019

(65) Prior Publication Data

US 2020/0212113 A1 Jul. 2, 2020

(30) Foreign Application Priority Data

Dec. 28, 2018 (KR) .................. 10-2018-0173023

(51) Int. Cl.
*H01L 27/32* (2006.01)
*H01L 51/52* (2006.01)
(Continued)

(52) U.S. Cl.
CPC ........ *H01L 27/322* (2013.01); *H01L 27/3246* (2013.01); *H01L 33/50* (2013.01); *H01L 51/5036* (2013.01); *H01L 51/56* (2013.01)

(58) Field of Classification Search
CPC ... H01L 27/322; H01L 27/3246; H01L 33/50; H01L 51/5036
See application file for complete search history.

(56) References Cited

U.S. PATENT DOCUMENTS 10,923,538 B2 * 2/2021 Lee ..................... H01L 51/5234
2008/0001528 A1 1/2008 Eida
(Continued)

FOREIGN PATENT DOCUMENTS

JP 2017-167515 A 9/2017
KR 10-2016-0102443 A 8/2016
(Continued)

OTHER PUBLICATIONS

Extended European Search Report for corresponding European Patent Application No. 19219688.9, dated Jun. 5, 2020, 6 pages.

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

A display device is provided. The display device includes: a display substrate on which a plurality of light-emitting areas are defined; and a color conversion substrate on which a plurality of light-transmitting areas respectively associated with the plurality of light-emitting areas and light-blocking areas between the plurality of light-transmitting areas are defined, the color conversion substrate comprising color patterns in the light-blocking areas, and light-blocking members on the color patterns, wherein at least one of the light-emitting areas has an area smaller than the area of the light-transmitting area that overlaps it in a thickness direction, and the color patterns include a blue colorant.

22 Claims, 38 Drawing Sheets

(51) Int. Cl.
*H01L 51/56* (2006.01)
*H01L 33/50* (2010.01)
*H01L 51/50* (2006.01)

(56) References Cited

U.S. PATENT DOCUMENTS

| | | | |
|---|---|---|---|
| 2016/0079311 A1* | 3/2016 | Lim | H01L 27/3211 |
| | | | 257/40 |
| 2016/0211311 A1 | 7/2016 | Sato et al. | |
| 2017/0256591 A1 | 9/2017 | Li | |
| 2017/0271554 A1 | 9/2017 | Coe-Sullivan et al. | |
| 2018/0197922 A1* | 7/2018 | Song | H01L 51/5281 |

FOREIGN PATENT DOCUMENTS

| KR | 10-2018-0025388 A | 3/2018 |
|---|---|---|
| KR | 10-2018-0079581 A | 7/2018 |

* cited by examiner

DISPLAY DEVICE

CROSS-REFERENCE TO RELATED APPLICATION

This application claims priority to and the benefit of Korean Patent Application No. 10-2018-0173023, filed on Dec. 28, 2018 in the Korean Intellectual Property Office, the entire content of which is incorporated herein by reference.

BACKGROUND

1. Field

Embodiments of the present disclosure relate to a display device.

2. Description of Related Art

Display devices have become more and more important as multimedia technology evolves. Accordingly, a variety of display devices such as liquid-crystal display devices (LCDs) and organic light-emitting diode display devices (OLEDs) are currently being developed.

Among display devices, an organic light-emitting display device includes organic light-emitting elements, which are self-luminous elements. An organic light-emitting element may include two opposing electrodes and an organic emissive layer interposed therebetween. Electrons and holes supplied from the two electrodes are recombined in the emissive layer to generate excitons, the generated excitons relax (e.g., transition) from the excited state to the ground state and accordingly light can be emitted.

Such an organic light-emitting display device does not require a separate light source, and thus, it can consume less power and can be made lighter and thinner as compared to other devices while still exhibiting high-quality characteristics such as, for example, wide viewing angle, high luminance and contrast, and fast response speed. Accordingly, organic light-emitting display devices are attracting attention as the next generation display device.

SUMMARY

As a way for allowing each pixel to represent one of primary colors, it can be contemplated to dispose a color conversion pattern or a wavelength conversion pattern on an optical path from a light source to a viewer in each of the pixels.

Aspects of embodiments of the present disclosure provide a display device capable of improving display quality by preventing or reducing color mixing between adjacent light-transmitting areas.

These and other aspects and features of embodiments of the present disclosure will become readily apparent to those of ordinary skill in the art upon review of the Detailed Description and Claims to follow.

According to an aspect of an embodiment of the present disclosure, there is provided a display device. The display device includes: a display substrate on which a plurality of light-emitting areas are defined; and a color conversion substrate on which a plurality of light-transmitting areas respectively associated with the plurality of light-emitting areas and light-blocking areas between the plurality of light-transmitting areas are defined, the color conversion substrate comprising color patterns in the light-blocking areas, and light-blocking members on the color patterns, wherein at least one of the light-emitting areas has an area smaller than the area of the light-transmitting area that overlaps it in a thickness direction, and the color patterns comprise a blue colorant.

According to another aspect of an embodiment of the present disclosure, there is provided a display device. The display device includes: a display substrate comprising a pixel-defining layer defining a plurality of light-emitting areas; a color conversion substrate comprising color patterns defining a plurality of light-transmitting areas overlapping with the light-emitting areas in a thickness direction, respectively; and a filler between the display substrate and the color conversion substrate, wherein the light-emitting areas comprise a first light-emitting area having a first area, a second light-emitting area having a second area smaller than the first area, and a third light-emitting area having a third area smaller than the second area, wherein the light-transmitting areas comprise a first light-transmitting area overlapping with the first light-emitting area in the thickness direction and having a fourth area larger than the first area, and a second light-transmitting area overlapping with the second light-emitting area in the thickness direction and having a fifth area larger than the second area, and wherein the color patterns comprise a blue colorant.

According to exemplary embodiments of the present disclosure, it is possible to prevent or reduce color mixing between adjacent light-transmitting areas to thereby improve the color gamut and to increase the luminous efficiency for a given power consumption.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of embodiments of the present disclosure will become more apparent by describing herein exemplary embodiments thereof in more detail with reference to the attached drawings, in which.

DETAILED DESCRIPTION

Figure 1:
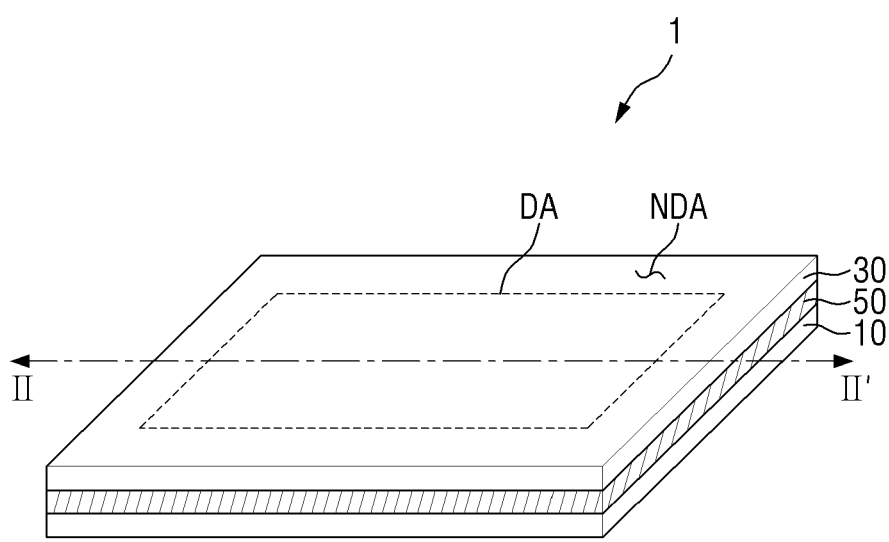
FIG. 1 is a perspective view of a display device according to an exemplary embodiment of the present disclosure.
Figure 1:
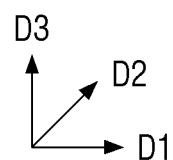

Features of embodiments of the present disclosure and methods of accomplishing the same may be understood more readily by reference to the following detailed description of embodiments and the accompanying drawings. The subject matter of the present disclosure may, however, be embodied in many different forms and should not be construed as being limited to the embodiments set forth herein. Rather, these embodiments are provided so that this disclosure will be thorough and complete and will fully convey concepts of the present disclosure to those skilled in the art, and the present disclosure will only be defined by the appended claims, and equivalents thereof. Like reference numerals refer to like elements throughout the specification.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Also, the term "exemplary" refers to an example or illustration.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the spirit and scope of the present disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The same or similar parts throughout the specification are denoted by the same reference numerals.

Hereinafter, exemplary embodiments of the present disclosure will be described with reference to the accompanying drawings.

Figure 2:
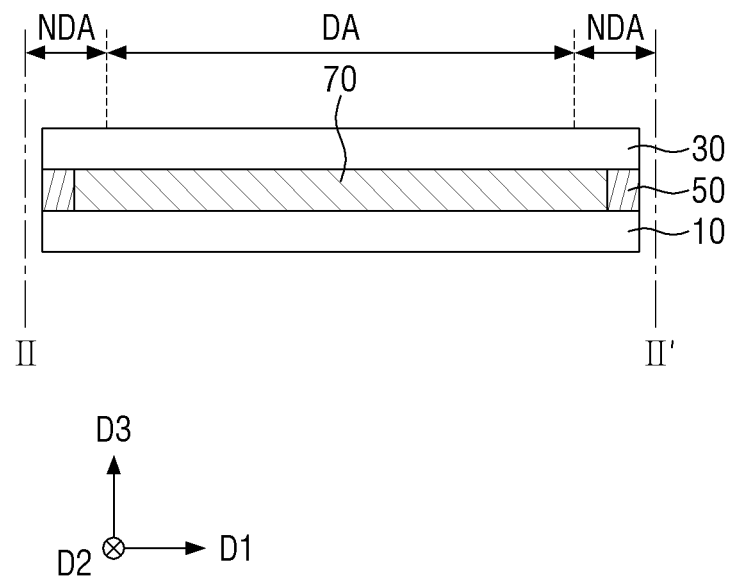
FIG. 2 is a cross-sectional view of the display device, taken along line II-II' of FIG. 1.

FIG. 1 is a perspective view of a display device according to an exemplary embodiment of the present disclosure. FIG. 2 is a cross-sectional view of the display device according to the exemplary embodiment of the present disclosure, taken along line II-II' of FIG. 1.

A display device 1 shown in FIGS. 1 and 2 may be employed in a variety of electronic devices including small-and-medium sized electronic devices such as a tablet PC, a smartphone, a vehicle navigation unit, a camera, a center information display (CID) installed in vehicles, a wrist-type electronic device (e.g., a watch kind of electronic device), a personal digital assistant (PDA), a portable multimedia player (PMP) and a game machine, and medium-and-large electronic devices such as a television, an electric billboard, a monitor, a personal computer and a laptop computer. It should be understood that the above-listed electronic devices are merely illustrative and the display device 1 may be employed in a variety of other electronic devices without departing from the scope of the present disclosure.

In some exemplary embodiments, the display device 1 may have a rectangular shape (e.g., a substantially rectangular shape) when viewed from the top. The display device 1 may include two shorter sides extended in the first direction D1, and two longer sides extended in a second direction D2 intersecting the first direction D1 (e.g., the second direction D2 is perpendicular (e.g., substantially perpendicular) to the first direction D1). Although the corners where the longer sides and the shorter sides of the display device 1 meet may form a right angle, this is merely illustrative. The display device 1 may have rounded corners. The shape of the display device 1 when viewed from the top is not limited to that shown in the drawings. The display device 1 may have a circular shape or other suitable shapes.

The display device 1 may include a display area DA where images are displayed, and a non-display area NDA where no image is displayed. In some exemplary embodiments, the non-display area NDA may be disposed around the display area DA to surround it.

As used herein, unless stated otherwise, the terms "on," "upper side," "above," "top" and "upper surface" refer to the side indicated by the arrow of the third direction D3 intersecting the first direction D1 and the second direction D2 as shown in the drawings. The terms "under," "lower side," "below," "bottom" and "lower surface" refer to the opposite side indicated by the arrow of the third direction D3 as shown in the drawings.

In some exemplary embodiments, the display device 1 may include a display substrate 10, and a color conversion substrate 30 opposed to the display substrate 10, and may further include a sealing member 50 used to couple the display substrate 10 with the color conversion substrate 30, and a filler 70 used to fill between the display substrate 10 and the color conversion substrate 30.

The display substrate 10 may include elements and circuits configured to display images, e.g., a pixel circuit such as a switching element, a pixel-defining layer for defining light-emitting areas and a non-emission area (to be described herein below) in the display area DA, and a self-luminous element. In an exemplary embodiment, the self light-emitting element may include at least one selected from an organic light-emitting diode, a quantum-dot light-emitting diode, and an inorganic-based micro light-emitting diode (e.g., Micro LED), and an inorganic-based nano light-emitting diode (e.g., Nano LED). In the following description, an organic light-emitting diode will be described as an example of the self-luminous element for convenience of illustration.

The color conversion substrate 30 may be located on the display substrate 10 and may face the display substrate 10. In some exemplary embodiments, the color conversion substrate 30 may include a color conversion pattern configured to convert the color of incident light. In some exemplary embodiments, the color conversion pattern may include a color filter and/or a wavelength conversion pattern.

The sealing member 50 may be disposed between the display substrate 10 and the color conversion substrate 30 in the non-display area NDA. The sealing member 50 may be disposed along the edges of the display substrate 10 and the color conversion substrate 30 in the non-display area NDA to surround the display area DA when viewed from the top. The display substrate 10 and the color conversion substrate 30 may be coupled to each other via the sealing member 50.

In some exemplary embodiments, the sealing member 50 may be made of an organic material. For example, the sealing member 50 may be made of, but is not limited to, an epoxy resin.

The filler 70 may be located in the space between the display substrate 10 and the color conversion substrate 30 surrounded by the sealing member 50. The filler 70 may be used to fill the space between the display substrate 10 and the color conversion substrate 30.

In some exemplary embodiments, the filler 70 may be made of a material configured to transmit light. In some exemplary embodiments, the filler 70 may be made of an organic material. For example, the filler 70 may be made of, but is not limited to, an Si-based organic material, an epoxy-based organic material, etc. In another exemplary embodiment, the filler 70 may be eliminated or omitted.

Figure 3:
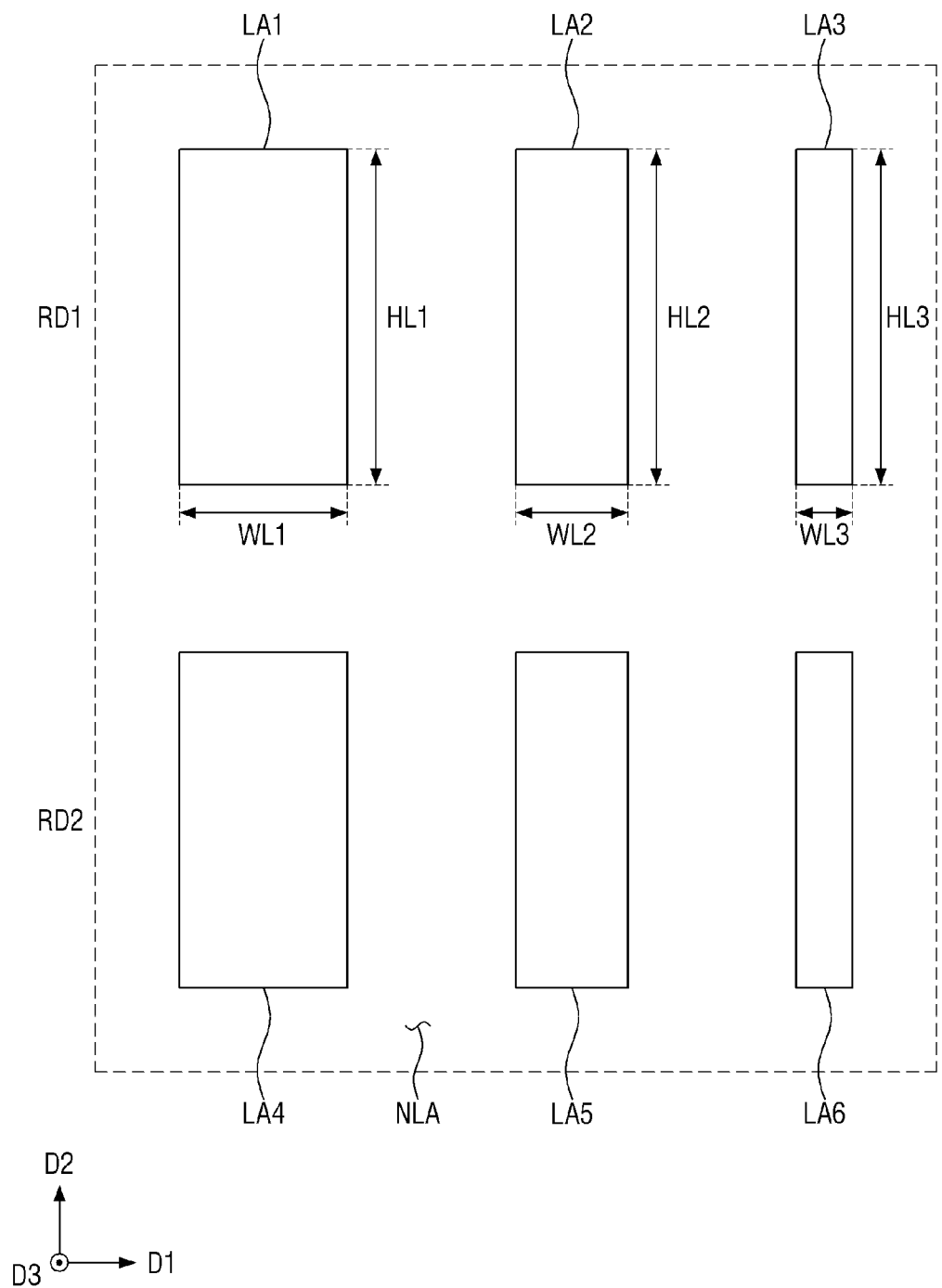
FIG. 3 is a plan view of the display substrate in the display area of the display device shown in FIGS. 1 and 2.
Figure 4:
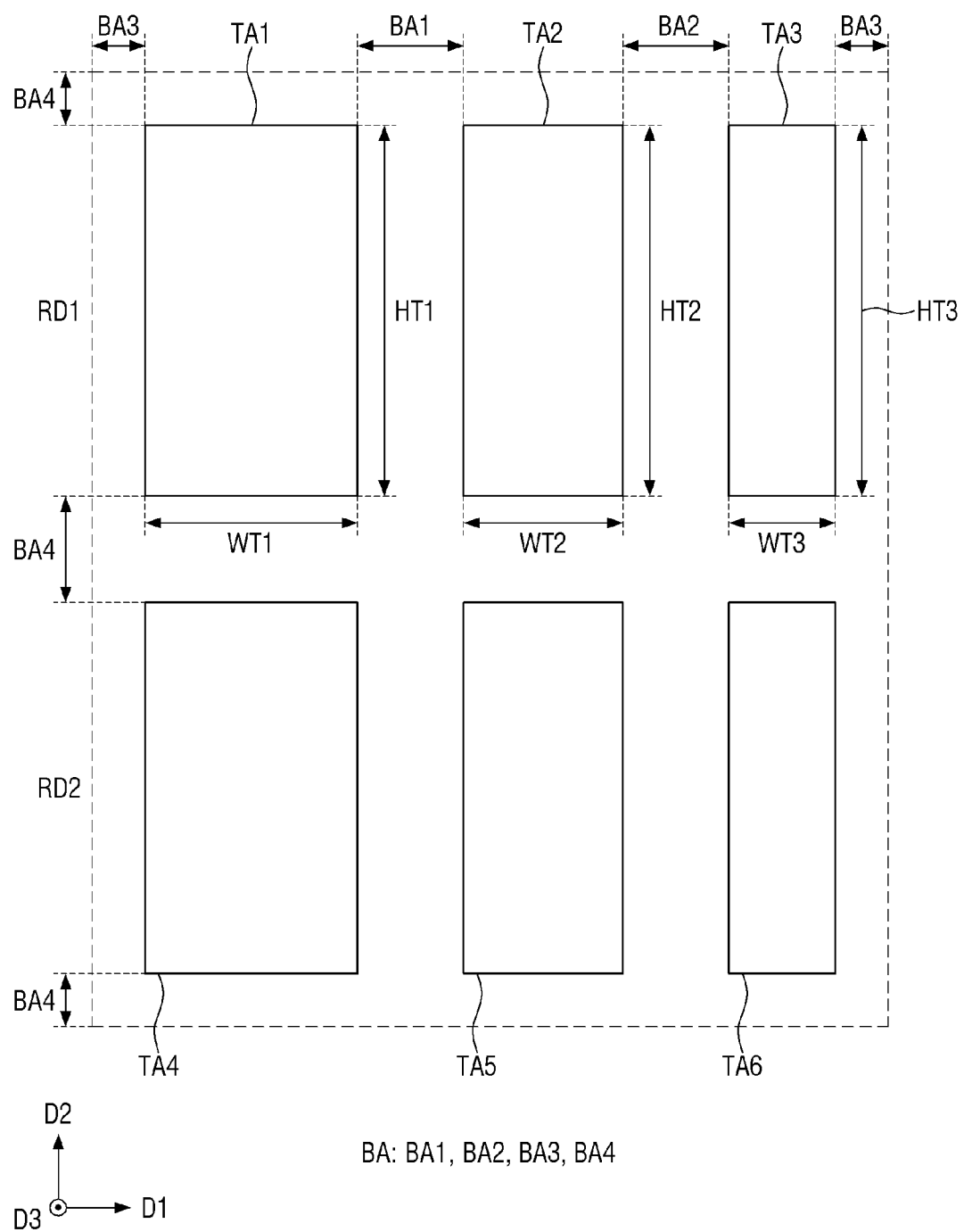
FIG. 4 is a plan view of the color conversion substrate in the display area of the display device shown in FIGS. 1 and 2.
Figure 5:
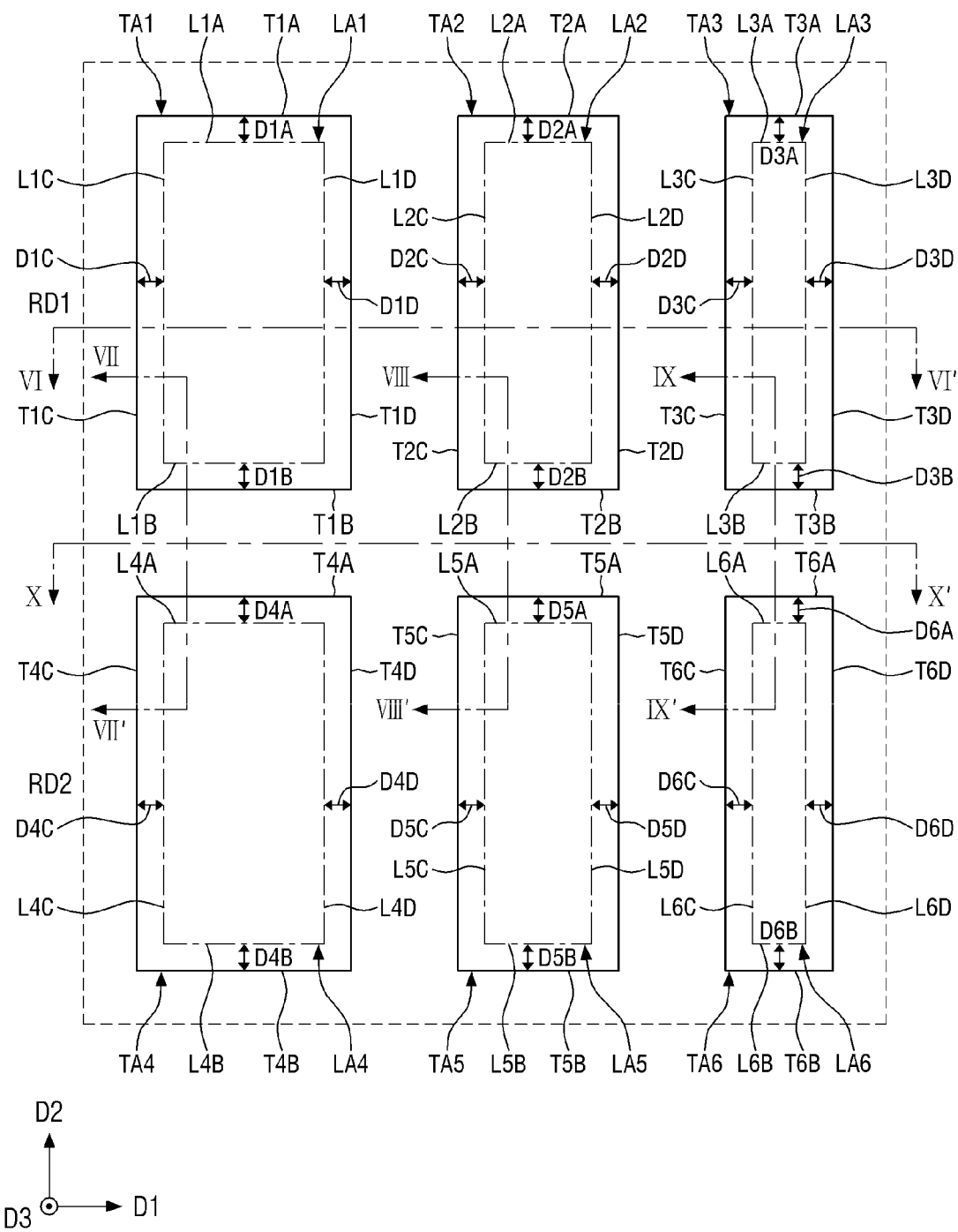
FIG. 5 is a plan view showing the arrangement relationship between the display substrate of FIG. 3 and the color conversion substrate of FIG. 4.

FIG. 3 is a plan view of the display substrate in the display area of the display device shown in FIGS. 1 and 2. FIG. 4 is a plan view of the color conversion substrate in the display area of the display device shown in FIGS. 1 and 2. FIG. 5 is a plan view showing the arrangement relationship between the display substrate of FIG. 3 and the color conversion substrate of FIG. 4.

Referring to FIG. 3 in conjunction with FIGS. 1 and 2, a plurality of light-emitting areas LA1, LA2, LA3, LA4, LA5 and LA6 and a non-emitting area NLA may be defined on the display substrate 10 in the display area DA. In the light-emitting areas LA1, LA2, LA3, LA4, LA5 and LA6, light generated in the light-emitting elements of the display substrate 10 exits out of the display substrate 10. In the non-emitting area NLA, no light exits out of the display substrate 10.

In some exemplary embodiments, light exiting out of the display substrate 10 in each of the light-emitting areas LA1, LA2, LA3, LA4, LA5 and LA6 may be light of a first color. In some exemplary embodiments, the light of the first color may be blue light and may have a peak wavelength in the range of approximately 430 to 470 nm.

In some exemplary embodiments, in a first row RD1 in the display area DA of the display substrate 10, a first light-emitting area LA1, a second light-emitting area LA2 and a third light-emitting area LA3 may be arranged repeatedly in the stated order along a first direction D1. In addition, in a second row RD2 adjacent to the first row RD1 in the second direction D2, the fourth light-emitting area LA4, the fifth light-emitting area LA5 and the sixth light-emitting area LA6 may be repeatedly arranged in the stated order.

In some exemplary embodiments, a first width WL1 of the first light-emitting area LA1 measured in the first direction D1 may be greater than a second width WL2 of the second light-emitting area LA2 and a third width WL3 of the third light-emitting area LA3 measured in the first direction D1. In some exemplary embodiments, the second width WL2 of the second light-emitting area LA2 may be different from the third width WL3 of the third light-emitting area LA3. For example, the second width WL2 of the second light-emitting area LA2 may be greater than the third width WL3 of the third light-emitting area LA3.

A first length HL1 of the first light-emitting area LA1 measured along the second direction D2 may be equal to a second length HL2 of the second light-emitting area LA2 and a third length HL3 of the third light-emitting area LA3. It is, however, to be understood that the present disclosure is not limited thereto. The first length HL1 of the first light-emitting area LA1 may be different from the second length HL2 of the second light-emitting area LA2 and the third length HL3 of the third light-emitting area LA3. For example, the second length HL2 of the second light-emitting area LA2 may be smaller than the first length HL1 of the first light-emitting area LA1, and the third length HL3 of the third light-emitting area LA3 may be smaller than the second length HL2 of the second light-emitting area LA2. In some embodiments, one of the first length HL1 of the first light-emitting area LA1, the second length HL2 of the second light-emitting area LA2 and the third length HL3 of the third light-emitting area LA3 may be different from the other two of them.

In some exemplary embodiments, the area of the first light-emitting area LA1 may be greater than the area of the second light-emitting area LA2 and the area of the third light-emitting area LA3. For example, the area of the first light-emitting area LA1 may be greater than the area of the second light-emitting area LA2, and the area of the second light-emitting area LA2 may be greater than the area of the third light-emitting area LA3. It is, however, to be understood that the present disclosure is not limited thereto. The area of the first light-emitting area LA1, the area of the second light-emitting area LA2 and the area of the third light-emitting area LA3 may be equal to one another.

The fourth light-emitting area LA4 adjacent to the first light-emitting area LA1 in the second direction D2 is substantially identical to the first light-emitting area LA1 except that it is located in the second row RD2.

Similarly, the second light-emitting area LA2 adjacent to the fifth light-emitting area LA5 in the second direction D2 may have substantially identical structures, and the third light-emitting area LA3 adjacent to the sixth light-emitting area LA6 in the second direction D2 may have substantially identical structures.

Referring to FIG. 4 in conjunction with FIGS. 1 and 2, a plurality of light-transmitting areas TA1, TA2, TA3, TA4, TA5 and TA6 and light-blocking areas BA may be defined on the color conversion substrate 30 in the display area DA. In the light-transmitting areas TA1, TA2, TA3, TA4, TA5 and TA6, the light exiting from the display substrate 10 may transmit the color conversion substrate 30 to be provided to the outside of the display device 1. The light exiting from the display substrate 10 cannot (or substantially cannot) be transmitted through the light-blocking areas BA.

In some exemplary embodiments, the light of the first color provided from the display substrate 10 may be transmitted through the first light-transmitting area TA1, the second light-transmitting area TA2 and the third light-transmitting area TA3 to exit out of the display device 1. In the following description, the light exiting out of the display device 1 through the first light-transmitting area TA1 is referred to as a first exiting light, the light exiting out of the display device 1 through the second light-transmitting area TA2 is referred to as a second exiting light, and the light exiting out of the display device 1 through the third light-transmitting area TA3 is referred to as a third exiting light. The first outgoing light may be light of a second color different from the first color, the second outgoing light may be light of a third color different from the first color and the second color, and the third outgoing light may be light of the first color. In some exemplary embodiments, the light of the first color may be a blue light having a peak wavelength in the range of approximately 430 to 470 nm as described herein above, and the light of the second color may be a red light having a peak wavelength in the range of approximately 610 to 650 nm. In addition, the light of the third color may be green light having a peak wavelength in the range of approximately 510 to 550 nm.

In the second row RD2 adjacent to the first row RD1 along the second direction D2, the fourth light-transmitting area TA4, the fifth light-transmitting area TA5 and the sixth light-transmitting area TA6 may be repeatedly arranged in the stated order. The fourth light-transmitting area TA4 may be in line with the fourth light-emitting area LA4, the fifth light-transmitting area TA5 may be in line with the fifth light-emitting area LA5, and the sixth light-transmitting area TA6 may be in line with the sixth light-emitting area LA6.

Similarly to the first light-emitting area LA1, the second light-emitting area LA2 and the third light-emitting area LA3, in some exemplary embodiments, a first width WT1 of the first light-transmitting area TA1 measured in the first direction D1 may be greater than a second width WT2 of the second light-transmitting area TA2 and a third width WT3 of the third light-transmitting area TA3 measured in the first direction D1. In some exemplary embodiments, the second width WT2 of the second light-transmitting area TA2 may be different from the third width WT3 of the third light-transmitting area TA3. For example, the second width WT2 of the second light-transmitting area TA2 may be greater than the third width WT3 of the third light-transmitting area TA3.

A first length HT1 of the first light-emitting area LA1 measured in the second direction D2 may be equal to a second length HT2 of the second light-transmitting area TA2 and a third length HT3 of the third light-transmitting area TA3. It is, however, to be understood that the present disclosure is not limited thereto. The first length HL1 of the first light-transmitting area TA1 may be different from the second length HT2 of the second light-transmitting area TA2 and the third length HT3 of the third light-transmitting area TA3. For example, the second length HT2 of the second light-transmitting area TA2 may be smaller than the first length HT1 of the first light-transmitting area TA1, and the third length HT3 of the third light-transmitting area TA3 may be smaller than the second length HT2 of the second light-transmitting area TA2. In some embodiments, one of the first length HT1 of the first light-transmitting area TA1, the second length HT2 of the second light-transmitting area TA2 and the third length HT3 of the third light-transmitting area LA3 may be different from the other two of them.

In some exemplary embodiments, the area of the first light-transmitting area TA1 may be greater than the area of the second light-transmitting area TA2 and the area of the third light-transmitting area TA3. For example, the area of the first light-transmitting area TA1 may be greater than the area of the second light-transmitting TA2, and the area of the second light-transmitting area TA2 may be greater than the area of the third light-transmitting area TA3. It is, however, to be understood that the present disclosure is not limited thereto. The area of the first light-transmitting area TA1, the area of the second light-transmitting area TA2 and the area of the third light-transmitting area TA3 may be equal to one another.

The first light-transmitting area TA1 and the fourth light-transmitting area TA4 which are adjacent to each other in the second direction D2 may have substantially the same width, area, elements arranged therein and the same (e.g., substantially the same) color of the light exiting out of the display device 1.

Similarly, the second light-transmitting area TA2 and the fifth light-transmitting area TA5 which are adjacent to each other in the second direction D2 may have substantially the same structure and the same (e.g., substantially the same) color of the light exiting out of the display device 1. In addition, the third light-transmitting area TA3 and the sixth light-transmitting area TA6 which are adjacent to each other in the second direction D2 may have substantially the same structure and the same (e.g., substantially the same) color of the light exiting out of the display device 1.

The light-blocking area BA may be located around the light-transmitting areas TA1, TA2, TA3, TA4, TA5 and TA6 of the color conversion substrate 30 in the display area DA. In some exemplary embodiments, the light-blocking area BA may be divided into a first light-blocking area BA1, a second light-blocking area BA2, a third light-blocking area BA3 and a fourth light-blocking area BA4.

The first light-blocking area BA1 may be located between the first light-transmitting area TA1 and the second light-transmitting area TA2 along the first direction D1. The second light-blocking area BA2 may be located between the second light-transmitting area TA2 and the third light-transmitting area TA3 along the first direction D1. The third light-blocking area BA3 may be located between the third light-transmitting area TA3 and the first light-transmitting area TA1 along the first direction D1. The fourth light-blocking area BA4 may be located between the first row RD1 and the second row RD2 adjacent each other in the second direction D2.

Referring to FIG. 5, on the color conversion substrate 30 in the display area DA, the first light-transmitting area TA1 may in line with or overlap with the first light-emitting area LA1 of the display substrate 10. The second light-transmitting area TA2 may in line with or overlap with the second light-emitting area LA2 of the display substrate 10. The third light-transmitting area TA3 may in line with or overlap with the third light-emitting area LA3 of the display substrate 10. The fourth light-transmitting area TA4 may in line with or overlap with the fourth light-emitting area LA4 of the display substrate 10. The fifth light-transmitting area TA5 may in line with or overlap with the fourth light-emitting area LA4 of the display substrate 10. The sixth light-transmitting area TA6 may in line with or overlap with the fifth light-emitting area LA5 of the display substrate 10.

The area of the first light-emitting area LA1 may be smaller than the area of the first light-transmitting area TA1. The area of the second light-emitting area LA2 may be smaller than the area of the second light-transmitting area TA2. The area of the third light-emitting area LA3 may be smaller than the area of the third light-transmitting area TA3. The area of the fourth light-emitting area LA4 may be smaller than the area of the fourth light-transmitting area TA4. The area of the fifth light-emitting area LA5 may be smaller than the area of the fifth light-transmitting area TA5. The area of the sixth light-emitting area LA6 may be smaller than the area of the sixth light-transmitting area TA6. It is, however, to be understood that the present disclosure is not limited thereto. Some of the first to sixth light-emitting areas LA1, LA2, LA3, LA4, LA5 and LA6 may have the areas equal to the areas of the respective ones of the light-transmitting areas TA1, TA2, TA3, TA4, TA5 and TA6, and the others of them may have areas smaller than the areas of the respective ones of the light-transmitting areas TA1, TA2, TA3, TA4, TA5 and TA6.

In some embodiments, the first light-emitting area LA1 may include a first side L1A of the first light-emitting area LA1 and a second side L1B of the first light-emitting area LA1 in parallel (e.g., substantially in parallel) with each other in the second direction D2, and a third side L1C of the first light-emitting area LA1 and a fourth side L1D of the first light-emitting area LA1 in parallel (e.g., substantially in parallel) with each other in the first direction D1. The area of the first light-emitting area LA1 may be defined by the first to fourth sides L1A, L1B, L1C and L1D. It is, however, to be understood that the present disclosure is not limited thereto. The number of the side defining the first light-emitting area LA1 may vary depending on the shape of the first light-emitting area LA1.

The first light-transmitting area TA1 may include a first side T1A and a second side T1B thereof in parallel (e.g., substantially in parallel) with each other in the second direction D2, and a third side T1C and a fourth side T1B thereof in parallel (e.g., substantially in parallel) with each other in the first direction D1. The area of the first light-transmitting area TA1 may be defined by the first to fourth sides T1A, T1B, T1C and T1D. It is, however, to be understood that the present disclosure is not limited thereto. The number of the side defining the first light-transmitting area TA1 may vary depending on the shape of the first light-transmitting area TA1.

The first to fourth sides L1A, L1B, L1C and L1D of the first light-emitting area LA1 may be disposed on the inner side of the first to fourth sides T1A, T1B, T1C and T1D of the first light-transmitting area TA1, respectively. In some embodiments, the first side L1A of the first light-emitting area LA1 may be spaced apart from the first side T1A of the first light-transmitting area TA1 by a 1_1 distance D1A in the second direction D2. The second side L1B of the first light-emitting area LA1 may be spaced apart from the second side T1B of the first light-transmitting area TA1 by a 1_2 distance D1B in the second direction D2. The third side L1C of the first light-emitting area LA1 may be spaced apart from the third side T1C of the first light-transmitting area TA1 by a 1_3 distance D1C in the first direction D1. The fourth side L1D of the first light-emitting area LA1 may be spaced apart from the fourth side T1D of the first light-transmitting area TA1 by a 1_4 distance D1D in the first direction D1. Each of the (1_1) distance D1A, the (1_2) distance D1B, the (1_3) distance D1C and the (1_4) distance D1D may range from 1 to 16 μm.

The (1_1) distance D1A, the (1_2) distance D1B, the (1_3) distance D1C and the (1_4) distance D1D may all be equal. However, it is merely illustrative. In some exemplary embodiments, the (1_1) distance D1A, the (1_2) distance D1B, the (1_3) distance D1C and the (1_4) distance D1D may be different from one another. In some embodiments, only some of the (1_1) distance D1A, the (1_2) distance D1B, the (1_3) distance D1C and the (1_4) distance D1D may be different from one another. For example, the first light-emitting area LA1 may have a smaller area than the first light-transmitting area TA1 and may be disposed closer to one of the first to fourth sides T1A, T1B, T1C and T1D of the first light-transmitting area TA1.

The first to fourth sides L2A, L2B, L2C and L2D of the second light-emitting area LA2 may be disposed on the inner side of the first to fourth sides T2A, T2B, T2C and T2D of the second light-transmitting area TA2, respectively. In some embodiments, the first side L2A of the second light-emitting area LA2 may be spaced apart from the first side T2A of the second light-transmitting area TA2 by a 2_1 distance D2A in the second direction D2. The second side L2B of the second light-emitting area LA2 may be spaced apart from the second side T6B of the second light-transmitting area TA2 by a 2_2 distance D2B in the second direction D2. The third side L2C of the second light-emitting area LA2 may be spaced apart from the third side T2C of the second light-transmitting area TA2 by a 2_3 distance D2C in the first direction D1. The fourth side L2D of the second light-emitting area LA2 may be spaced apart from the fourth side T2D of the second light-transmitting area TA2 by a 2_4 distance D2D in the first direction D1. Each of the (2_1) distance D2A, the (2_2) distance D2B, the (2_3) distance D2C and the (2_4) distance D2D may range from 1 to 16 μm.

The (2_1) distance D2A, the (2_2) distance D2B, the (2_3) distance D2C and the (2_4) distance D2D may all be equal. It is, however, to be understood that the present disclosure is not limited thereto. In some exemplary embodiments, the (2_1) distance D2A, the (2_2) distance D2B, the (2_3) distance D2C and the (2_4) distance D2D may be different from one another. In some embodiments, only some of the (2_1) distance D2A, the (2_2) distance D2B, the (2_3) distance D2C and the (2_4) distance D2D may be different from one another. For example, the second light-emitting area LA2 may have a smaller area than the second light-transmitting area TA2 and may be disposed closer to one of the first to fourth sides T2A, T2B, T2C and T2D of the second light-transmitting area TA2.

The (2_1) distance D2A, the (2_2) distance D2B, the (2_3) distance D2C and the (2_4) distance D2D may be, but is not limited to being, equal to the (1_1) distance D1A, the (1_2) distance D1B, the (1_3) distance D1C and the (1_4) distance D1D, respectively. The (2_1) distance D2A, the (2_2) distance D2B, the (2_3) distance D2C and the (2_4) distance D2D may be different from the (1_1) distance D1A, the (1_2) distance D1B, the (1_3) distance D1C and the (1_4) distance D1D, respectively.

The first to fourth sides L3A, L3B, L3C and L3D of the third light-emitting area LA3 may be disposed on the inner side of the first to fourth sides T3A, T3B, T3C and T3D of the third light-transmitting area TA3, respectively. In some embodiments, the first side L3A of the third light-emitting area LA3 may be spaced apart from the first side T3A of the third light-transmitting area TA3 by a 3_1 distance D3A in the second direction D2. The second side L3B of the third light-emitting area LA3 may be spaced apart from the second side T3B of the third light-transmitting area TA3 by a 3_2 distance D2B in the second direction D2. The third side L3C of the third light-emitting area LA3 may be spaced apart from the third side T3C of the third light-transmitting area TA3 by a 3_3 distance D3C in the first direction D1. The fourth side L3D of the third light-emitting area LA3 may be spaced apart from the fourth side T3D of the third light-transmitting area TA3 by a 3_4 distance D3D in the first direction D1. Each of the (3_1) distance D3A, the (3_2) distance D3B, the (3_3) distance D3C and the (3_4) distance D3D may range from 1 to 16 μm.

The (3_1) distance D3A, the (3_2) distance D3B, the (3_3) distance D3C and the (3_4) distance D3D may all be equal. It is, however, to be understood that the present disclosure is not limited thereto. In some exemplary embodiments, the (3_1) distance D3A, the (3_2) distance D3B, the (3_3) distance D3C and the (3_4) distance D3D may be different from one another. In some embodiments, only some of the (3_1) distance D3A, the (3_2) distance D3B, the (3_3) distance D3C and the (3_4) distance D3D may be different from one another. For example, the third light-emitting area LA3 may have a smaller area than the third light-transmitting area TA3 and may be disposed closer to one of the first to fourth sides T3A, T3B, T3C and T3D of the third light-transmitting area TA3.

The (3_1) distance D3A, the (3_2) distance D3B, the (3_3) distance D3C and the (3_4) distance D3D may be, but is not limited to being, equal to the (1_1) distance D1A, the (1_2) distance D1B, the (1_3) distance D1C and the (1_4) distance D1D, respectively.

The (3_1) distance D3A, the (3_2) distance D3B, the (3_3) distance D3C and the (3_4) distance D3D may be, but is not limited to being, equal to the (2_1) distance D2A, the (2_2) distance D2B, the (2_3) distance D2C and the (2_4) distance D2D, respectively.

The fourth light-emitting area LA4 and the fourth light-transmitting area TA4 adjacent to the first light-emitting area LA1 and the first light-transmitting area TA1 in the second direction D2, respectively, may be different from the first light-emitting area LA1 and the first light-transmitting area TA1 only in that the formers are located in the second row RD2. The first to fourth sides L4A, L4B, L4C and L4D of the fourth light-emitting area LA4, the first to fourth sides T4A, T4B, T4C and T4D of the fourth light-transmitting area TA4 and the (4_1) to (4_4) distances D4A, D4B, D4C and D4D may be substantially identical to the first to fourth sides L1A, L1B, L1C and L1D of the first light-emitting area LA1, the first to fourth sides T1A, T1B, T1C and T1D of the first light-transmitting area TA1 and the (1_1) to (1_4) distances D1A, D1B, D1C and D1D, respectively.

The fifth light-emitting area LA5 and the fifth light-transmitting area TA5 adjacent to the second light-emitting area LA2 and the second light-transmitting area TA2 in the second direction D2, respectively, may be different from the second light-emitting area LA2 and the second light-transmitting area TA2 only in that the formers are located in the second row RD2. The first to fourth sides L5A, L5B, L5C and L5D of the fifth light-emitting area LA5, the first to fourth sides T5A, T5B, T5C and T5D of the fifth light-transmitting area TA5 and the (4_1) to (4_4) distances D5A, D5B, D5C and D5D may be substantially identical to the first to fourth sides L2A, L2B, L2C and L2D of the second light-emitting area LA2, the first to fourth sides T2A, T2B, T2C and T2D of the second light-transmitting area TA2 and the (1_1) to (1_4) distances D2A, D2B, D2C and D2D, respectively.

The sixth light-emitting area LA6 and the sixth light-transmitting area TA6 adjacent to the third light-emitting area LA3 and the third light-transmitting area TA3 in the second direction D2, respectively, may be different from the third light-emitting area LA3 and the third light-transmitting area TA3 only in that the formers are located in the second row RD2. The first to fourth sides L6A, L6B, L6C and L6D of the sixth light-emitting area LA6, the first to fourth sides T6A, T6B, T6C and T6D of the sixth light-transmitting area TA6 and the (4_1) to (4_4) distances D6A, D6B, D6C and D6D may be substantially identical to the first to fourth sides L3A, L3B, L3C and L3D of the third light-emitting area LA3, the first to fourth sides T3A, T3B, T3C and T3D of the third light-transmitting area TA3 and the (1_1) to (1_4) distances D3A, D3B, D3C and D3D, respectively.

In this manner, the areas of the first to sixth light-emitting areas LA1, LA2, LA3, LA4, LA5 and LA6 associated with the first to sixth light-transmitting areas TA1, TA2, TA3, TA4, TA5 and TA6, respectively, are reduced, so that it is possible to prevent or reduce color mixing between adjacent light-transmitting areas, thereby improving color gamut and increasing luminous efficiency for a given power consumption.

Hereinafter, the structure of the display device 1 will be described in more detail.

Figure 6:
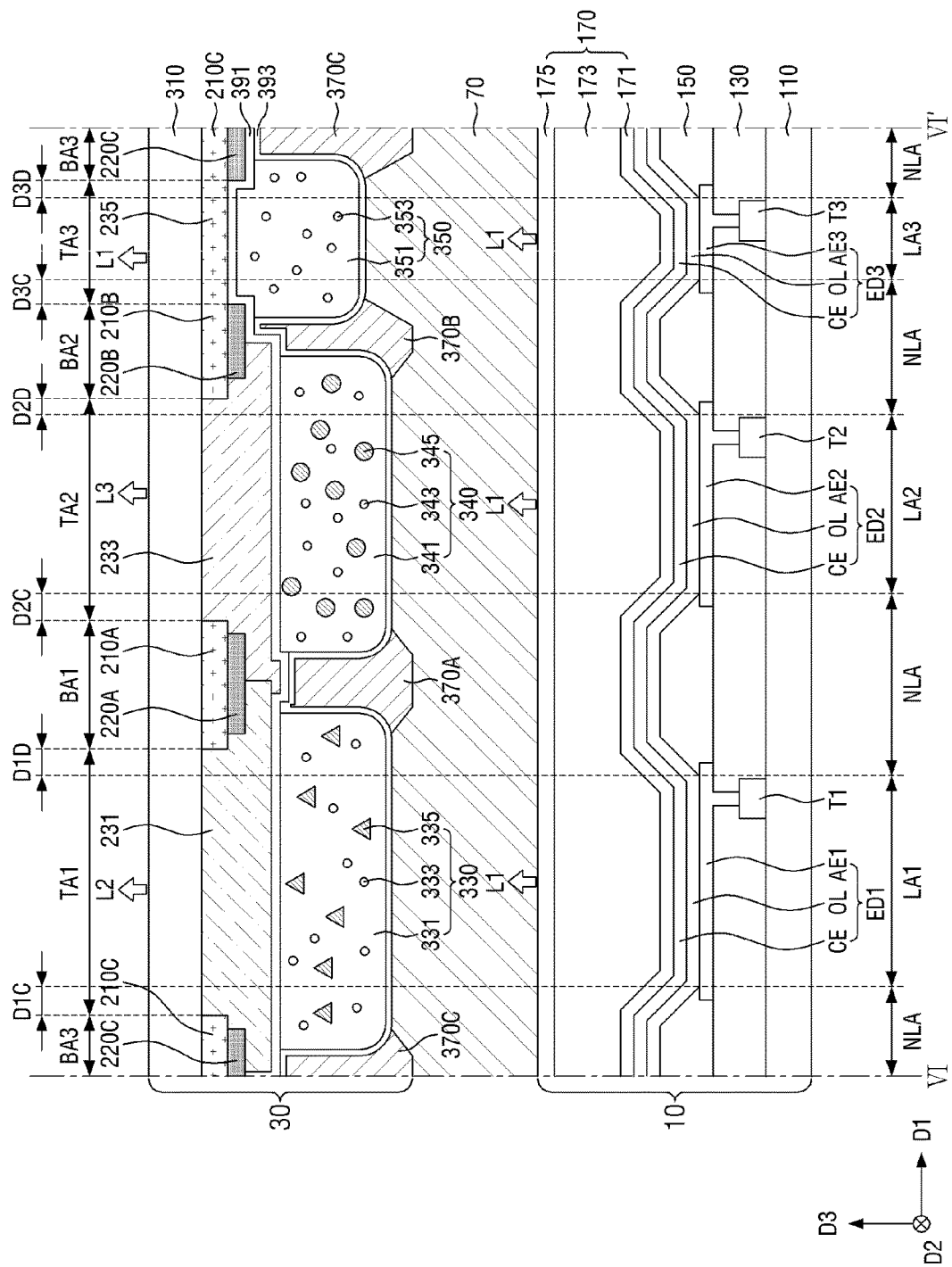
FIG. 6 is a cross-sectional view of the display device according to the exemplary embodiment of the present disclosure, taken along line VI-VI' of FIG. 5.
Figure 7:
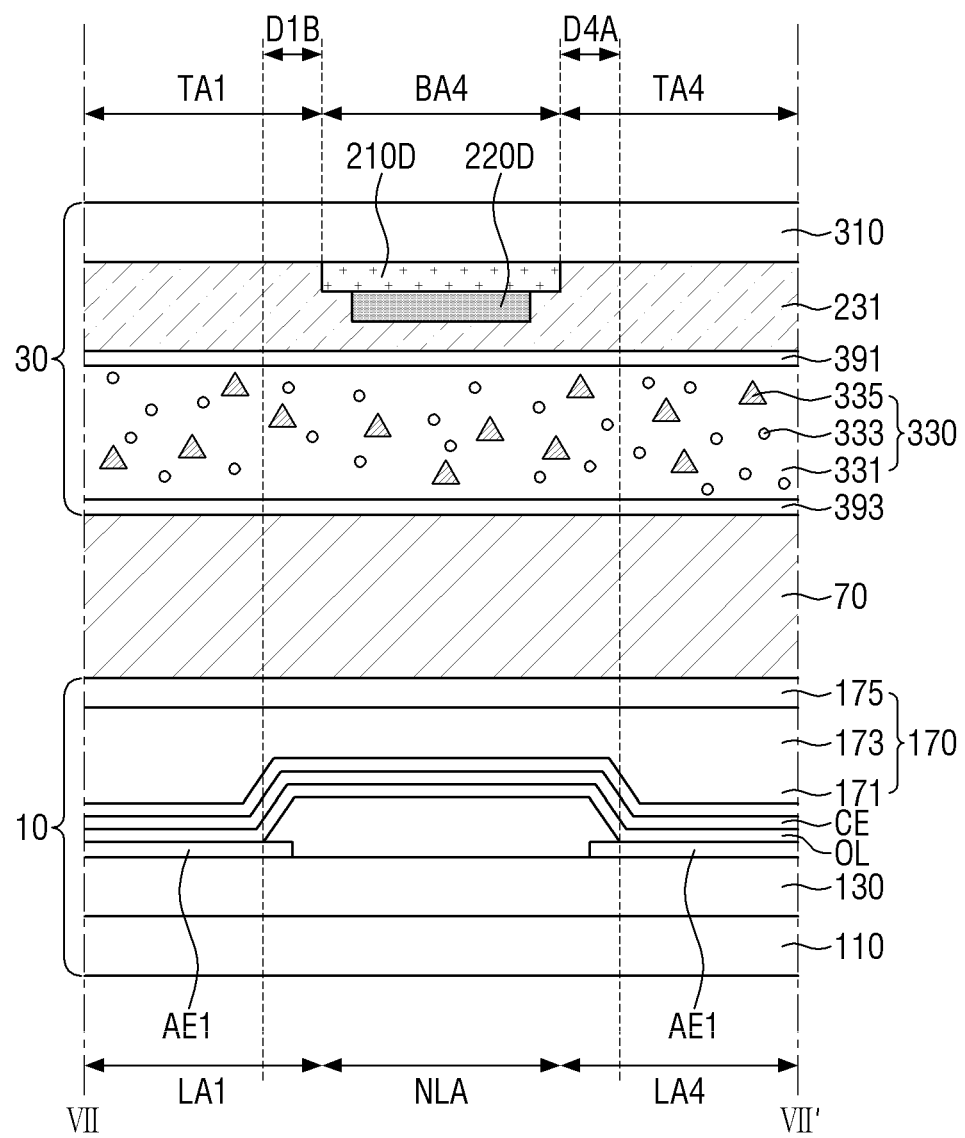
FIG. 7 is a cross-sectional view of the display device according to the exemplary embodiment of the present disclosure, taken along line VII-VII' of FIG. 5.
Figure 8:
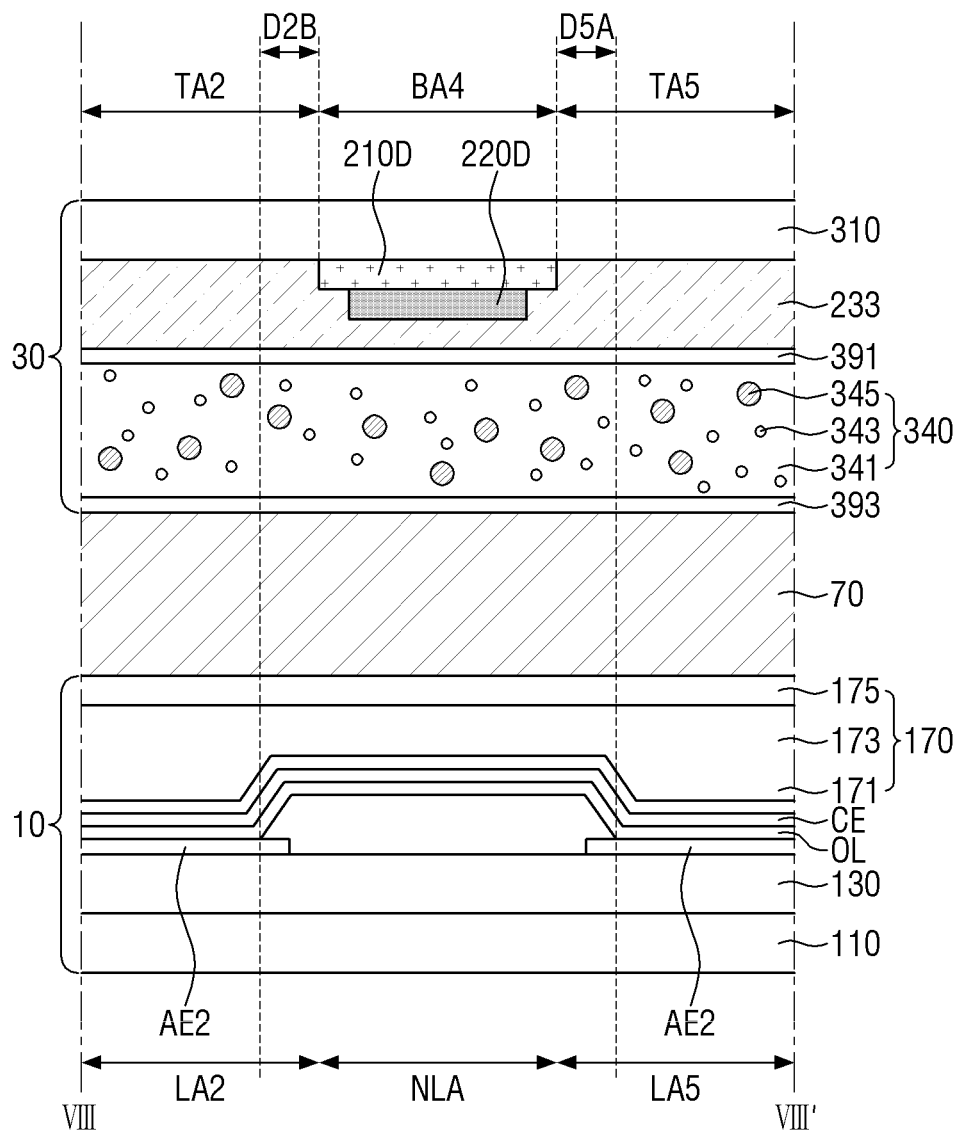
FIG. 8 is a cross-sectional view of the display device according to the exemplary embodiment of the present disclosure, taken along line VIII-VIII' of FIG. 5.
Figure 9:
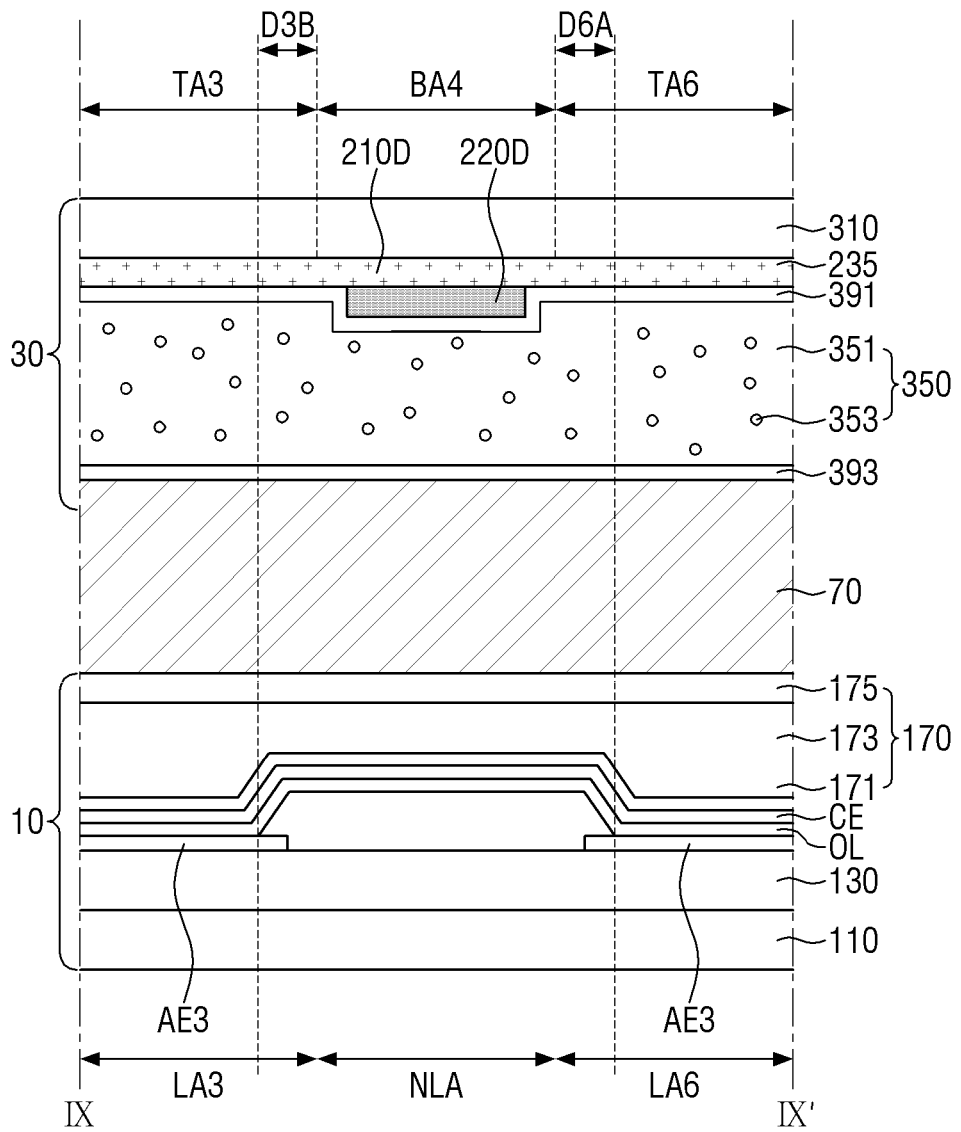
FIG. 9 is a cross-sectional view of the display device according to the exemplary embodiment of the present disclosure, taken along line IX-IX' of FIG. 5.
Figure 10:
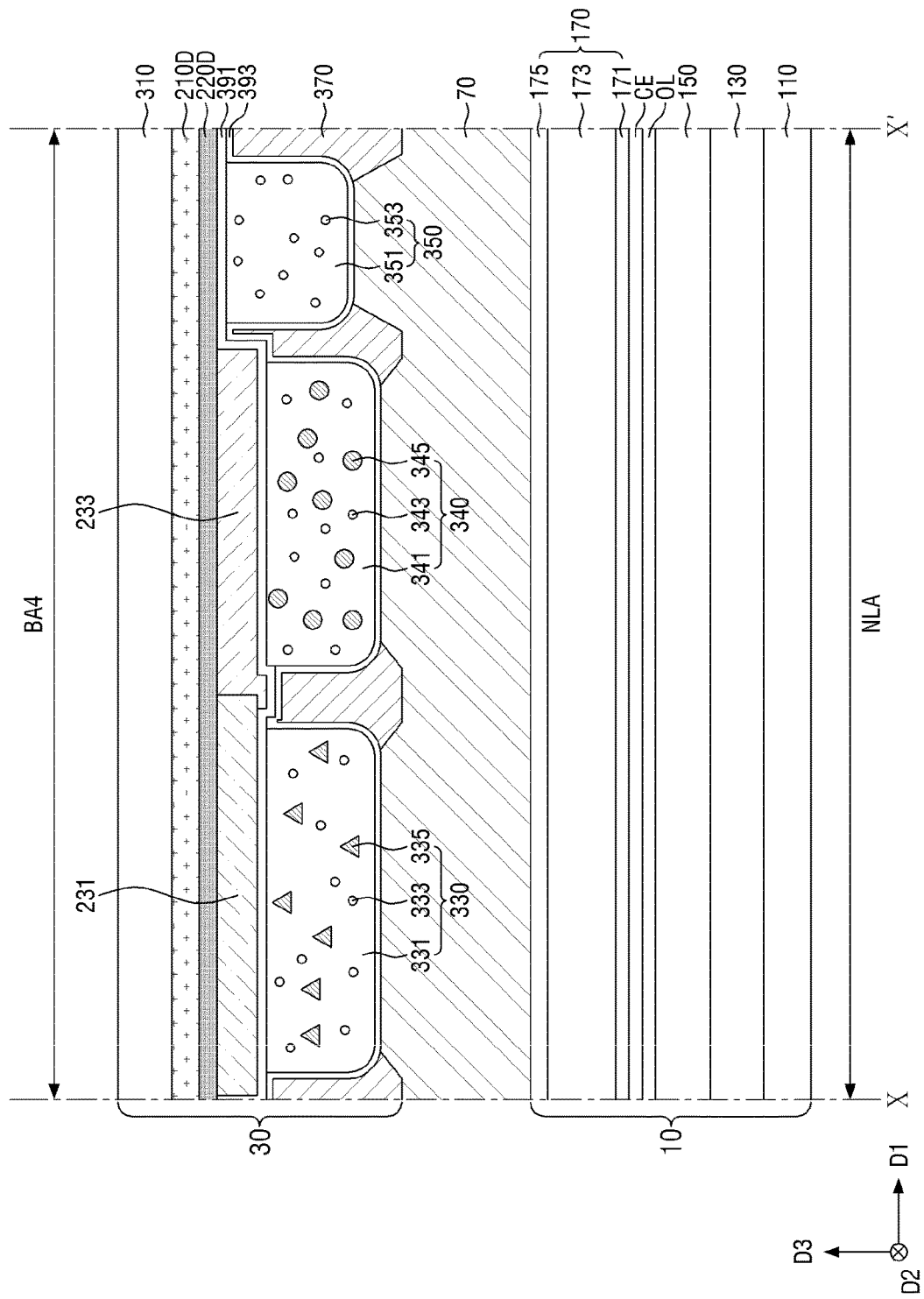
FIG. 10 is a cross-sectional view of the display device according to the exemplary embodiment of the present disclosure, taken along line X-X' of FIG. 5.

FIG. 6 is a cross-sectional view of the display device according to the exemplary embodiment of the present disclosure, taken along line VI-VI' of FIG. 5. FIG. 7 is a cross-sectional view of the display device according to the exemplary embodiment of the present disclosure, taken along line VII-VII' of FIG. 5. FIG. 8 is a cross-sectional view of the display device according to the exemplary embodiment of the present disclosure, taken along line VIII-VIII' of FIG. 5. FIG. 9 is a cross-sectional view of the display device according to the exemplary embodiment of the present disclosure, taken along line IX-IX' of FIG. 5. FIG. 10 is a cross-sectional view of the display device according to the exemplary embodiment of the present disclosure, taken along line X-X' of FIG. 5.

Referring to FIGS. 6-10, the display device 1 may include the display substrate 10 and the color conversion substrate 30 as described above, and may further include the filler 70 disposed between the display substrate 10 and the color conversion substrate 30.

Hereinafter, the display substrate 10 will be described in more detail.

A first base 110 may be made of a light-transmitting material. In some exemplary embodiments, the first base 110 may be a glass substrate or a plastic substrate. When the first base 110 is a plastic substrate, the first base 110 may have flexibility. In some exemplary embodiments, the first base 110 may further include a separate layer disposed on the glass substrate or the plastic substrate, e.g., a buffer layer or an insulating layer.

On the first base 110, switching elements T1, T2 and T3 may be disposed. In some exemplary embodiments, the first switching element T1 may be located in the first light-emitting area LA1, the second switching element T2 may be located in the second light-emitting area LA2, and the third switching element T3 may be located in the third light-emitting area LA3. It is, however, to be understood that the present disclosure is not limited thereto. In other exemplary embodiments, at least one selected from the first switching element T1, the second switching element T2, and the third switching element T3 may be located in the non-emitting area NLA.

In some embodiments, a plurality of signal lines (for example, gate lines, data lines, power lines, etc.) for transmitting signals to the switching elements may be further disposed on the first base 110.

An insulating layer 130 may be disposed over the first switching element T1, the second switching element T2 and the third switching element T3. In some exemplary embodiments, the insulating layer 130 may be a planarization layer. In some exemplary embodiments, the insulating layer 130 may be formed of an organic layer. For example, the insulating layer 130 may include an acrylic resin, an epoxy resin, an imide resin, an ester resin, etc. In some exemplary embodiments, the insulating layer 130 may include a positive photosensitive material or a negative photosensitive material.

A first anode electrode AE1, a second anode electrode AE2 and a third anode electrode AE3 may be disposed on the insulating layer 130. The first anode electrode AE1 may be located within the first light-emitting area LA1 and at least a portion thereof may be extended to the non-emitting area NLA. The second anode electrode AE2 may be located within the second light-emitting area LA2 and at least a portion thereof may be extended to the non-emitting area NLA. The third anode electrode AE3 may be located within the third light-emitting area LA3 and at least a portion thereof may be extended to the non-emitting area NLA. The first anode electrode AE1 may be coupled to the first switching element T1 through the insulating layer 130, the second anode electrode AE2 may be coupled to the second switching element T2 through the insulating layer 130, and the third anode electrode AE3 may be coupled to the third switching element T3 through the insulating layer 130.

In some exemplary embodiments, the widths or areas of the first anode electrode AE1, the second anode electrode AE2 and the third anode electrode AE3 may be different from one another. For example, the width or area of the second anode electrode AE2 may be smaller than the width or area of the first anode electrode AE1, and the width or area of the third anode electrode AE3 may be smaller than the width or area of the second anode electrode AE2. It is, however, to be understood that the present disclosure is not limited thereto. The first anode electrode AE1, the second anode electrode AE2 and the third anode electrode AE3 may have the same (e.g., substantially the same) width or area.

The first anode electrode AE1, the second anode electrode AE2 and the third anode electrode AE3 may be reflective electrodes. In such case, the first anode electrode AE1, the second anode electrode AE2 and the third anode electrode AE3 may be metal layers containing a metal such as Ag, Mg, Al, Pt, Pd, Au, Ni, Nd, Ir and Cr. In another exemplary embodiment, the first anode electrode AE1, the second anode electrode AE2 and the third anode electrode AE3 may further include a metal oxide layer stacked on the metal layer. In an exemplary embodiment, the first anode electrode AE1, the second anode electrode AE2 and the third anode electrode AE3 may be a two-layer structure of ITO/Ag, Ag/ITO, ITO/Mg and ITO/MgF, or a multi-layer structure of ITO/Ag/ITO.

A pixel-defining layer 150 may be located on the first anode electrode AE1, the second anode electrode AE2, and the third anode electrode AE3. The pixel-defining layer 150 may include an opening for exposing the first anode electrode AE1, an opening for exposing the second anode electrode AE2, and an opening for exposing the third anode electrode AE3 and may define the light-emitting area LA1, the second light-emitting area LA2, the third light-emitting area LA3, and the non-light-emitting area NLA. For example, an exposed part of the first anode electrode AE1 which is not covered by the pixel-defining layer 150 may be the first light-emitting area LA1. Similarly, an exposed part of the second anode electrode AE2 which is not covered by the pixel-defining layer 150 may be the second light-emitting area LA2. An exposed part of the third anode electrode AE3 which is not covered by the pixel-defining layer 150 may be the third light-emitting area LA3. The area where the pixel-defining layer 150 is located may be the non-emitting area NLA.

In some exemplary embodiments, the pixel-defining layer 150 may include an organic insulating material such as polyacrylate resin, epoxy resin, phenolic resin, polyamide resin, polyimide resin, unsaturated polyesters resin, poly phenylene ether resin, poly phenylene sulfide resin, and benzocyclobutene (BCB).

An organic emissive layer OL may be disposed on the first anode electrode AE1, the second anode electrode AE2, and the third anode electrode AE3. In some exemplary embodiments, the organic emissive layer OL may emit light L1 of a first color, for example, blue light. For example, the organic emissive layer OL may include a blue emissive layer. In some exemplary embodiments, the organic emissive layer OL may include two or more blue emissive layers and may further include a charge generation layer located between the two blue emissive layers. In some exemplary embodiments, the organic emissive layer OL may have the shape of a continuous film disposed over the plurality of light-emitting areas LA1, LA2, LA3, LA4, LA5 and LA6 and the non-emitting area NLA.

A cathode electrode CE may be disposed on a first organic layer OL1, a second organic layer OL2, and a third organic layer OL3. In some exemplary embodiments, the cathode electrode CE may be transflective or transmissive. If the cathode electrode CE is transflective, it may include Ag, Mg, Cu, Al, Pt, Pd, Au, Ni, Nd, Ir, Cr, Li, Ca, LiF/Ca, LiF/Al, Mo, Time or a compound or a mixture thereof, e.g., a mixture of Ag and Mg. Further, if the thickness of the cathode electrode CE ranges from several tens to several hundred angstroms, the cathode electrode CE may be transflective.

When the cathode electrode CE is transmissive, the cathode electrode CE may include a transparent conductive oxide (TCO). For example, the cathode electrode CE may be formed of tungsten oxide (WxOx), titanium oxide ($TiO_2$), indium tin oxide (ITO), indium zinc oxide (IZO), zinc oxide (ZnO), indium tin zinc oxide MgO (magnesium oxide), etc.

The first anode electrode AE1, the organic emissive layer OL and the cathode electrode CE may form a first organic light-emitting diode ED1, the second anode electrode AE2, the organic emissive layer OL and the third anode electrode AE3 may form a second organic light-emitting diode ED2, and the third anode electrode AE3, the organic emissive layer OL and the cathode electrode CE may form a third organic light-emitting diode ED3. The first organic light-emitting diode ED1, the second organic light-emitting diode ED2 and the third organic light-emitting diode ED3 may provide the light of the first color L1, e.g., blue light to the color conversion substrate 30.

A thin-film encapsulation layer 170 is disposed on the cathode electrode CE. The thin-film encapsulation layer 170 is commonly arranged across the first light-emitting area LA1, the second light-emitting area LA2, the third light-emitting area LA3, and the non-emitting area NLA. In some exemplary embodiments, the thin-film encapsulation layer 170 directly covers the cathode electrode CE. In some exemplary embodiments, a capping layer covering the cathode electrode CE may be further disposed between the thin-film encapsulation layer 170 and the cathode electrode CE, in which case the thin-film encapsulation layer 170 may directly cover the capping layer.

In some exemplary embodiments, the thin-film encapsulation layer 170 may include a first encapsulation inorganic layer 171, an encapsulation organic layer 173 and a second encapsulation inorganic layer 175 sequentially stacked on the cathode electrode CE.

In some exemplary embodiments, each of the first encapsulation inorganic layer 171 and the second encapsulation inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, and the like.

In some embodiments of the present disclosure, the encapsulation organic layer 173 may be made of acrylic resin, methacrylic resin, polyisoprene, vinyl resin, epoxy resin, urethane resin, cellulose resin and perylene resin.

It is to be noted that the structure of the thin-film encapsulation layer 170 is not limited to the above example. The stack structure of the thin-film encapsulation layer 170 may be altered in a variety of ways.

Hereinafter, the color conversion substrate 30 will be described with reference to FIGS. 11-15 in conjunction with FIGS. 6-10.

Figure 11:
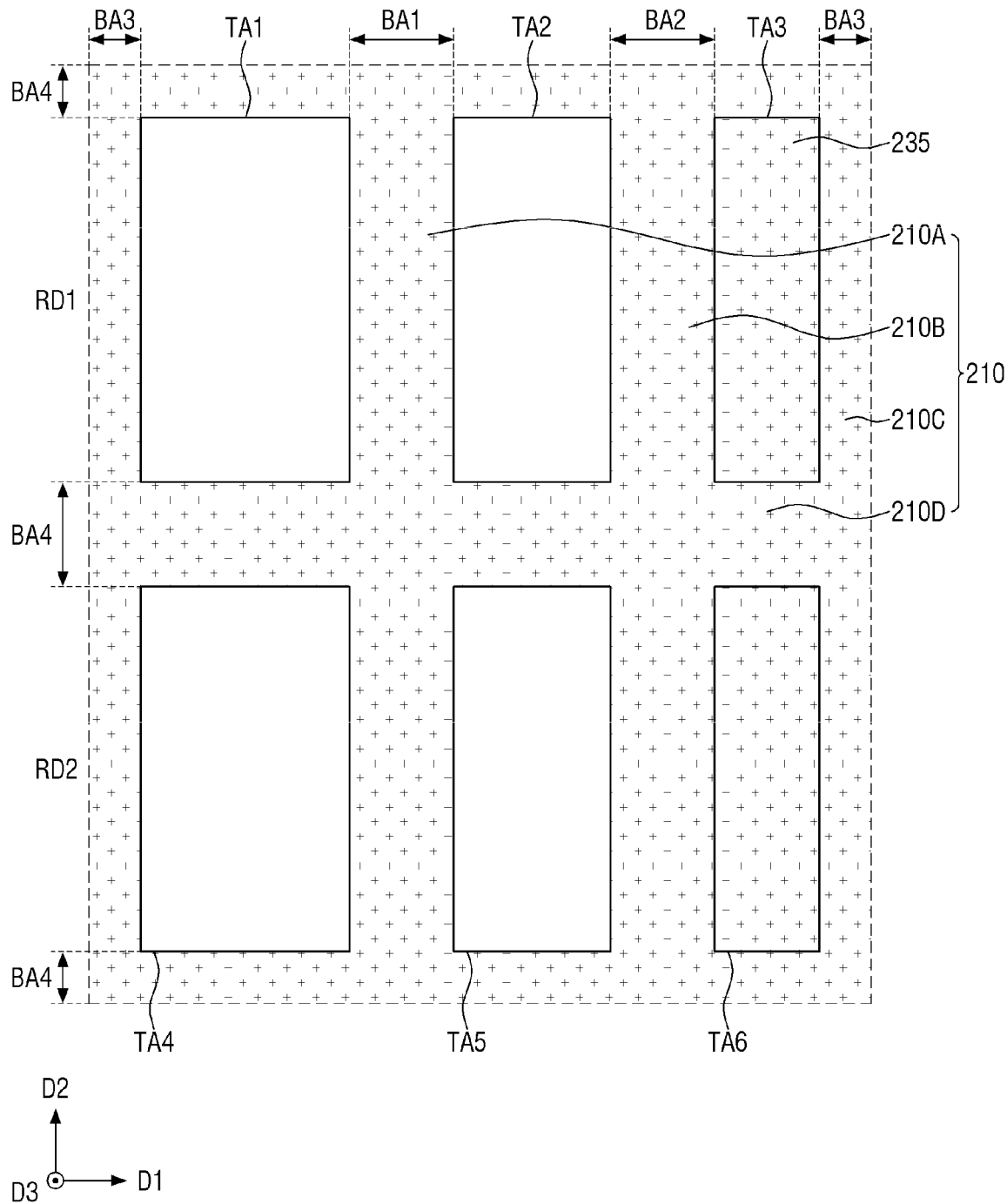
FIG. 11 is a plan view showing a layout of color filters and color patterns on a color conversion substrate of a display device according to an exemplary embodiment of the present disclosure.
Figure 12:
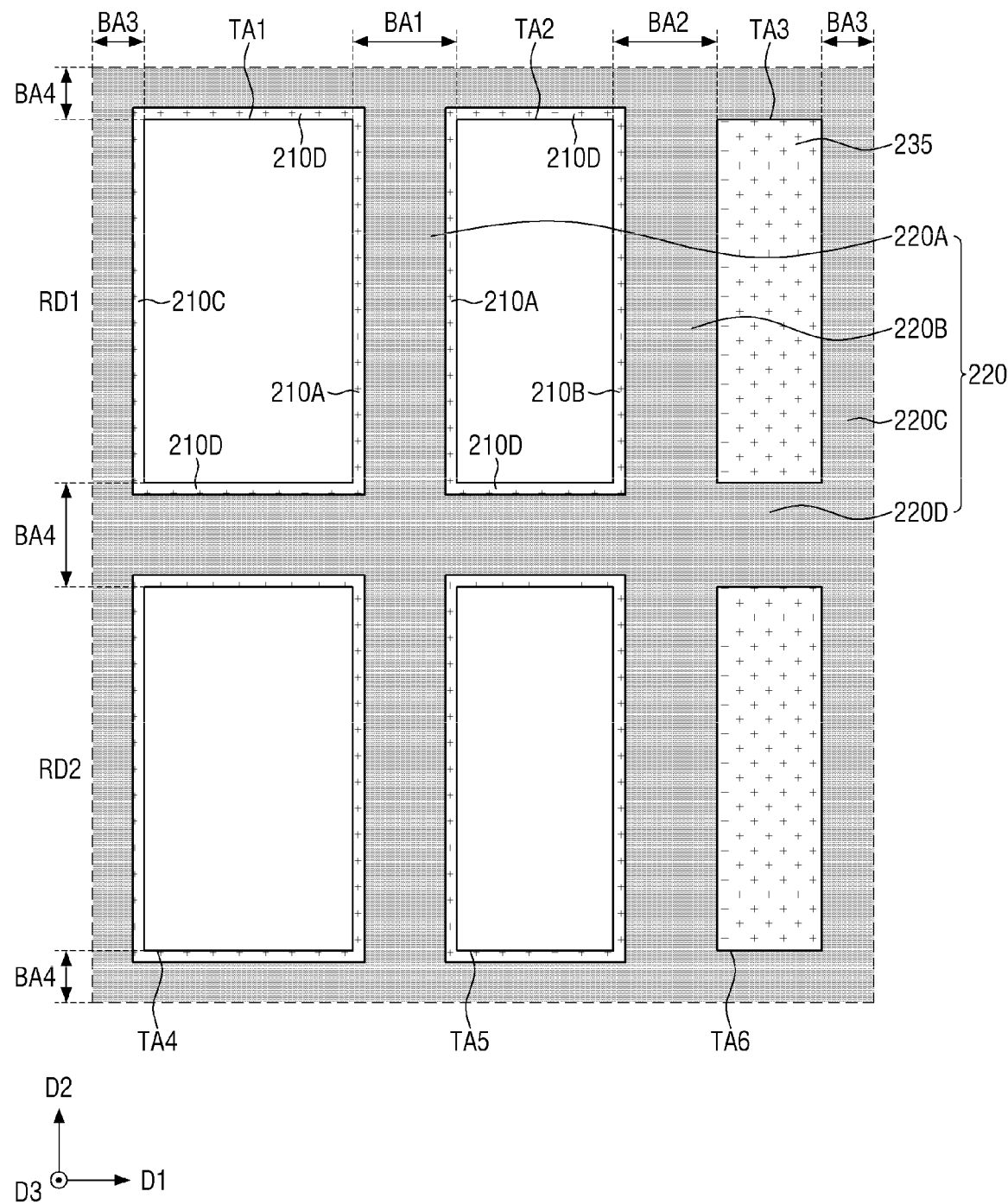
FIG. 12 is a plan view showing a layout of light-blocking members on a color conversion substrate of a display device according to an exemplary embodiment of the present disclosure.
Figure 13:
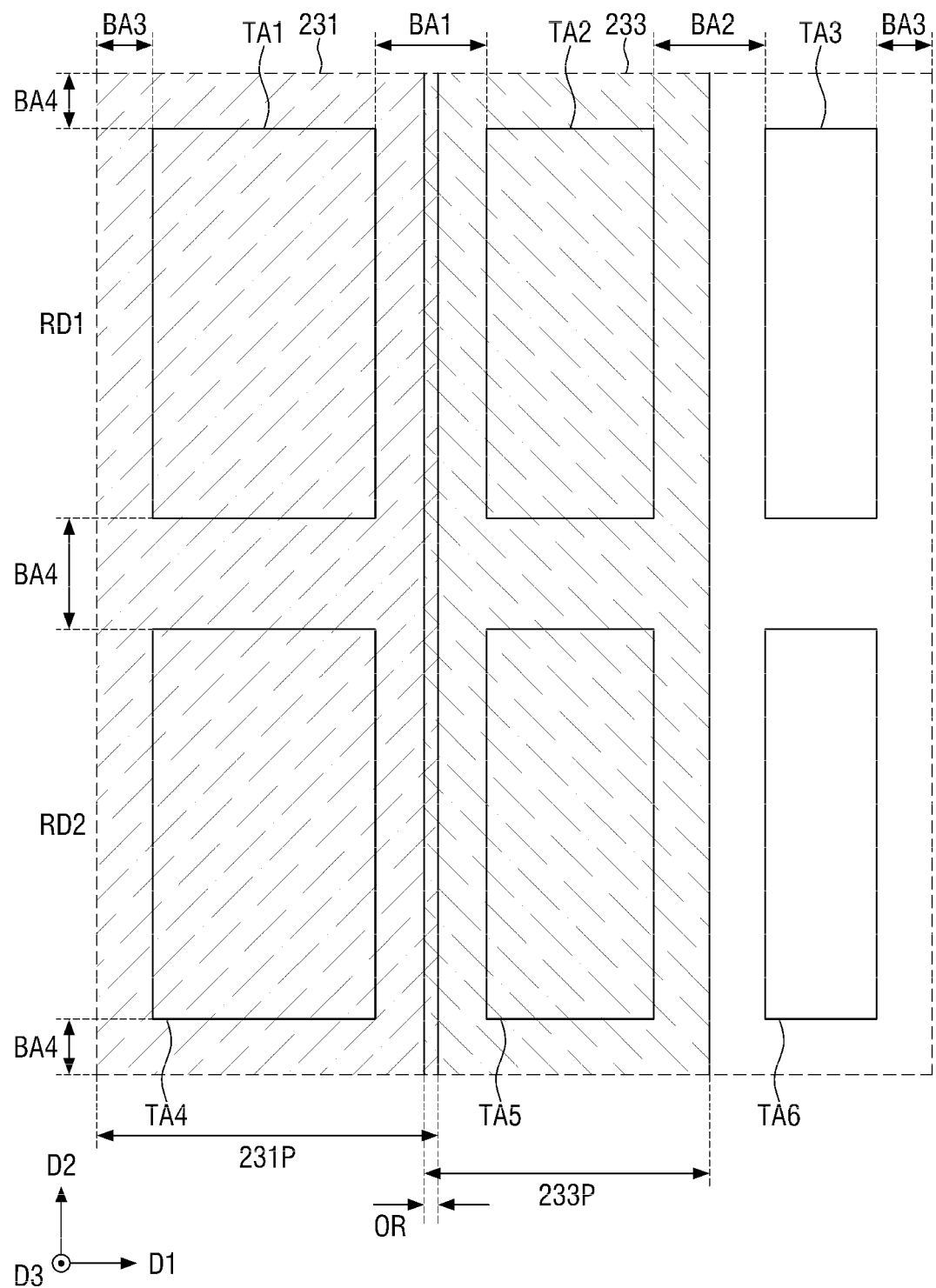
FIG. 13 is a plan view showing a layout of a first color filter and a second color filter on a color conversion substrate of a display device according to an exemplary embodiment of the present disclosure.
Figure 14:
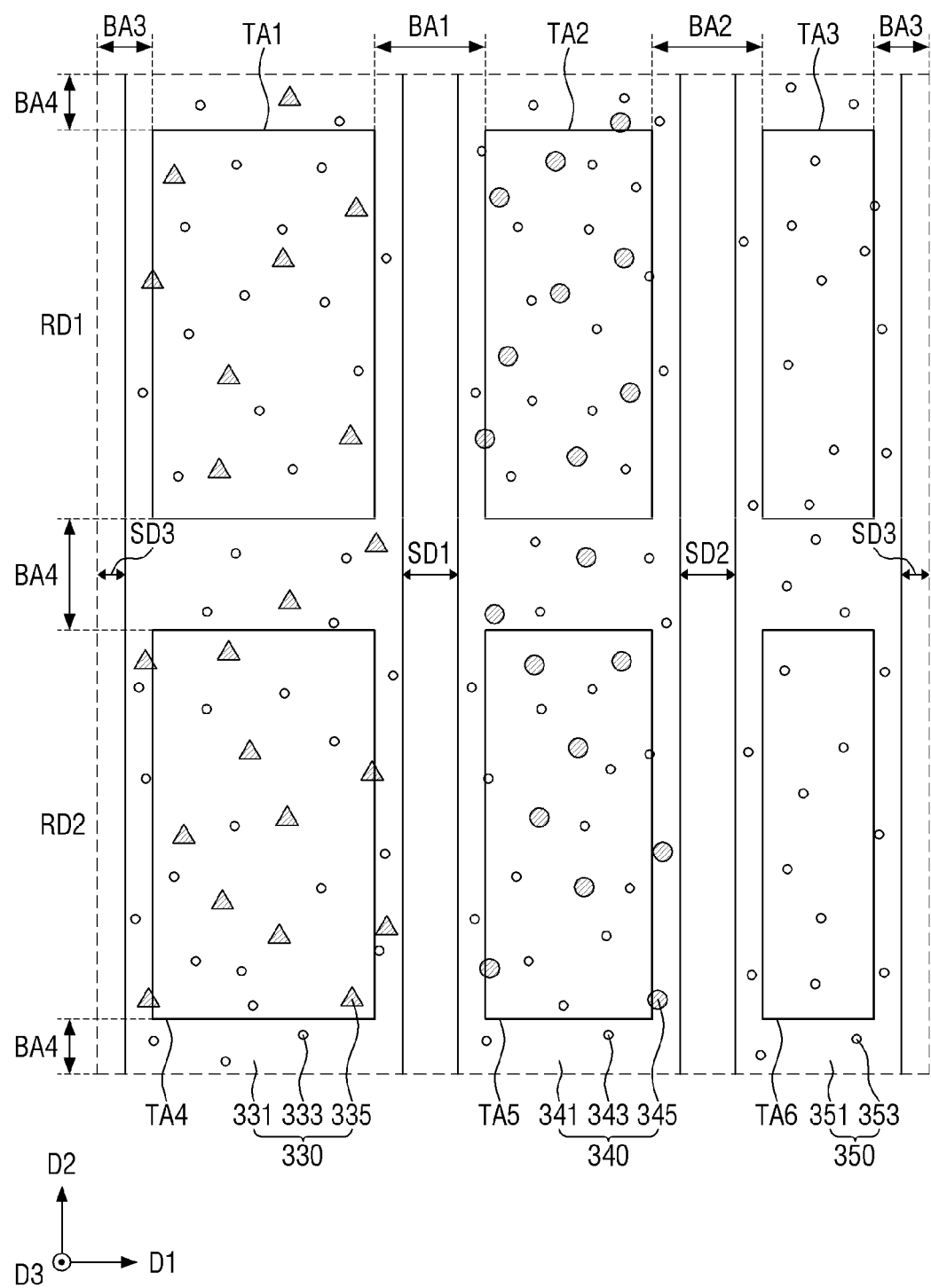
FIG. 14 is a plan view showing a layout of a first wavelength conversion pattern, a second wavelength conversion pattern and a light transmission pattern in a color conversion substrate of a display device according to an exemplary embodiment of the present disclosure.
Figure 15:
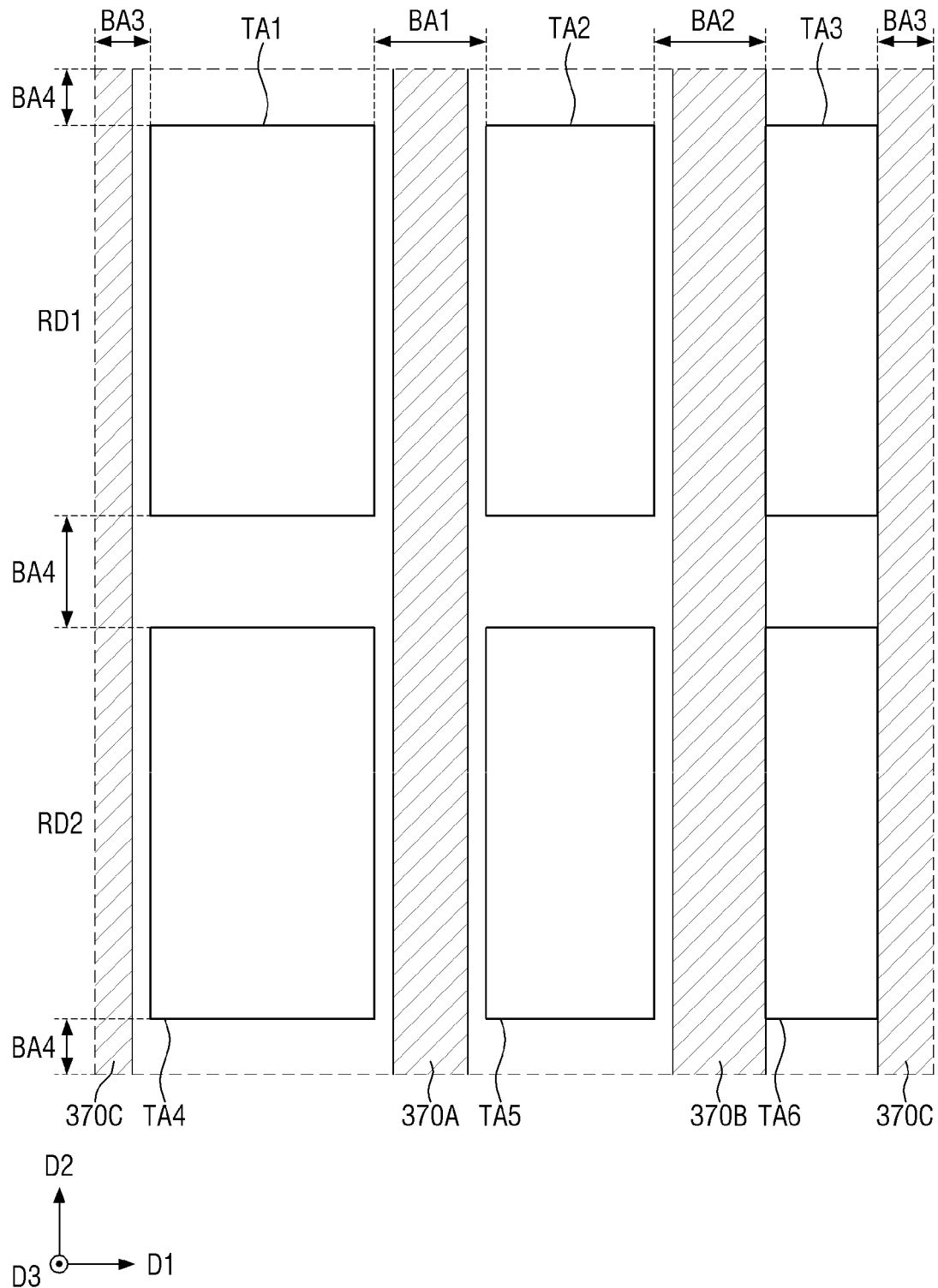
FIG. 15 is a plan view showing a layout of an anti-color-mixing member on the color conversion substrate of a display device according to an exemplary embodiment of the present disclosure.

FIG. 11 is a plan view showing a layout of color filters and color patterns on a color conversion substrate of a display device according to an exemplary embodiment of the present disclosure. FIG. 12 is a plan view showing a layout of light-blocking members on a color conversion substrate of a display device according to an exemplary embodiment of the present disclosure. FIG. 13 is a plan view showing a layout of a first color filter and a second color filter on a color conversion substrate of a display device according to an exemplary embodiment of the present disclosure. FIG. 14 is a plan view showing a layout of a first wavelength conversion pattern, a second wavelength conversion pattern and a light transmission pattern in a color conversion substrate of a display device according to an exemplary embodiment of the present disclosure. FIG. 15 is a plan view showing a layout of an anti-color-mixing member on the color conversion substrate of a display device according to an exemplary embodiment of the present disclosure.

Referring to FIG. 11 in conjunction with FIGS. 6-10, a second base 310 may be made of a light-transmitting material. In some exemplary embodiments, the second base 310 may be a glass substrate or a plastic substrate. In some exemplary embodiments, the second base 310 may further include a separate layer disposed on the glass substrate or the plastic substrate, e.g., an insulating layer such as an inorganic film.

A third color filter 235 and color patterns 210 may be disposed on the surface of the second base 310 that faces the display substrate 10.

The third color filter 235 may be disposed on the surface of the second base 310 and may be located in the third light-transmitting area TA3 and the sixth light-transmitting area TA6. In some exemplary embodiments, the third color filter 235 located in the third light-transmitting area TA3 and the third color filter 235 located in the sixth light-transmitting area TA6 may be spaced apart from each other in the second direction D2.

The third color filter 235 may selectively transmit the light of the first color (e.g., blue light) while blocking or absorbing the light of the second color (e.g., red light) and the light of the third color (e.g., green light). In some exemplary embodiments, the third color filter 235 may be a blue color filter and may include a blue colorant such as a blue dye or a blue pigment.

The color pattern 210 can absorb a part of an external light introduced into the color conversion substrate 30 from the outside of the display device 1, thereby reducing the reflected light due to the light. A substantial amount of external light is reflected to cause a problem that the color gamut of the color conversion substrate 30 is distorted. In this regard, according to the exemplary embodiment of the present disclosure, by disposing the color pattern 210 on the second base 310, it is possible to suppress or reduce color distortion caused by external light.

In some exemplary embodiments, the color pattern 210 may include a blue colorant, such as a blue dye or a blue pigment. In some exemplary embodiments, the color pattern 210 may be made of the same (e.g., substantially the same) material as the third color filter 235 and may be formed together with it via the process of forming the third color filter 235. When the color pattern 210 includes a blue colorant, the external light or the reflected light transmitted through the color pattern 210 has a blue wavelength band. The eye color sensibility that a user's eyes perceive varies depending on the color of the light. For example, the light in the blue wavelength band may be perceived less sensitively to a user than the light in the green wavelength band and the light in the red wavelength band. Thus, as the color pattern 210 includes a blue colorant, the user can perceive the reflected light relatively less sensitively.

The color pattern 210 may be located on the surface of the second base 310 and may be located in the light-blocking area BA, and may be in direct contact with the surface of the second base 310. For example, the color pattern 210 may include a first color pattern 210A located in the first light-blocking area BA1, a second color pattern 210B located in the second light-blocking area BA2, a third color pattern 210C located in the third light-blocking area BA3, and a fourth color pattern 210D located in the fourth light-blocking area BA4. In addition, each of the first to third color patterns 210A, 210B and 210C may be coupled to the fourth color pattern 210D to surround the first to sixth light-transmitting areas TA1, TA2, TA3, TA4, TA5 and TA6 in the form of lattice. It is, however, to be understood that the present disclosure is not limited thereto. In some exemplary embodiments, the first to fourth color patterns 210A, 210B, 210C and 210D may be spaced apart from one another to surround the first to sixth light-transmitting areas TA1, TA2, TA3, TA4, TA5 and TA6 in the form of lattice. In another exemplary embodiment, only some of the first to fourth color patterns 210A, 210B, 210C and 210D may be disposed.

Referring to FIG. 12 in conjunction with FIGS. 6-10, a light-blocking member 220 may be disposed on the surface of the second base 310 that faces the display substrate 10. The light-blocking member 220 may be located in the light-blocking area BA to block the transmission of light. In some exemplary embodiments, the light-blocking member 220 may be disposed in a substantially lattice form when viewed from the top as shown in FIG. 12.

In some exemplary embodiments, the light-blocking member 220 may include an organic light-blocking material and may be formed via processes of coating and exposing an organic light-blocking material.

As mentioned earlier, external light causes a problem that the color gamut of the color conversion panel is distorted. In this regard, according to the exemplary embodiment of the present disclosure, by disposing the light-blocking member 220 on the second base 310, it is possible to suppress or reduce color distortion caused by external light by absorbing at least a part of the external light. In some exemplary embodiments, the light-blocking member 220 can prevent or reduce the color mixing when light leaks between adjacent light-transmitting areas, thereby further improving the color gamut.

In some exemplary embodiments, the light-blocking member 220 may include a first light-blocking member 220A located in the first light-blocking area BA1, a second light-blocking member 220B located in the second light-blocking area BA2, a third light-blocking member 220C located in the third light-blocking area BA3, and a fourth light-blocking member 220D located in the fourth light-blocking area BA4. In some exemplary embodiments, the first light-blocking member 220A, the second light-blocking member 220B and the third light-blocking member 220C may be coupled to the fourth light-blocking member 220D.

The light-blocking member 220 may overlap the color pattern 210 and may be located on the color pattern 210. In some exemplary embodiments, the width of the light-blocking member may be made narrower than the width of the color pattern. For example, the width of the first light-blocking member 220A may be smaller than the width of the first color pattern 210A, the width of the second light-blocking member 220B may be smaller than the width of the second color pattern 210B, the width of the third light-blocking member 220C may be smaller than the width of the third color pattern 210C, and the width of the fourth light-blocking member 220D may be smaller than the width of the fourth color pattern 210D. The ends of the second light-blocking member 220B, the third light-blocking member 220C and the fourth light-blocking member 220D surrounding the third light-transmitting area TA3 and the sixth light-transmitting area TA6 may be aligned with the end of the second color pattern 210B, the third color pattern 210C and the fourth color pattern 210D surrounding the third light-transmitting area TA3 and the sixth light-transmitting area TA6 in the third direction D3 when viewed from the top.

Referring to FIG. 13 in conjunction with FIGS. 6-10, a first color filter 231 and a second color filter 233 may be disposed on the surface of the second base 310 that faces the display substrate 10.

The first color filter 231 may be located in the first light-transmitting area TA1 and the fourth light-transmitting area TA4. The second color filter 233 may be located in the second light-transmitting area TA2 and the fifth light-transmitting area TA5.

In some exemplary embodiments, one side of the first color filter 231 may be located within the first light-blocking area BA1 and may be located on the first color pattern 210A and the first light-blocking member 220A, to be in contact with them. In addition, the other side of the first color filter 231 may be located within the third light-blocking area BA3 and may be located on the third color pattern 210C and the third light-blocking member 220C, to be in contact with them.

In some exemplary embodiments, one side of the second color filter 233 may be located within the second light-blocking area BA2 and may be located on the second color pattern 210B and the second light-blocking member 220B, to be in contact with them. In addition, the other side of the second color filter 233 may be located within the first light-blocking area BA1 and may be located on the first color pattern 210A and the first light-blocking member 220A, to be in contact with them. As such, in the first light-blocking area BA1, there may be formed an overlap region OR in which one side of the first color filter 231 overlaps with the other side of the second color filter 233. It is, however, to be understood that the present disclosure is not limited thereto. One side of the first color filter 231 and the other side of the second color filter 233 may not overlap with each other but may be spaced apart from each other by a certain distance. In addition, in some exemplary embodiments, a width 231P of the first color filter 231 may be greater than a width 233P of the second color filter 233.

In some exemplary embodiments, each of the first color filter 231 and the second color filter 233 may be in the shape of stripes extending along the second direction D2, and may traverse the fourth light-blocking area BA4 between the first row RD1 and the second row RD2. Accordingly, as shown in FIGS. 7 and 8, the first color filter 231 and the second color filter may be located on the fourth light-blocking member 220D 233 in the fourth light-blocking area BA4. Accordingly, the first color filter 231 and the second color filter 233 may cover the second color pattern 210B and the fourth light-blocking member 220D in the fourth light-blocking area BA4.

In some exemplary embodiments, the first color filter 231 may block or absorb light of the first color (e.g., blue light). For example, the first color filter 231 may work as a blue light-blocking filter for blocking blue light. The third color filter 235 may selectively transmit the light of the first color (e.g., blue light) while blocking or absorbing the light of the second color (e.g., red light) and the light of the third color (e.g., green light). In some exemplary embodiments, the first color filter 231 may selectively transmit the light of the second color (e.g., red light) while blocking or absorbing the light of the first color (e.g., blue light) and the light of the third color (e.g., green light). For example, the first color filter 231 may be a red color filter and may include a red colorant.

The second color filter 233 may block or absorb the light of the first color (e.g., blue light). For example, the second color filter 233 may also work as a blue light blocking filter. In some exemplary embodiments, the second color filter 233 may selectively transmit the light of the third color (e.g., green light) while blocking or absorbing the light of the first color (e.g., blue light) and the light of the second color (e.g., green light). For example, the second color filter 233 may be a green color filter and may include a green colorant.

In some exemplary embodiments, the first color filter 231, the second color filter 233 and the third color filter 235 may have different thicknesses. For example, the first color filter 231 and the second color filter 233 may have the same (e.g., substantially the same) thickness, whereas the third color filter 235 may have a thickness smaller than the thickness of the first color filter 231 and the second color filter 233. It is, however, to be understood that the present disclosure is not limited thereto. The thicknesses of the first color filter 231, the second color filter 233 and the third color filter 235 may all be the same (e.g., substantially the same).

As shown in FIGS. 6-10, a first capping layer 391 that covers the color pattern 210, the light-blocking member 220, the first color filter 231, the second color filter 233 and the third color filter 235 may be disposed on the surface of the second base 310. In some exemplary embodiments, the first capping layer 391 may be in direct contact with the first color filter 231, the second color filter 233, and the third color filter 235.

The first capping layer 391 may also be in contact with the light-blocking member 220. For example, as shown in FIG. 6, a part of the second light-blocking member 220B may be in contact with the first capping layer 391 in the second light-blocking area BA2. In addition, the third light-blocking member 220C may be in contact with the first capping layer 391 in the third light-blocking area BA3. In addition, as shown in FIG. 9, the fourth light-blocking member 220D may be in contact with the first capping layer 391 in the fourth light-blocking area BA4.

The first capping layer 391 can prevent or reduce damage to, or contamination (e.g., by impurities such as moisture and air introduced from the outside) of, the light-blocking member 220, the color patterns 210, the first color filter 231, the second color filter 233 and the third color filter 235. In addition, the first capping layer 391 can prevent or reduce diffusion of the colorants included in the first color filter 231, the second color filter 233 and the third color filter 235 to other elements (e.g., a first wavelength conversion pattern 330, a second wavelength conversion pattern 340, etc.). In some exemplary embodiments, the first capping layer 391 may be made of an inorganic material. For example, the first capping layer 391 may be made of a material including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

Referring to FIG. 14 in conjunction with FIGS. 6-10, the first wavelength conversion pattern 330, the second wavelength conversion pattern 340 and a light transmission pattern 350 may be disposed on the first capping layer 391.

The first wavelength conversion pattern 330 may be located on the first capping layer 391 and may be located in the first light-transmitting area TA1 and the fourth light-transmitting area TA4. In some exemplary embodiments, as shown in FIG. 14, the first wavelength conversion pattern 330 may be in the shape of stripes extending along the second direction D2, and may traverse the fourth light-blocking area BA4 between the first row RD1 and the second row RD2. In addition, the first wavelength conversion pattern 330 may have a first spacing distance SD1 with the second wavelength conversion pattern 340. The first wavelength conversion pattern 330 may have a third spacing distance SD3 with the light transmission pattern 350. The first capping layer 390 may be exposed due to the first spacing distance SD1 and the third spacing distance SD3. The width of the first spacing distance SD1 may be smaller than the width of the first light-blocking area BA1, and the width of the third spacing distance SD3 may be smaller than the width of the third light-blocking area BA3. It is, however, to be understood that this is merely illustrative.

The first wavelength conversion pattern 330 may convert or shift the peak wavelength of the incident light into light of another peak wavelength and emit the light.

In some exemplary embodiments, the first wavelength conversion pattern 330 may convert light of the first color L1, which is blue light emitted from the first organic light-emitting diode ED1, into red light in the range of approximately 610 to 650 nm.

In some exemplary embodiments, the first wavelength conversion pattern 330 may include a first base resin 331 and first wavelength shifters 335 dispersed in the first base resin 331, and may further include first scatterers 333 dispersed in the first base resin 331.

The first base resin 331 may be made of a material having a high light transmittance. In some exemplary embodiments, the first base resin 331 may be made of an organic material. For example, the first base resin 331 may include an organic material such as an epoxy resin, an acrylic resin, a cardo resin, or an imide resin.

The first wavelength shifters 335 may convert or shift the peak wavelength of the incident light to another peak wavelength. In some exemplary embodiments, the first wavelength shifters 335 may convert the light of the first color L1, which is blue light emitted from the first organic light-emitting diode ED1, into red light having a single peak wavelength in the range of approximately 610 to 650 nm. Examples of the first wavelength shifters 335 may include quantum dots, quantum rods or phosphors. For example, a quantum dot may be a particulate matter (e.g., a particle or nanoparticle) that emits a color of light as electrons transition from a conduction band to a valence band.

The quantum dot may be a semiconductor nanocrystalline material. The quantum dots have a set or specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

The light emitted by the first wavelength shifters 335 may have the wavelength spectrum with a half band width of approximately 45 nm or less, or approximately 40 nm or less, or approximately 30 nm or less, so that the color purity and the color gamut of the color displayed by the display device 1 can be further improved. In addition, the light emitted by the first wavelength shifters 335 may travel toward various directions regardless of the direction in which the incident light is coming. As a result, the side visibility of the second color displayed in the first light-transmitting area TA1 can be improved.

A part of the light L1 of the first color emitted from the first organic light-emitting diode ED1 may be transmitted through the first wavelength conversion pattern 330 without being converted into red light by the first wavelength shifters 335. Components of the light L1 of the first color that is incident on the first color filter 231 without being converted by the first wavelength conversion pattern 330 can be blocked or reduced by the first color filter 231. On the other hand, red light that is produced by converting the light of the first color L1 with the first wavelength conversion pattern 330 is transmitted through the first color filter 231 to exit. Accordingly, the light exiting out of the display device 1 in the first light-transmitting area TA1 may be light of the second color L2, which is red light.

The first scatterers 333 may have a refractive index different from that of the first base resin 331 and may form an optical interface with the first base resin 331. For example, the first scatterers 333 may be light scattering particles. The material of the first scatterers 333 are not particularly limited herein as long as it can scatter at least a part of the transmitted light. For example, the material may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the organic particles may include an acrylic resin, a urethane resin, etc. The first scatterers 333 may scatter the light transmitted through the first wavelength conversion pattern 330 in random directions regardless of the direction in which the incident light is coming.

The second wavelength conversion pattern 340 may be located on the first capping layer 391 and may be located in the second light-transmitting area TA2 and the fifth light-transmitting area TA5. In some embodiments, the second wavelength conversion pattern 340 may be in a stripe shape extending in the second direction D2 as shown in FIG. 14, and may traverse the fourth light-blocking area BA4 between the first row RD1 and the second row RD2. In addition, the second wavelength conversion pattern 340 may have a first spacing distance SD1 with the first wavelength conversion pattern 330, and the second wavelength conversion pattern 340 may have a second spacing distance SD2 with the light transmission pattern 350. The first capping layer 390 may be exposed during the first spacing distance SD1 and the second spacing distance SD2. The width of the first spacing distance SD1 may be smaller than the width of the first light-blocking area BA1, and the width of the second spacing distance SD2 may be smaller than the width of the second light-blocking area BA3. It is, however, to be understood that the present disclosure is not limited thereto.

The second wavelength conversion pattern 340 may convert or shift the peak wavelength of the incident light into light of another peak wavelength and emit the light. In some exemplary embodiments, the second wavelength conversion pattern 340 may convert the light of the light of the first color L1, which is blue light emitted from the second organic light-emitting diode ED2, into green light in the range of approximately 510 to 550 nm.

In some exemplary embodiments, the second wavelength conversion pattern 340 may include a second base resin 341, and second wavelength shifters 345 dispersed in the second base resin 341, and may further include second scatterers 343 dispersed in the second base resin 341.

The second base resin 341 may be made of a material having a high light transmittance. In some embodiments, the second base resin 341 may be made of an organic material. In some exemplary embodiments, the second base resin 341 may be made of the same (e.g., substantially the same) material as the first base resin 331, or may include at least one of the materials listed above as the examples of the constituent materials of the first base resin 331.

The second wavelength shifters 345 may convert or shift the peak wavelength of the incident light into light of another peak wavelength. In some exemplary embodiments, the second wavelength shifters 345 may convert blue light having a peak wavelength in the range of 430 to 470 nm into green light having a peak wavelength in the range of 510 to 550 nm.

Examples of the second wavelength shifters 345 may include quantum dots, quantum rods, and a phosphor. The second wavelength shifters 345 are substantially identical to the first wavelength shifters 335; and therefore, redundant description thereof will not be repeated here.

In some exemplary embodiments, the first wavelength shifters 335 and the second wavelength shifters 345 may all be made up of quantum dots. In such case, the diameter of the quantum dots forming the first wavelength shifters 335 may be larger than the diameter of the quantum dots forming the second wavelength shifters 345.

The second scatterers 343 may have a refractive index different from that of the second base resin 341 and may form an optical interface with the second base resin 341. For example, the second scatterers 343 may be light scattering particles. The second scatterers 343 are substantially identical to the first scatterers 333 described above; and therefore, redundant description thereof will not be repeated here.

The light of the first color L1 emitted from the second organic light-emitting diode ED2 may be provided to the second wavelength conversion pattern 340. The second wavelength shifters 345 may convert the light of the first color L1 emitted from the second organic light-emitting diode ED2 into a green light having a peak wavelength in the range of approximately 510 to 550 nm to emit it.

A part of the light of the first color L1, which is blue light, may be transmitted through the second wavelength conversion pattern 340 to be emitted, without being converted into green light by the second wavelength shifters 345, which may be blocked by the second color filter 223. On the other hand, green light that is produced by converting the light of the first color L1 with the second wavelength conversion pattern 340 is transmitted through the second color filter 233 to exit. Accordingly, the light exiting out of the display device 1 in the second light-transmitting area TA2 may be light of the third color L3, which is green light.

The light transmission pattern 350 may be located on the first capping layer 391 and may be located in the third light-transmitting area TA3 and the sixth light-transmitting area TA6. In some exemplary embodiments, as shown in FIG. 14, the light transmission pattern 350 may be in a stripe shape extending in the second direction D2, and may traverse the fourth light-blocking area BA4 between the first row RD1 and the second row RD2. In addition, as described above, the light transmission pattern 350 may have the third spacing distance SD3 with the first wavelength conversion pattern 330, and may have the second spacing distance SD2 with the second wavelength conversion pattern 340.

The light transmission pattern 350 can transmit incident light. The light of the first color L1, which is the blue light emitted from the third organic light-emitting diode ED3, is transmitted through the light transmission pattern 350 and the third color filter 235, to exit out of the display device 1. For example, the third exiting light existing in the third light-transmitting area TA3 may be the light of the first color L1, which is blue light emitted from the third organic light-emitting diode ED3.

In some exemplary embodiments, the light transmission pattern 350 may further include a third base resin 351 and third scatterers 353 dispersed in the third base resin 351.

The third base resin 351 may be made of a material having a high light transmittance. In some exemplary embodiments, the third base resin 351 may be made of an organic material. In some exemplary embodiments, the third base resin 351 may be made of the same (e.g., substantially the same) material as the first base resin 331, or may include at least one of the materials listed above as the examples of the constituent materials of the first base resin 331.

The third scatterers 353 may have a refractive index different from that of the third base resin 351 and may form an optical interface with the third base resin 351. The third scatterers 353 can scatter light in random directions regardless of the direction in which the incident light is coming, without substantially changing the wavelength of the light transmitted through the light transmission pattern 350. For example, the third scatterers 353 may be light scattering particles. The third scatterers 353 are substantially identical to the first scatterers 333 described above; and therefore, redundant description thereof will not be repeated here.

The light of the first color L1, which is the blue light emitted from the third organic light-emitting diode ED3, is transmitted through the light transmission pattern 350 and the third color filter 235, to exit out of the display device 1. For example, the third exiting light existing in the third light-transmitting area TA3 may be the light of the first color L1, which is blue light emitted from the third organic light-emitting diode ED3.

In some exemplary embodiments, the first wavelength conversion pattern 330, the second wavelength conversion pattern 340 and the light transmission pattern 350 may have the same (e.g., substantially the same) thickness. Due to the difference in thickness between the first color filter 231, the second color filter 233 and the third color filter 235, the first wavelength conversion pattern 330 and the second wavelength conversion pattern 340 may be further protruded than the light transmission pattern 350. It is, however, to be understood that the present disclosure is not limited thereto. In some exemplary embodiments, the thickness of the light transmission pattern 350 may be larger than that of the first wavelength conversion pattern 330 and that of the second wavelength conversion pattern 340, so that the first wavelength conversion pattern 330, the second wavelength conversion pattern 340 and the light transmission pattern 350 may be aligned in the same (e.g., substantially the same) plane.

Referring to FIGS. 6-10, a second capping layer 393 may be disposed on the first wavelength conversion pattern 330, the second wavelength conversion pattern 340, and the light transmission pattern 350. The second capping layer 393 may cover the first wavelength conversion pattern 330, the second wavelength conversion pattern 340, and the light transmission pattern 350. The second capping layer 393 may be in contact with the first capping layer 391 and can seal the first wavelength conversion pattern 330, the second wavelength conversion pattern 340 and the light transmission pattern 350. Thus, it is possible to prevent or reduce permeation of impurities such as moisture and air from the outside to damage or contaminate the first wavelength conversion pattern 330, the second wavelength conversion pattern 340, and light transmission pattern 350. In some exemplary embodiments, the second capping layer 393 may be made of an inorganic material. In some exemplary embodiments, the second capping layer 393 may be made of the same (e.g., substantially the same) material as the first capping layer 391 or may include at least one of those listed above as the materials of the first capping layer 391. When both the first capping layer 391 and the second capping layer 393 are made of an inorganic material, the in contact with where between the first capping layer 391 and the second capping layer 393 may form inorganic-inorganic bonding, such that it is possible to effectively prevent or reduce entrance of moisture, air, etc. from the outside.

Referring to FIG. 15 in conjunction with FIGS. 6-10, an anti-color-mixing member 370 may be disposed on the second capping layer 393. The anti-color-mixing member 370 may be located in the light-blocking area BA and can block the transmission of light. For example, the anti-color-mixing member 370 may be disposed between the light transmission pattern 350 and the first wavelength conversion pattern 330 and between the first wavelength conversion pattern 330 and the second wavelength conversion pattern 340 and may cover a part of the upper surface of each of the first wavelength conversion pattern 330, the second wavelength conversion pattern 340 and the light transmission pattern 350. By disposing the anti-color-mixing member 370, it is possible to further prevent or reduce color mixing between adjacent light-transmitting areas. In some exemplary embodiments, the anti-color-mixing member 370 may be formed in a stripe shape extending in the second direction D2.

In some exemplary embodiments, the anti-color-mixing member 370 may include an organic light-blocking material and may be formed via processes of coating and exposing the organic light-blocking material.

The filler 70 may be located in the space between the color conversion substrate 30 and the display substrate 10 as described above. In some exemplary embodiments, the filler 70 may be located between the second capping layer 393 and the thin-film encapsulation layer 170 and between the anti-color-mixing member 370 and the thin-film encapsulation layer 170, as shown in FIGS. 6-10.

Figure 16:
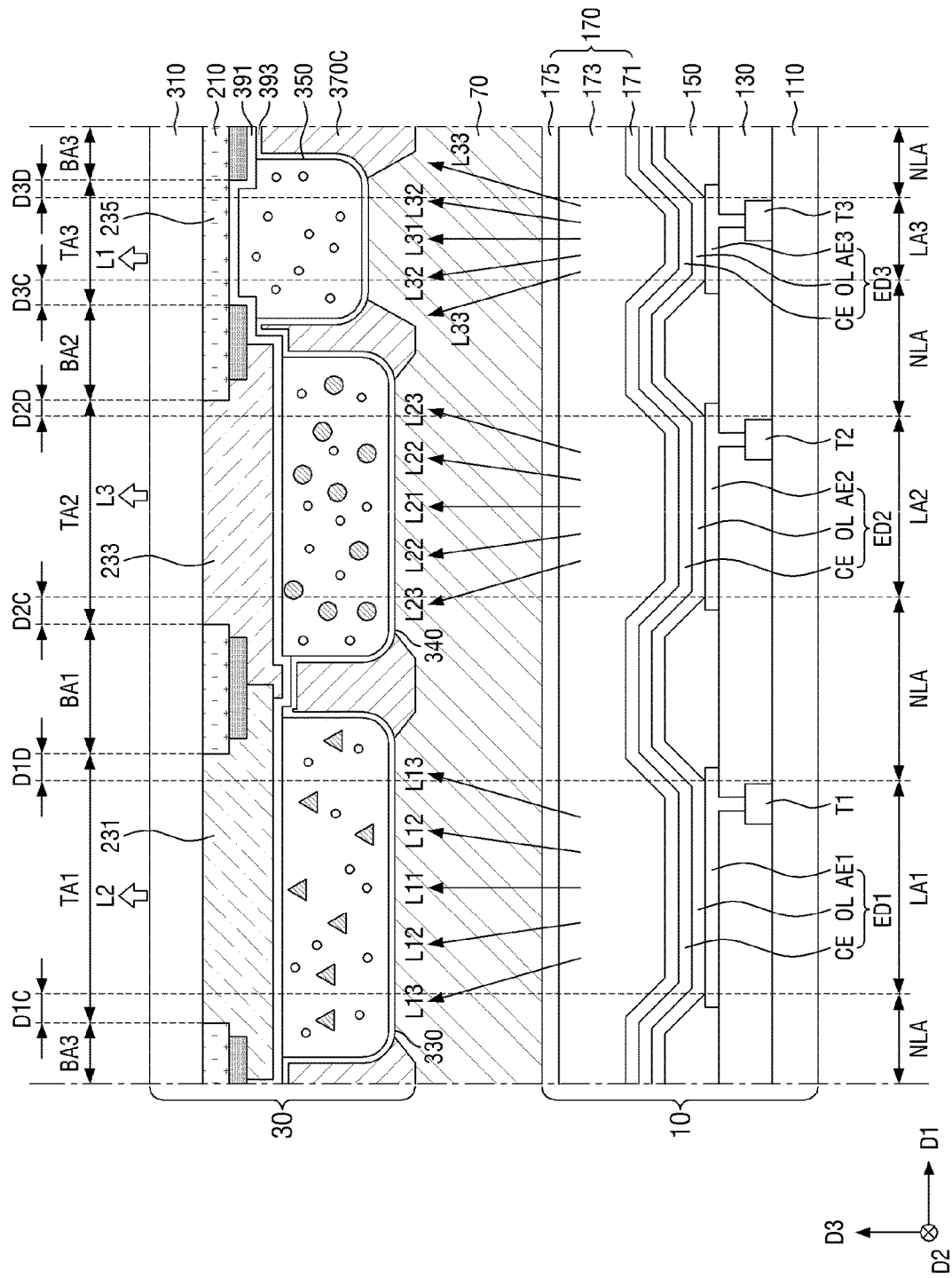
FIG. 16 is a view showing the traveling directions of lights output from the light-emitting areas of the display device according to the exemplary embodiment of the present disclosure.

FIG. 16 is a view showing the traveling directions of lights output from the light-emitting areas of the display device according to the exemplary embodiment of the present disclosure.

Referring to FIG. 16, from the first organic light-emitting diode ED1 disposed in the first light-emitting area LA1, a first emitted light L11 traveling in the first light-transmitting area TA1 in the vertical direction, a second emitted light L12 traveling in the first light-emitting area TA1 with an angle, and a third emitted light L13 traveling toward the adjacent second light-transmitting area TA2 and the third light-transmitting area TA3 as well as the first light-transmitting area TA1 with an angle may be emitted.

The first emitted light L11 passes through the first wavelength conversion pattern 330 and the first color filter 231 and is converted into light of the second color L2, i.e., red light to be output to the first light-transmitting area TA1.

The second emitted light L12 traveling with an angle can be incident on the first wavelength conversion pattern 330 as the first light-emitting area LA1 has the area smaller than the area of the first light-transmitting area TA1, such that it passes through the first wavelength conversion pattern 330 and the first color filter 231 and is converted into light of the second color L2, i.e., red light to be output to the first light-transmitting area TA1. As a result, the luminous efficiency for a given power consumption can be improved.

The third emitted light L13 traveling toward the adjacent second light-transmitting area TA2 and the third light-transmitting area TA3 have caused color mixing in existing display devices. In contrast, according to the exemplary embodiment of the present disclosure, because the area of the first light-emitting area LA1 is smaller than the area of the first light-transmitting area TA1, the light can be blocked by the anti-color-mixing member 370 and absorbed by it. As a result, color mixing between adjacent light-transmitting areas can be prevented or reduced, and thus, color gamut can be improved.

From the second organic light-emitting diode ED2 disposed in the second light-emitting area LA2, a first emitted light L21 traveling in the second light-transmitting area TA2 in the vertical direction, a second emitted light L12 traveling in the second light-emitting area TA2 with an angle, and a third emitted light L13 traveling toward the adjacent first light-transmitting area TA1 and the third light-transmitting area TA3 as well as the second light-transmitting area TA2 with an angle may be emitted.

The first emitted light L21 passes through the second wavelength conversion pattern 340 and the second color filter 233 and is converted into light of the third color L3, i.e., green light to be output to the second light-transmitting area TA2.

The second emitted light L22 traveling with an angle can be incident on the second wavelength conversion pattern 340 as the second light-emitting area LA2 has the area smaller than the area of the second light-transmitting area TA1, such that it passes through the second wavelength conversion pattern 340 and the second color filter 233 and is converted into light of the third color L3, i.e., green light to be output to the second light-transmitting area TA2. As a result, the luminous efficiency for a given power consumption can be improved.

The third emitted light L23 traveling toward the adjacent first light-transmitting area TA1 and the third light-transmitting area TA3 have caused color mixing in existing display devices. In contrast, according to the exemplary embodiment of the present disclosure, because the area of the second light-emitting area LA2 is smaller than the area of the second light-transmitting area TA2, the light can be blocked by the anti-color-mixing member 370 and absorbed by it. As a result, color mixing between adjacent light-transmitting areas can be prevented or reduced, and thus, color gamut can be improved.

From the third organic light-emitting diode ED3 disposed in the third light-emitting area LA3, a first emitted light L31 traveling in the third light-transmitting area TA3 in the vertical direction, a second emitted light L32 traveling in the third light-emitting area TA3 with an angle, and a third emitted light L33 traveling toward the adjacent first light-transmitting area TA1 and the second light-transmitting area TA2 as well as the third light-transmitting area TA3 with an angle may be emitted.

The first emitted light L31 passes through the light transmission pattern 350 and the third color filter 235, such that the light of the first color L1, i.e., blue light is output to the second light-transmitting area TA2.

The second emitted light L32 traveling with an angle can be incident on the light transmission pattern 350 as the third light-emitting area LA3 has the area smaller than the area of the third light-transmitting area TA3, such that it passes through the light transmission pattern 350 and the third color filter 235 and is converted into light of the first color L1, i.e., blue light to be output to the third light-transmitting area TA3. As a result, the luminous efficiency for a given power consumption can be improved.

The third emitted light L33 traveling toward the adjacent first light-transmitting area TA1 and the second light-transmitting area TA2 have caused color mixing in existing display devices. In contrast, according to the exemplary embodiment of the present disclosure, because the area of the third light-emitting area LA3 is smaller than the area of the third light-transmitting area TA3, the light can be blocked by the anti-color-mixing member 370 and absorbed by it. As a result, color mixing between adjacent light-transmitting areas can be prevented or reduced, and thus, color gamut can be improved.

Figure 17:
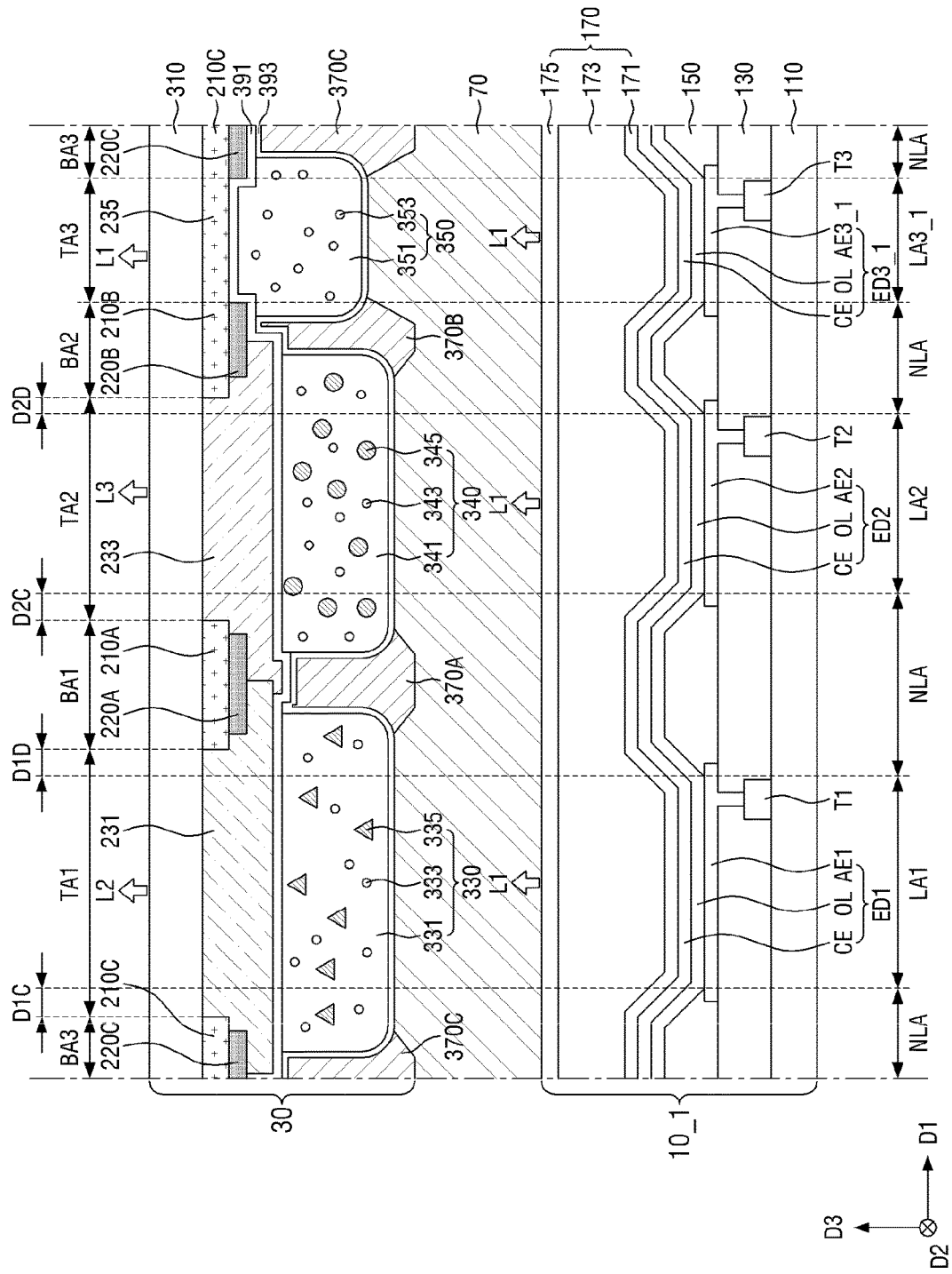
FIG. 17 is a cross-sectional view of a display device according to another exemplary embodiment of the present disclosure.

FIG. 17 is a cross-sectional view of a display device according to another exemplary embodiment of the present disclosure. The exemplary embodiment of FIG. 17 is different from the exemplary embodiment of FIG. 6 in that the area of a third light-emitting area LA3_1 is equal to the area of the third light-transmitting area TA3. The following descriptions will focus on differences of the present embodiments, and therefore, description already provided herein will not be repeated here.

Referring to FIG. 17, a display substrate 10_1 includes a first light-emitting area LA1, a second light-emitting area LA2 and a third light-emitting area LA3_1. The width or area of the second light-emitting area LA2 is smaller than the width or area of the first light-emitting area LA1, and the width or area of the third light-emitting area LA3_1 is smaller than the width or area of the second light-emitting area LA2.

A color conversion substrate 30 includes a first light-transmitting area TA1, a second light-transmitting area TA2 and a third light-transmitting area TA3. The width or area of the second light-transmitting area TA2 is smaller than the width or area of the first light-transmitting area TA1, and the width or area of the third light-transmitting area TA3 is smaller than the width or area of the second light-transmitting area TA2.

The width or area of the third light-emitting area LA3_1 of the display substrate 10_1 may be equal to the width or area of the third light-transmitting area TA3. In some embodiments, the width or area of the first light-emitting area LA1 is smaller than the width or area of the first light-transmitting area TA1, and the width or area of the second light-emitting area LA2 is smaller than the width or area of the second light-transmitting area TA2, whereas the width or area of the third light-emitting area LA3_1 may be equal to the width or the area of the third light-transmitting area TA3. To this end, the width or area of a third anode electrode AE3_1 included in a third organic light-emitting diode ED3_1 may be increased as compared with that according to the exemplary embodiment of FIG. 6. By doing so, it is possible to improve the color gamut and luminous efficiency and to prevent or reduce deterioration of the third light-emitting area LA3 having the smallest width or area.

Figure 18:
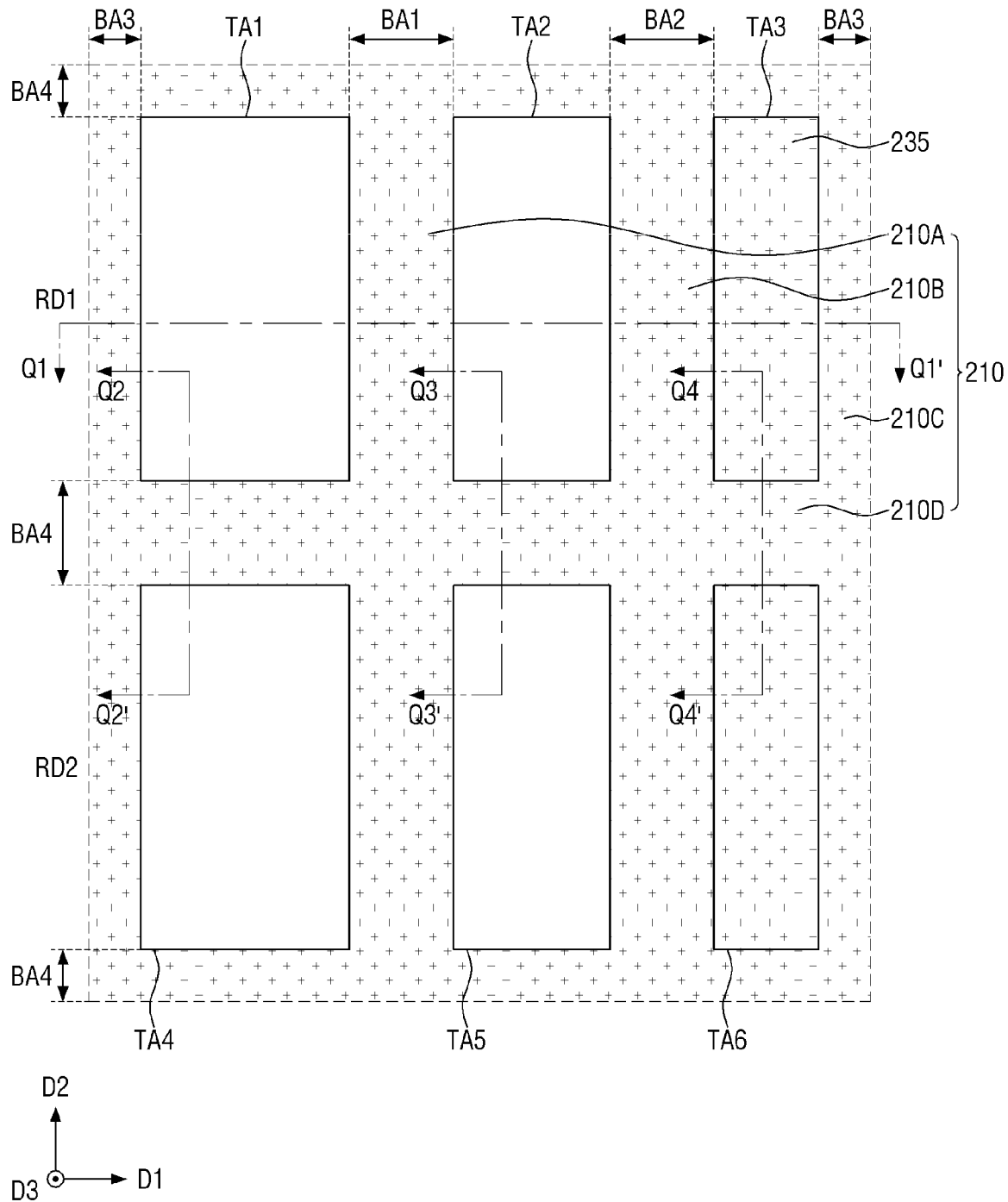
FIG. 18 is a plan view showing a layout of color patterns in a color conversion substrate of a display device according to another exemplary embodiment.
Figure 19:
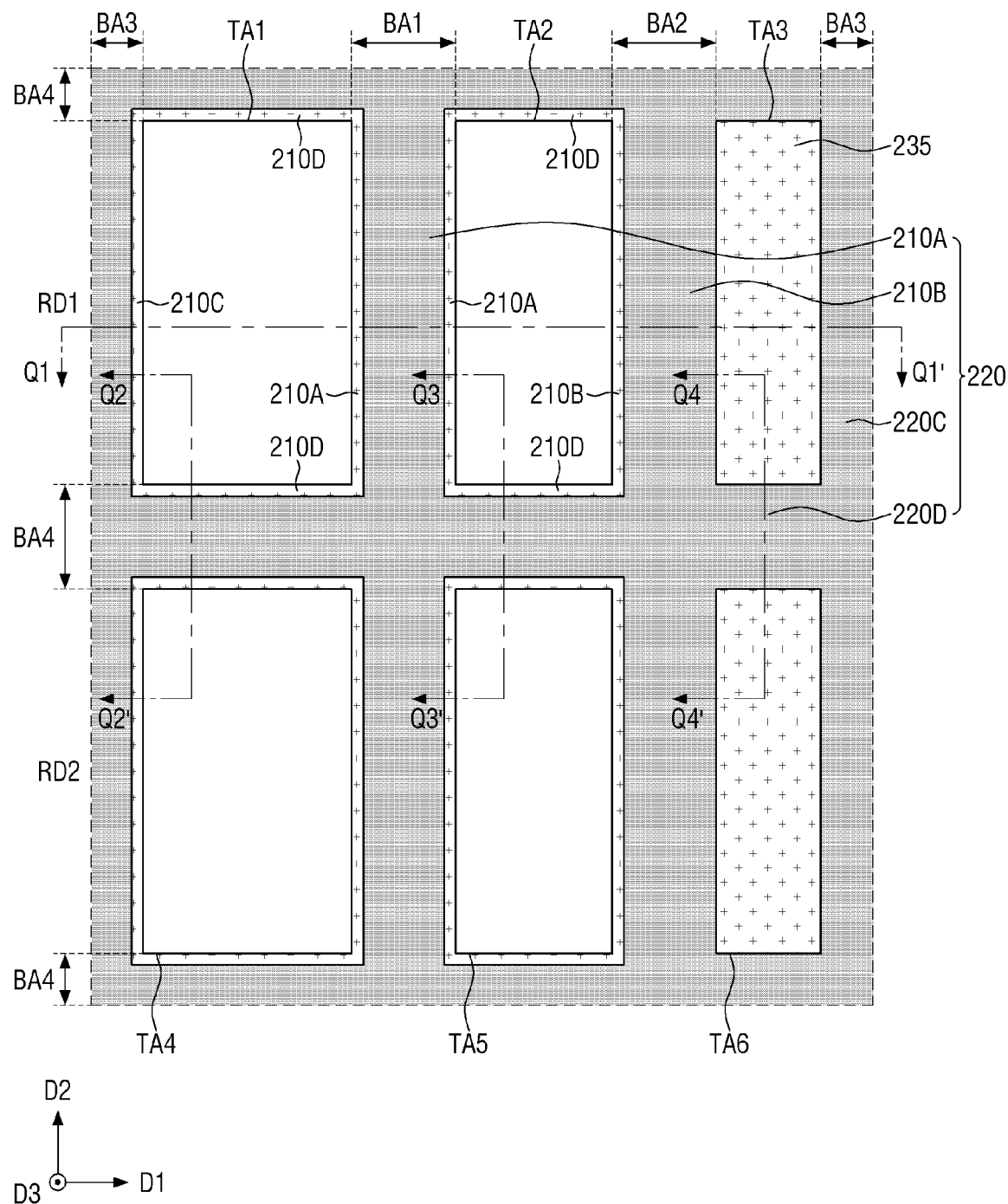
FIG. 19 is a plan view showing a layout of light-blocking members in the color conversion substrate of the display device according to the exemplary embodiment.
Figure 20:
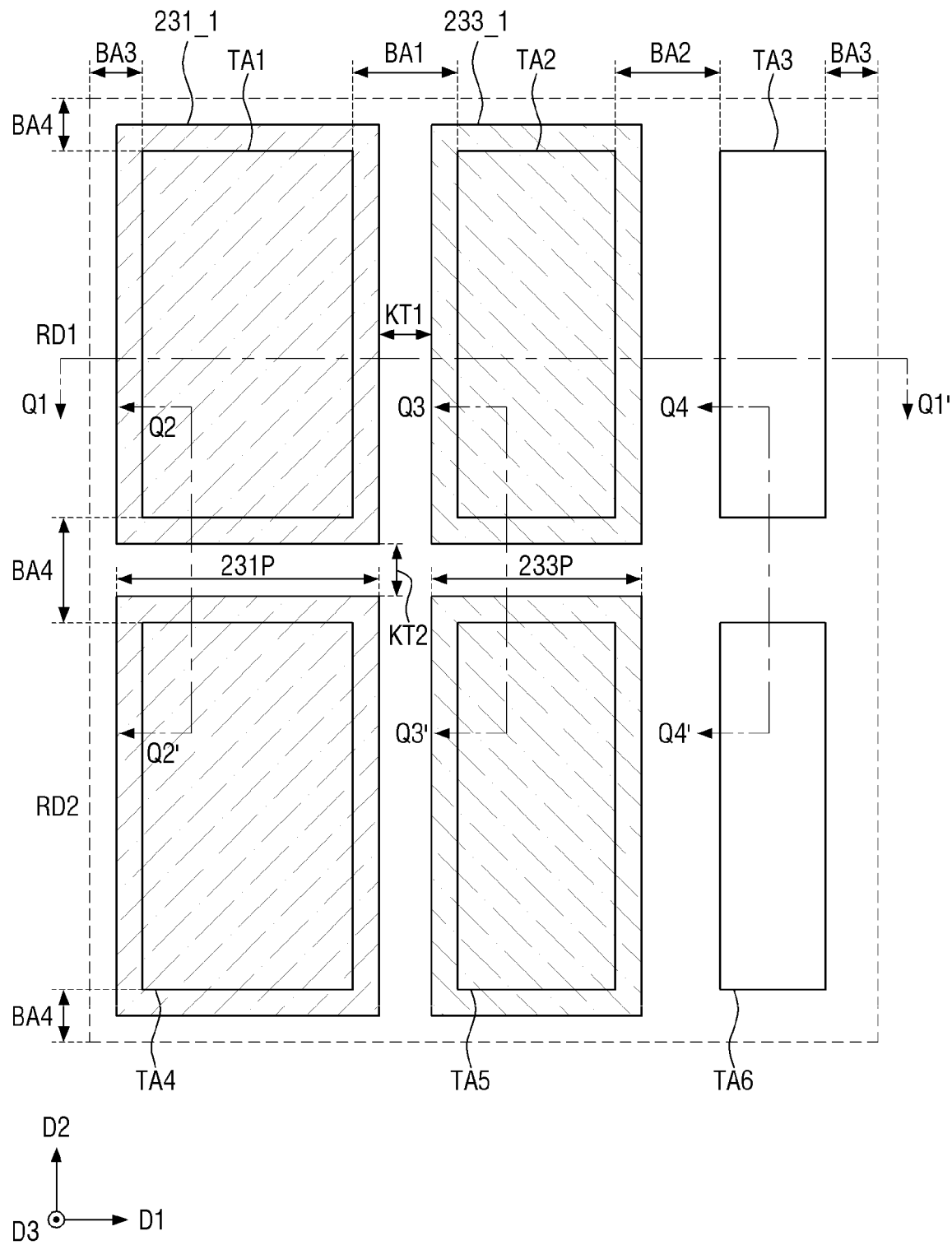
FIG. 20 is a plan view showing a layout of a first color filter and a second color filter in the color conversion substrate of the display device according to the exemplary embodiment of the present disclosure.
Figure 21:
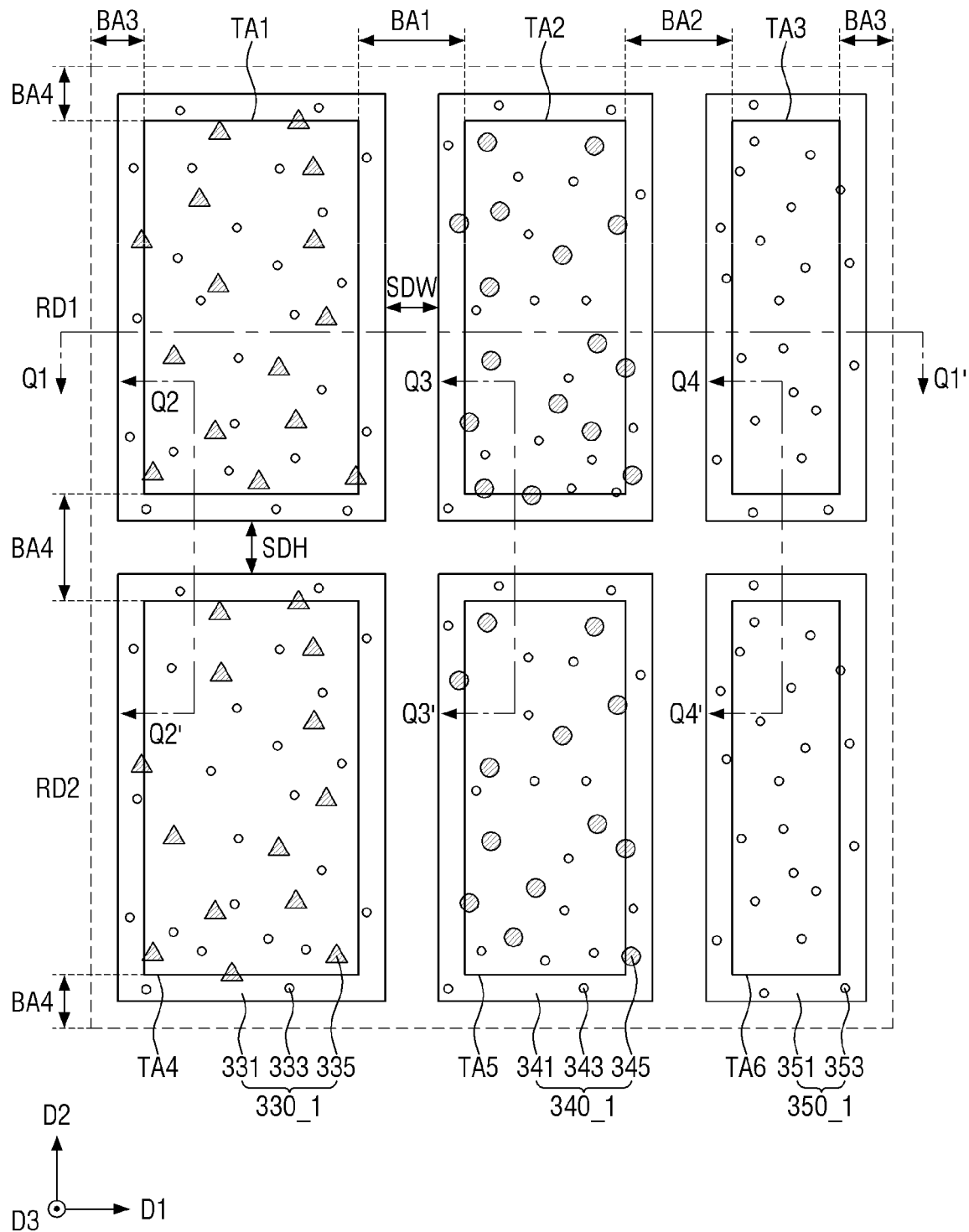
FIG. 21 is a plan view showing a layout of a first wavelength conversion pattern, a second wavelength conversion pattern and a light transmission pattern in the color conversion substrate of the display device according to the exemplary embodiment of the present disclosure.
Figure 22:
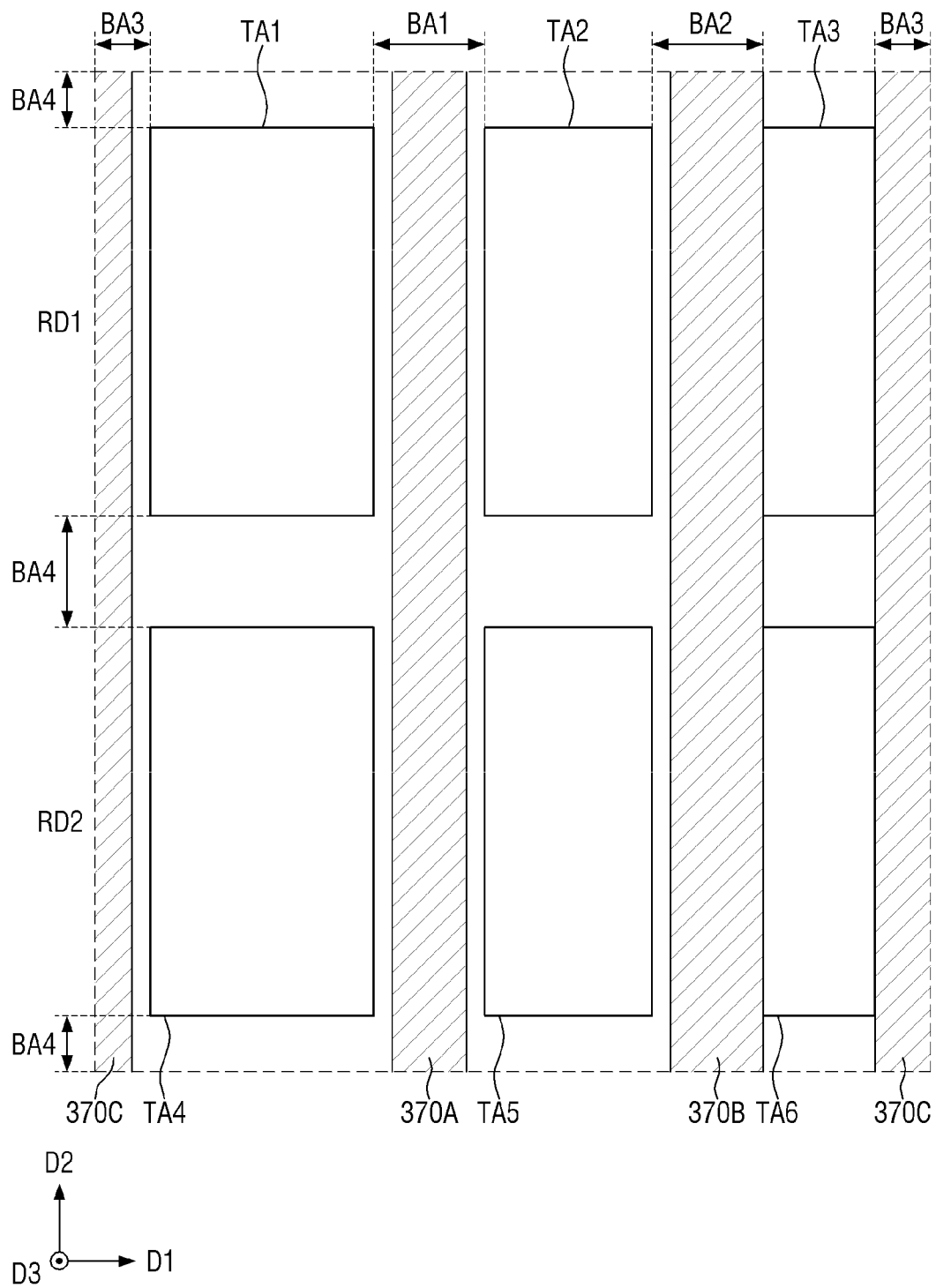
FIG. 22 is a plan view showing a layout of an anti-color-mixing member in the color conversion substrate of the display device according to the exemplary embodiment of the present disclosure.

FIG. 18 is a plan view showing a layout of color patterns in a color conversion substrate of a display device according to another exemplary embodiment. FIG. 19 is a plan view showing a layout of light-blocking members in the color conversion substrate of the display device according to the exemplary embodiment. FIG. 20 is a plan view showing a layout of a first color filter and a second color filter in the color conversion substrate of the display device according to the exemplary embodiment of the present disclosure. FIG. 21 is a plan view showing a layout of a first wavelength conversion pattern, a second wavelength conversion pattern and a light transmission pattern in the color conversion substrate of the display device according to the exemplary embodiment of the present disclosure. FIG. 22 is a plan view showing a layout of an anti-color-mixing member in the color conversion substrate of the display device according to the exemplary embodiment of the present disclosure.

Figure 23:
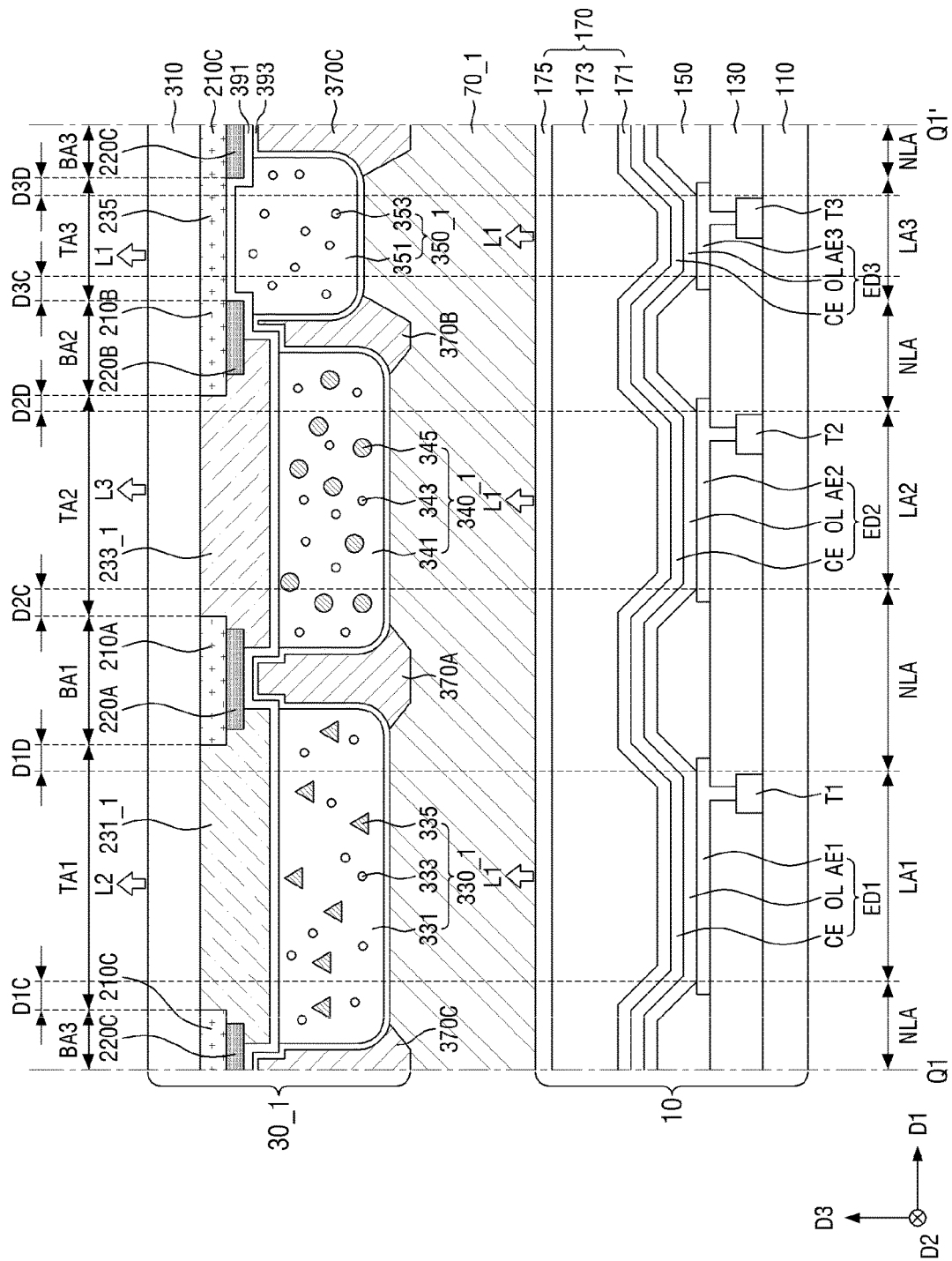
FIG. 23 is a cross-sectional view of a display device according to an exemplary embodiment of the present disclosure, taken along line Q1-Q1' of FIGS. 18-22.
Figure 24:
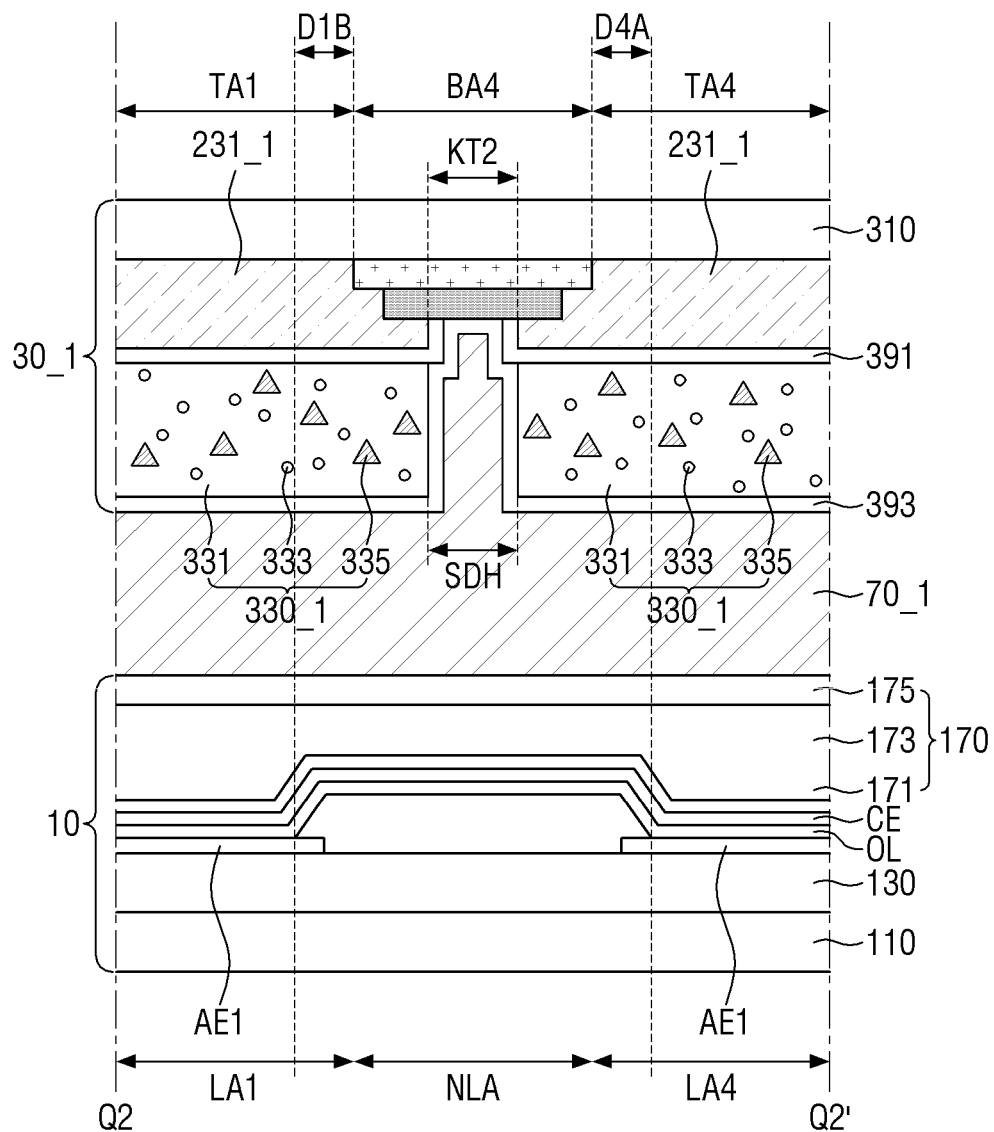
FIG. 24 is a cross-sectional view of the display device according to the exemplary embodiment of the present disclosure, taken along line Q2-Q2' in FIGS. 18-22.
Figure 25:
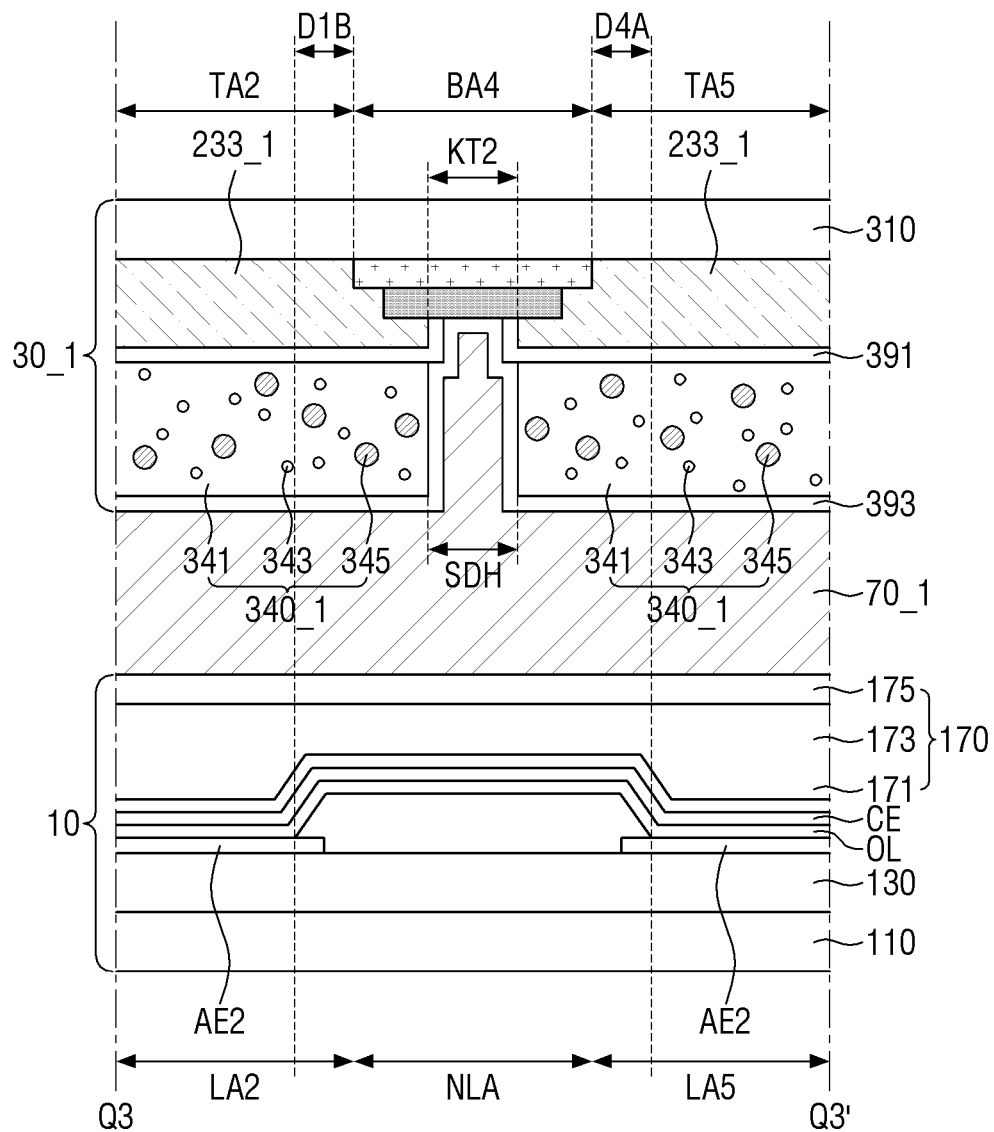
FIG. 25 is a cross-sectional view of the display device according to the exemplary embodiment of the present disclosure, taken along line Q3-Q3' in FIGS. 18-22.
Figure 26:
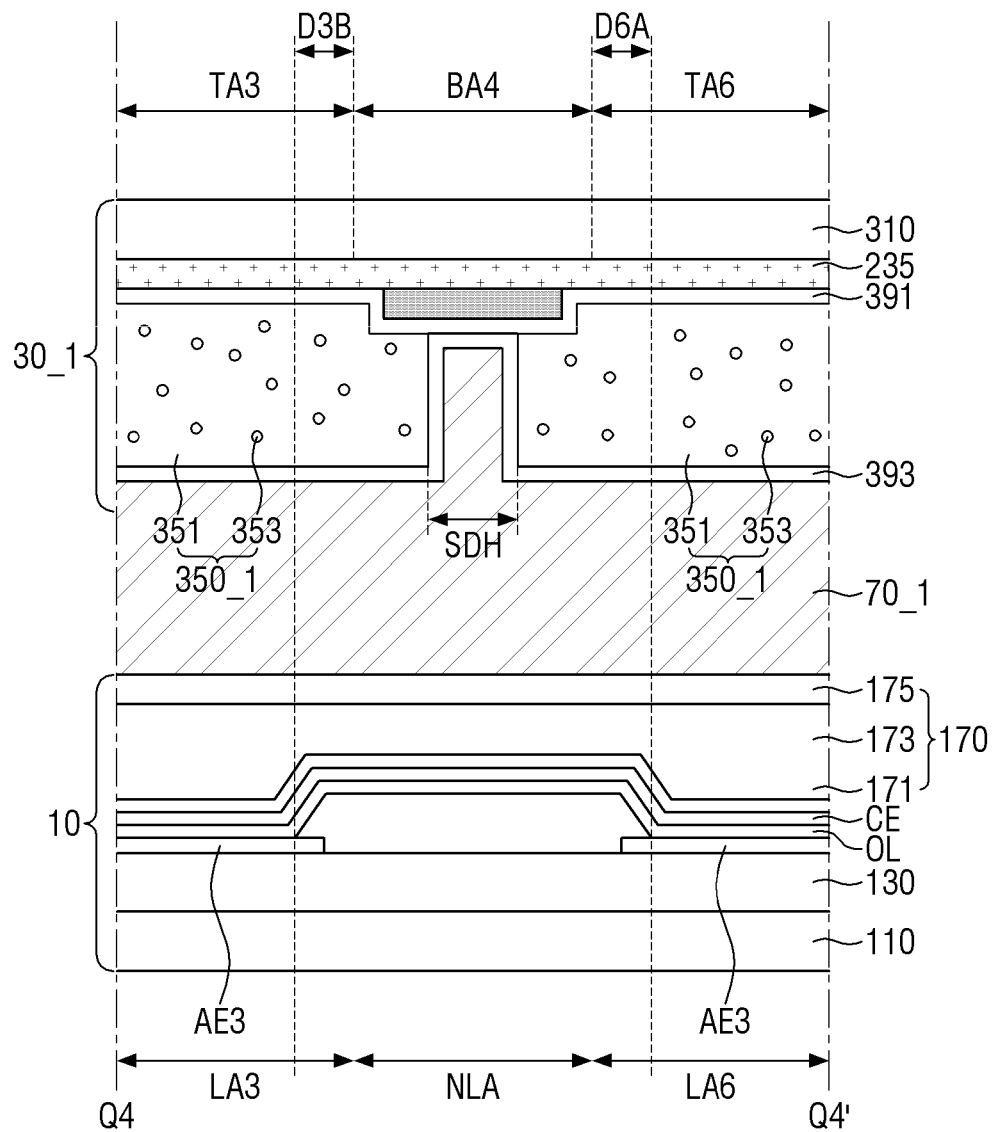
FIG. 26 is a cross-sectional view of the display device according to the exemplary embodiment of the present disclosure, taken along line Q4-Q4' in FIGS. 18-22.

The exemplary embodiment of FIGS. 18-22 is different from the exemplary embodiment of FIGS. 11-15 in that a second color filter, a third color filter, wavelength conversion patterns and a light transmission pattern are disposed in an island shape. The following description will focus on differences of the present embodiments, and therefore, redundant description will not be repeated here. FIG. 23 is a cross-sectional view of a display device according to an exemplary embodiment of the present disclosure, taken along line Q1-Q1' of FIGS. 18-22. FIG. 24 is a cross-sectional view of the display device according to the exemplary embodiment of the present disclosure, taken along line Q2-Q2' in FIGS. 18 to 22. FIG. 25 is a cross-sectional view of the display device according to the exemplary embodiment of the present disclosure, taken along line Q3-Q3' in FIGS. 18-22. FIG. 26 is a cross-sectional view of the display device according to the exemplary embodiment of the present disclosure, taken along line Q4-Q4' in FIGS. 18-22. Description will be made with reference to the plan views of the FIGS. 18-22 along with the cross-sectional views of FIGS. 23-26.

The arrangement of the third color filter 235 and the color pattern 210 in the color conversion substrate 30_1 of FIG. 18 and the arrangement of the light-blocking member 220 of FIG. 19 are identical to those in FIGS. 11 and 12; and therefore, redundant description thereof will not be repeated here.

Referring to FIG. 20 in conjunction with FIGS. 23-26, a first color filter 231_1 and a second color filter 233_1 may be disposed on the surface of the second base 310 that faces the display substrate 10.

The first color filter 231_1 and the second color filter 233_1 may be disposed on the second base 310 in an island shape. For example, the first color filter 231_1 may be located in each of the first light-transmitting area TA1 and the fourth light-transmitting area TA4. The second color filter 233_1 may be located in each of the second light-transmitting area TA2 and the fifth light-transmitting area TA5. The first color filter 231_1 of the first light=transmitting area TA1 and the second color filter 233_1 of the second light-transmitting area TA2 may be spaced apart from each other by a first width KT1 in the first direction D1. In addition, the first color filter 231_1 and the second color filter 233_1 disposed in the first light-transmitting area TA1 and the second light-transmitting area TA2, respectively, may be spaced apart from the first color filter 231_1 and the second color filter 233_1 disposed in the fourth light-transmitting area TA4 and the fifth light-transmitting area TA5, respectively, by a second width KT2 in the second direction D2.

In some exemplary embodiments, the first color filter 231_1 and the second color filter 233_1 disposed in the first light-transmitting area TA1 and the second light-transmitting area TA2, respectively, may overlap either each other in the first direction D1 in the first light-blocking area BA1 and may be spaced apart from each other only in the second direction D2 in the fourth light-blocking area BA4.

The width of the first color filter 231_1 in the first direction may be different that of the second color filter 233_1. For example, the width of the first color filter 231_1 in the first direction may be greater than the width of the second color filter 233_1 in the first direction. It is, however, to be understood that the present disclosure is not limited thereto. In some exemplary embodiments, the width of the first color filter 231_1 in the first direction may be equal to that of the second color filter 233_1.

As the first color filter 231_1 and the second color filter 233_1 are disposed in the island shape, a first light-blocking member 220A may be exposed which is disposed in the first light-blocking area BA1 between the first color filter 231_1 and the second color filter 233_1, and a fourth light-blocking member 220D may be exposed which is disposed in the fourth light-blocking area BA4 between the first row RD1 and the second row RD2.

As shown in FIGS. 23-26, a first capping layer 391 that covers the color pattern 210, the light-blocking member 220, the first color filter 231, the second color filter 233 and the third color filter 235 may be disposed on the surface of the second base 310. The first capping layer 391 may be in direct contact with the first color filter 231_1, the second color filter 233_1, and the third color filter 235. The first capping layer 391 may be in direct contact with the light-blocking member 220 disposed in the first light-blocking area BA1, the second light-blocking area BA2, the third light-blocking area BA3 and the fourth light-blocking area BA4. In addition, the first capping layer 391 may be in contact with the side surface of each of the first color filter 231_1 and the second color filter 233_1.

Referring to FIG. 21 in conjunction with FIGS. 23-26, a first wavelength conversion pattern 330_1, a second wavelength conversion pattern 340_1 and a light transmission pattern 350 may be disposed on the first capping layer 391 in an island shape.

For example, the first wavelength conversion pattern 330_1 may be disposed in each of the first light-transmitting area TA1 and the fourth light-transmitting area TA4, the second wavelength conversion pattern 340_1 may be disposed in each of the second light-transmitting area TA2 and the fifth light-transmitting area TA5, and the light transmission pattern 350_1 may be disposed in each of the third light-transmitting area TA3 and the sixth light-transmitting area TA6.

The first wavelength conversion patterns 330_1, the second wavelength conversion patterns 340_1 and the light transmission patterns 350_1 are spaced apart from one another by a first width SDW in the first direction D1 and spaced apart from one another by a second width SDH in the second direction D2, such that the first capping layer 391 may be exposed in the first light-blocking area BA1, the second light-blocking area BA2, the third light-blocking area BA3 and the fourth light-blocking area BA4.

In this manner, as the color filters 231_1, 233_1 and 235_1, the wavelength conversion patterns 330_1 and 340_1 and the light transmission patterns 350_1 are disposed in the island shape, a filler 70_1 can be disposed even between the color filters 231_1, 233_1 and 235_1, the wavelength conversion patterns 330_1 and 340_1 and the light transmission patterns 350_1 in the fourth light-blocking area BA4. Accordingly, the spaces between the elements can be filled more reliably, such that the light-transmitting areas TA1, TA2, TA3, TA4, TA5 and TA6 can be more clearly defined, thereby further improving the color gamut.

Referring to FIGS. 23-26, a second capping layer 393 may be disposed on the first wavelength conversion pattern 330_1, the second wavelength conversion pattern 340_1, and the light transmission pattern 350. The second capping layer 393 may cover the first wavelength conversion pattern 330_1, the second wavelength conversion pattern 340_1, and the light transmission pattern 330_1. The second capping layer 393 may be in contact with the first capping layer 391 and can seal the first wavelength conversion pattern 330_1, the second wavelength conversion pattern 340_1 and the light transmission pattern 350_1.

Referring to FIG. 22 in conjunction with FIGS. 23-26, an anti-color-mixing member 370 may be disposed on the second capping layer 393. The arrangement of the anti-color-mixing member 370 is identical (or substantially identical) to that of FIG. 15; and therefore, redundant description thereof will not be repeated here.

Figure 27:
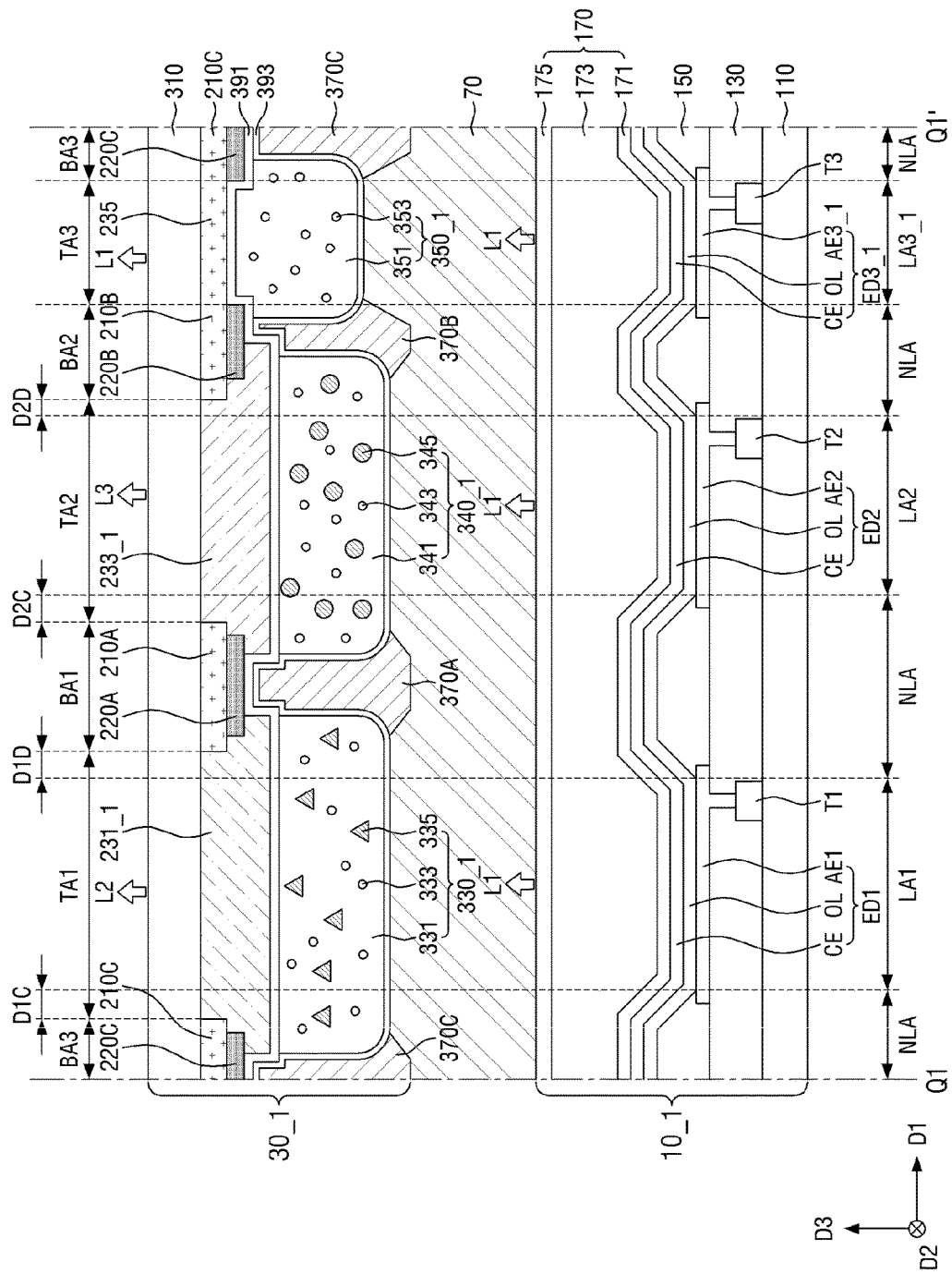
FIG. 27 is a cross-sectional view of a display device according to another exemplary embodiment of the present disclosure.

FIG. 27 is a cross-sectional view of a display device according to another exemplary embodiment of the present disclosure. The exemplary embodiment of FIG. 27 is different from the exemplary embodiment of FIG. 23 in that the area of a third light-emitting area LA3_1 is equal to the area of the third light-transmitting area TA3. The following descriptions will focus on differences of the present embodiments, and therefore, description already provided herein will not be repeated here.

Referring to FIG. 27, the width or area of the third light-emitting area LA3_1 of the display substrate 10_1 may be equal to the width or area of the third light-transmitting area TA3 of the color conversion substrate 30_1. For example, the width or area of the first light-emitting area LA1 is smaller than the width or area of the first light-transmitting area TA1, and the width or area of the second light-emitting area LA2 is smaller than the width or area of the second light-transmitting area TA2, whereas the width or area of the third light-emitting area LA3_1 may be equal to the width or the area of the third light-transmitting area TA3. To this end, the width or area of a third anode electrode AE3_1 included in a third organic light-emitting diode ED3_1 may be increased as compared with that according to the exemplary embodiment of FIG. 6. By doing so, it is possible to improve the color gamut and luminous efficiency and to prevent or reduce deterioration of the third light-emitting area LA3_1 having the smallest width or area. In some embodiments, the width or the area of the third light-transmitting area TA3 is larger than the width or area of the third light-emitting area LA3_1.

Figure 28:
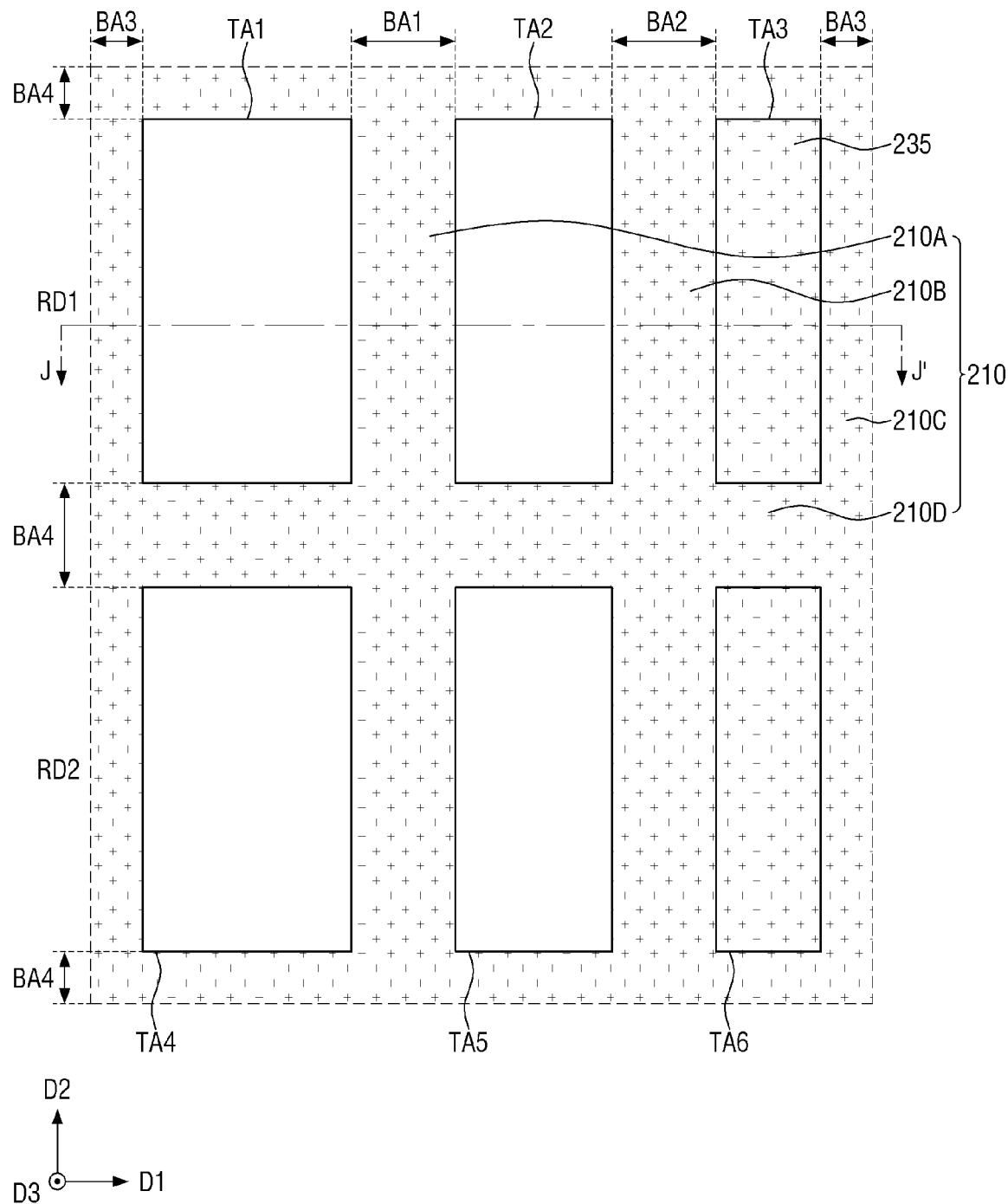
FIG. 28 is a plan view showing a layout of color patterns in a color conversion substrate of a display device according to another exemplary embodiment.
Figure 29:
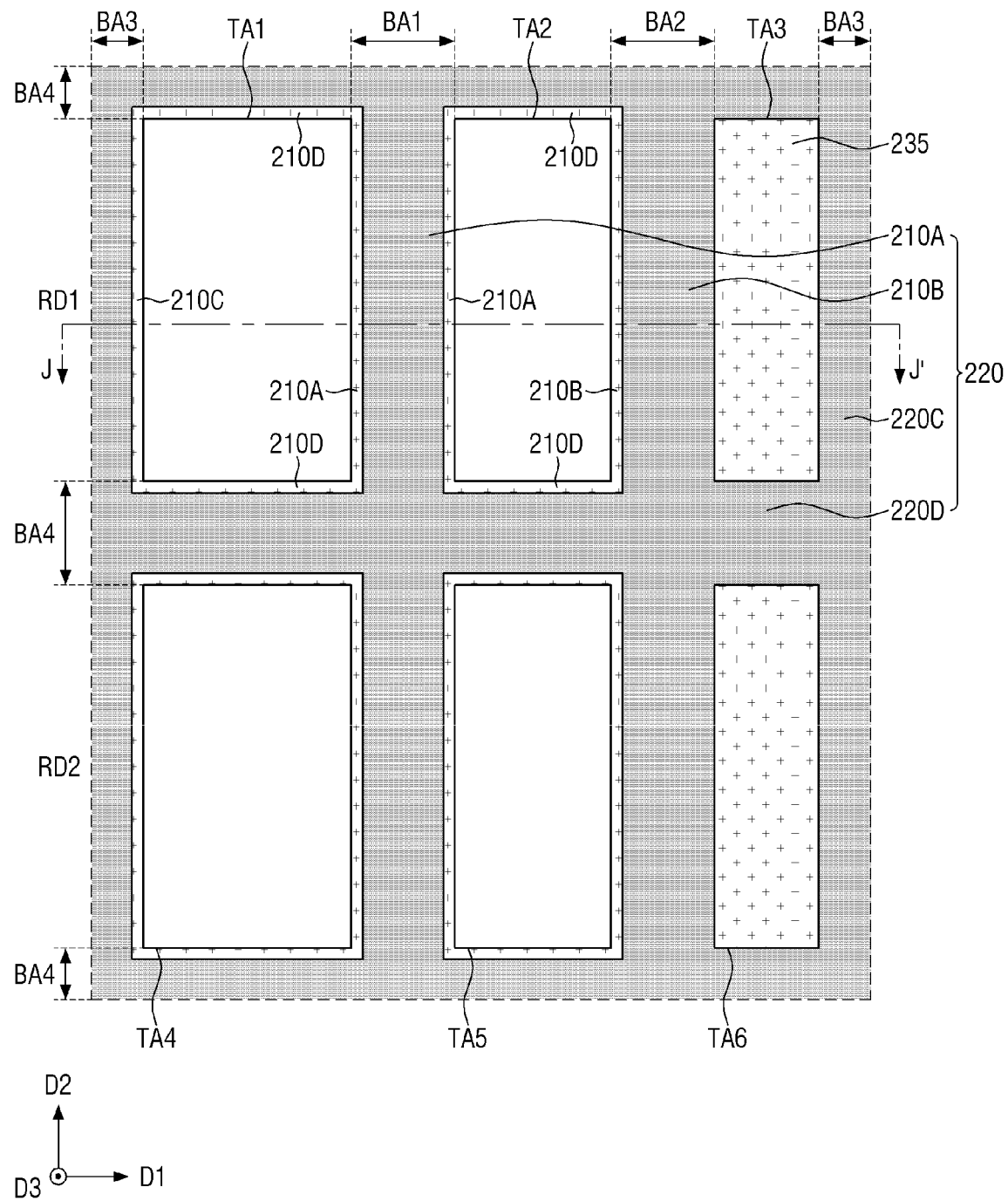
FIG. 29 is a plan view showing a layout of light-blocking members in a color conversion substrate of a display device according to another exemplary embodiment of the present disclosure.
Figure 30:
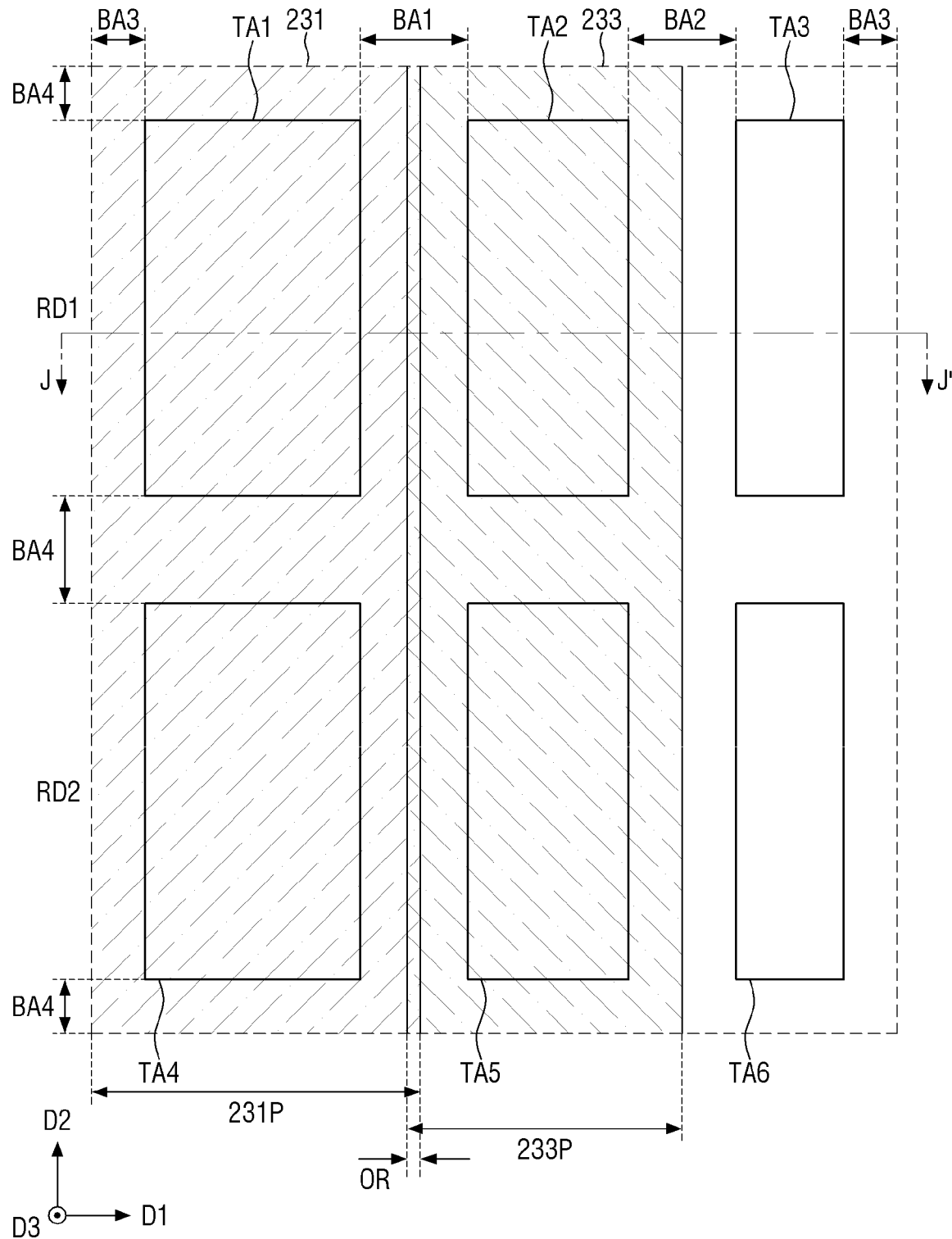
FIG. 30 is a plan view showing a layout of a first color filter and a second color filter in the color conversion substrate of the display device according to the exemplary embodiment of the present disclosure.
Figure 31:
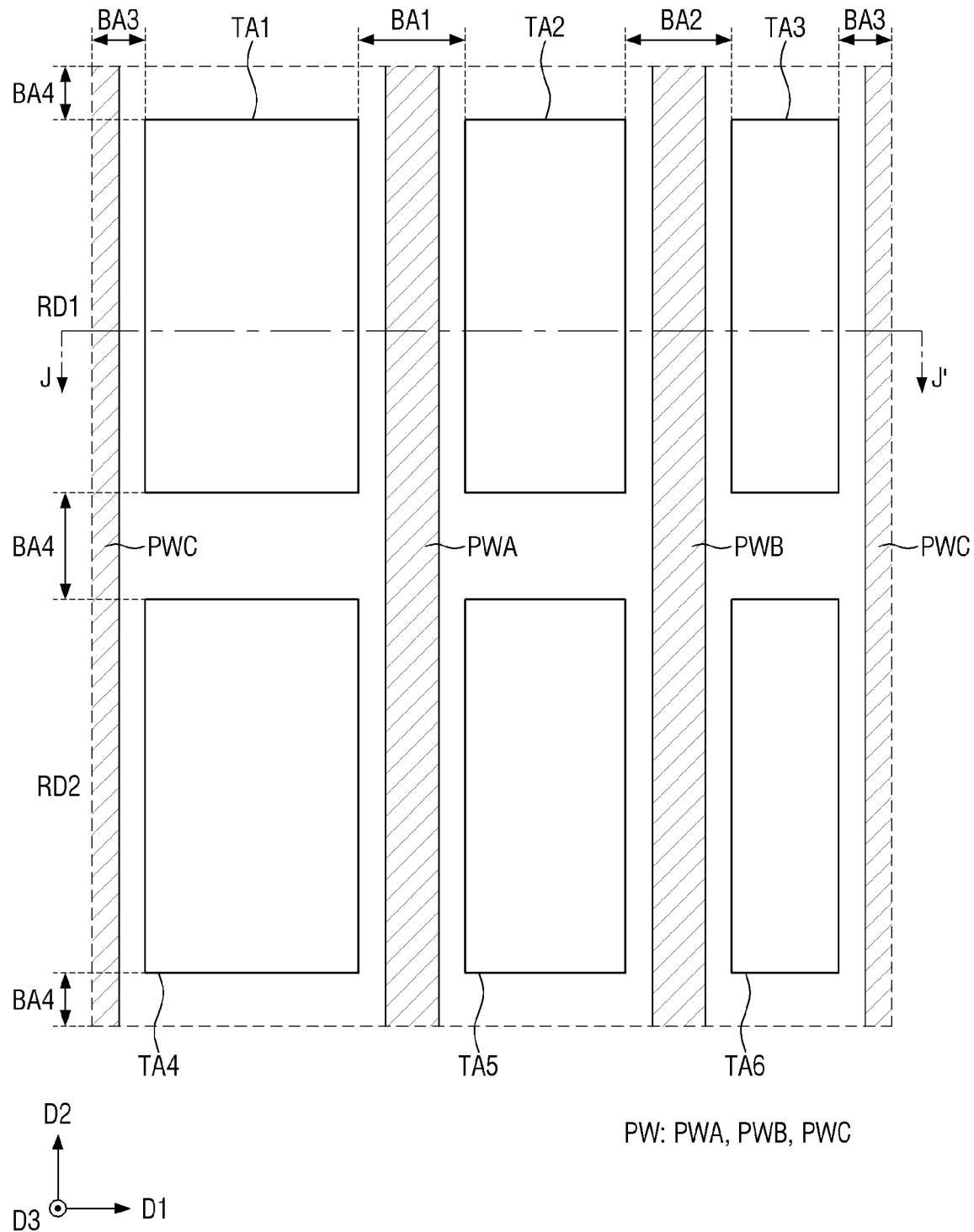
FIG. 31 is a plan view showing a layout of partition walls in a color conversion substrate of a display device according to another exemplary embodiment.
Figure 32:
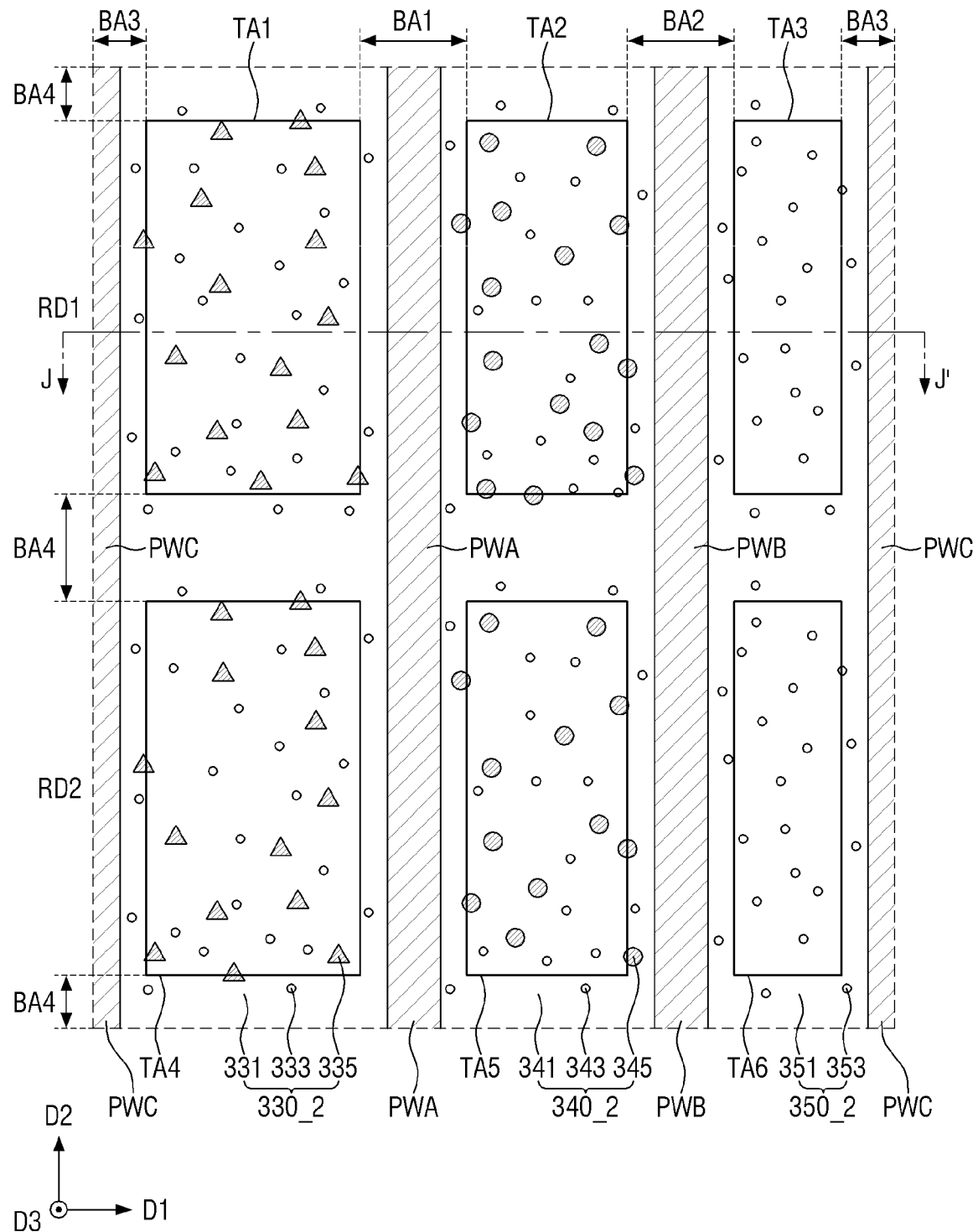
FIG. 32 is a plan view showing a layout of a first wavelength conversion pattern, a second wavelength conversion pattern and a light transmission pattern in the color conversion substrate of the display device according to the exemplary embodiment of the present disclosure.
Figure 33:
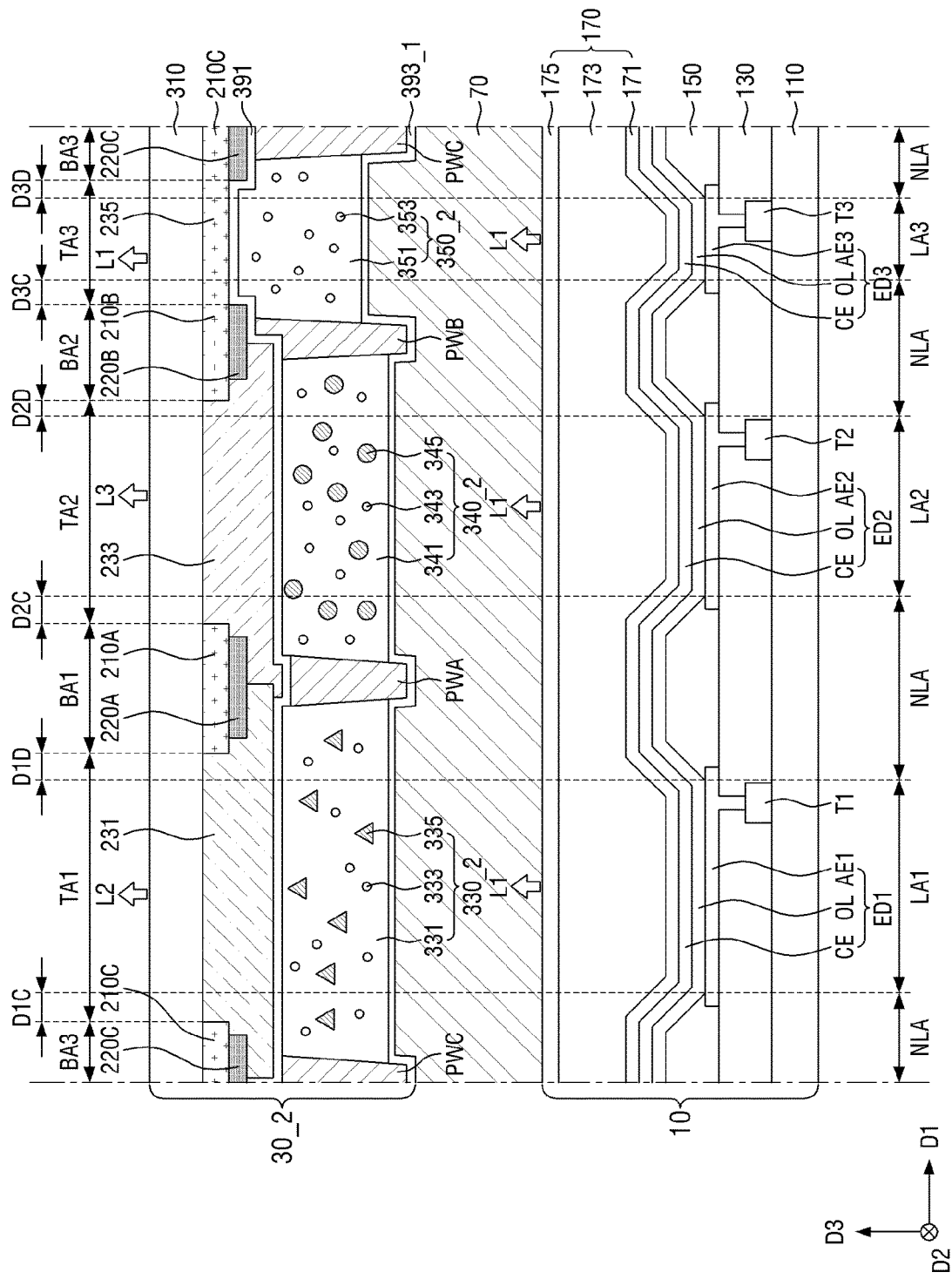
FIG. 33 is a cross-sectional view of a display device according to an exemplary embodiment of the present disclosure, taken along line J-J' of FIGS. 28-32.

FIG. 28 is a plan view showing a layout of color patterns in a color conversion substrate of a display device according to another exemplary embodiment. FIG. 29 is a plan view showing a layout of light-blocking members in a color conversion substrate of a display device according to another exemplary embodiment of the present disclosure. FIG. 30 is a plan view showing a layout of a first color filter and a second color filter in the color conversion substrate of the display device according to the exemplary embodiment of the present disclosure. FIG. 31 is a plan view showing a layout of partition walls in a color conversion substrate of a display device according to another exemplary embodiment. FIG. 32 is a plan view showing a layout of a first wavelength conversion pattern, a second wavelength conversion pattern and a light transmission pattern in the color conversion substrate of the display device according to the exemplary embodiment of the present disclosure. FIG. 33 is a cross-sectional view of a display device according to an exemplary embodiment of the present disclosure, taken along line J-J' of FIGS. 28-32. The exemplary embodiment of FIGS. 28-33 is different from the exemplary embodiment of FIGS. 6 and 11-15 in that partition walls PW are disposed between the first wavelength conversion pattern 330_2 and the second wavelength conversion pattern 340_2 and the light transmission pattern 350_2. The following description will focus on differences of the present embodiments, and therefore, description already provided herein will not be repeated here.

The arrangement of the third color filter 235 and the color pattern 210 in the color conversion substrate 30_2 in FIG. 28, the arrangement of the light-blocking member 220 in FIG. 29 and the arrangement of the first color filter 231 and the second color filter 233 are identical to those shown in FIGS. 11-13; and therefore, redundant description thereof will not be repeated here.

Referring to FIGS. 31 and 33, partition walls PW may be located on the first capping layer 391. The partition walls PW may separate the first wavelength conversion pattern 330_2, the second wavelength conversion pattern 340_2 and the light transmission pattern 350_2 one from another and may be located within the light-blocking area BA to block the transmission of light. For example, the partition walls PW may be disposed in each of the first light-blocking area BA1, the second light-blocking area BA2 and the third light-blocking area BA3, and may be arranged in a stripe form traversing the fourth light-blocking area BA4. For example, the partition walls PW may include a first partition wall PWA disposed in the first light-blocking area BA1, a second partition wall PWB disposed in the second light-blocking area BA2, and a third partition wall PWC disposed in the third light-blocking area BA3. In some exemplary embodiments, the width of the first partition wall PWA may be smaller than the width of the first light-blocking area BA1, the width of the second partition wall PWB may be smaller than the width of the second light-blocking area BA2, and the width of the third partition wall PWC may be smaller than the width of the third light-blocking area BA3. In some exemplary embodiments, the third partition wall PWC may be longer than the first partition wall PWA and the second partition wall PWB. In some exemplary embodiments, the end of the third partition wall PWC may be located on the same (e.g., substantially the same) plane as the first partition wall PWA and the second partition wall PWB. The partition walls PW may be in direct contact with the first capping layer, the first wavelength conversion pattern 330_2 and the second wavelength conversion pattern 340_2, the light transmission pattern 350_2, and the second capping layer 393_1.

Referring to FIGS. 32 and 33, the first wavelength conversion pattern 330_2 and the second wavelength conversion pattern 340_2 and the light transmission pattern 350_2 may be positioned between the partition walls PW. For example, the first wavelength conversion pattern 330_2 may be located between the partition wall PWC and the first partition wall PWA, the second wavelength conversion pattern 330_2 may be located between the first partition wall PWA and the second partition wall PWB, and the light transmission pattern 350_2 may be located between the second partition wall PWB and the third partition wall PWC.

Each of the first wavelength conversion pattern 330_2, the second wavelength conversion patterns 340_2 and the light transmission pattern 350_2 may be in contact with the first capping layer 391 and the partition walls PW. By disposing the partition walls PW in this manner and performing an inkjet process between the partition walls PW, it is possible to form the first wavelength conversion pattern 330_2, the second wavelength conversion patterns 340_2 and the light transmission pattern 350_2. As a result, the procedure of the process can become simpler.

The second capping layer 393_1 may be located on the first wavelength conversion pattern 330_2, the second wavelength conversion pattern 340_2, the light transmission pattern 350_2 and the partition walls PW. The second capping layer 393_1 may cover the first wavelength conversion pattern 330_2, the second wavelength conversion pattern 340_2, the light transmission pattern 330_2 and the partition walls PW. The second capping layer 393_1 may seal the first wavelength conversion pattern 330_2, the second wavelength conversion pattern 340_2, the light transmission pattern 350_2 and the partition walls PW.

Figure 34:
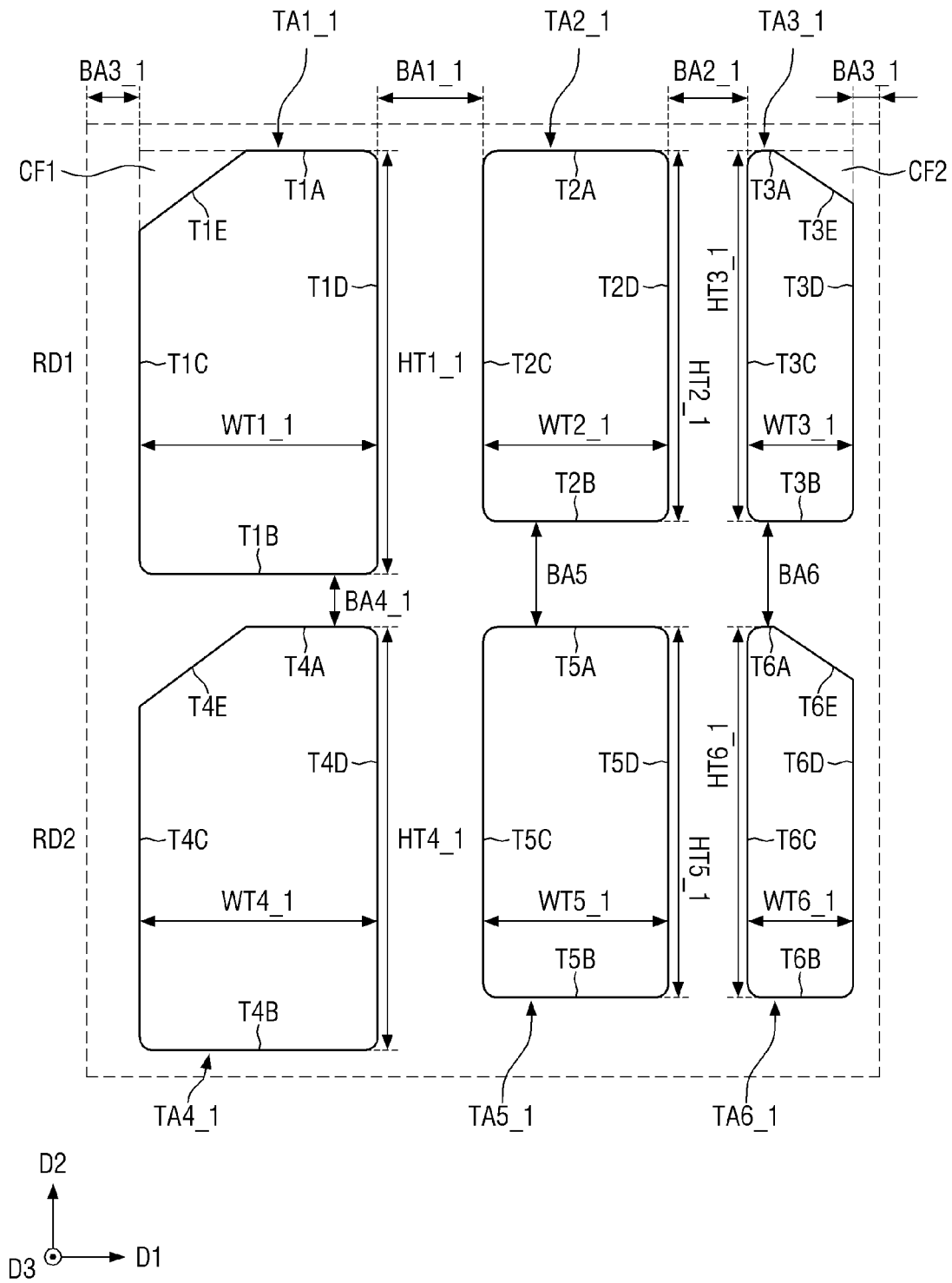
FIG. 34 is a plan view of a color conversion substrate according to another exemplary embodiment.
Figure 35:
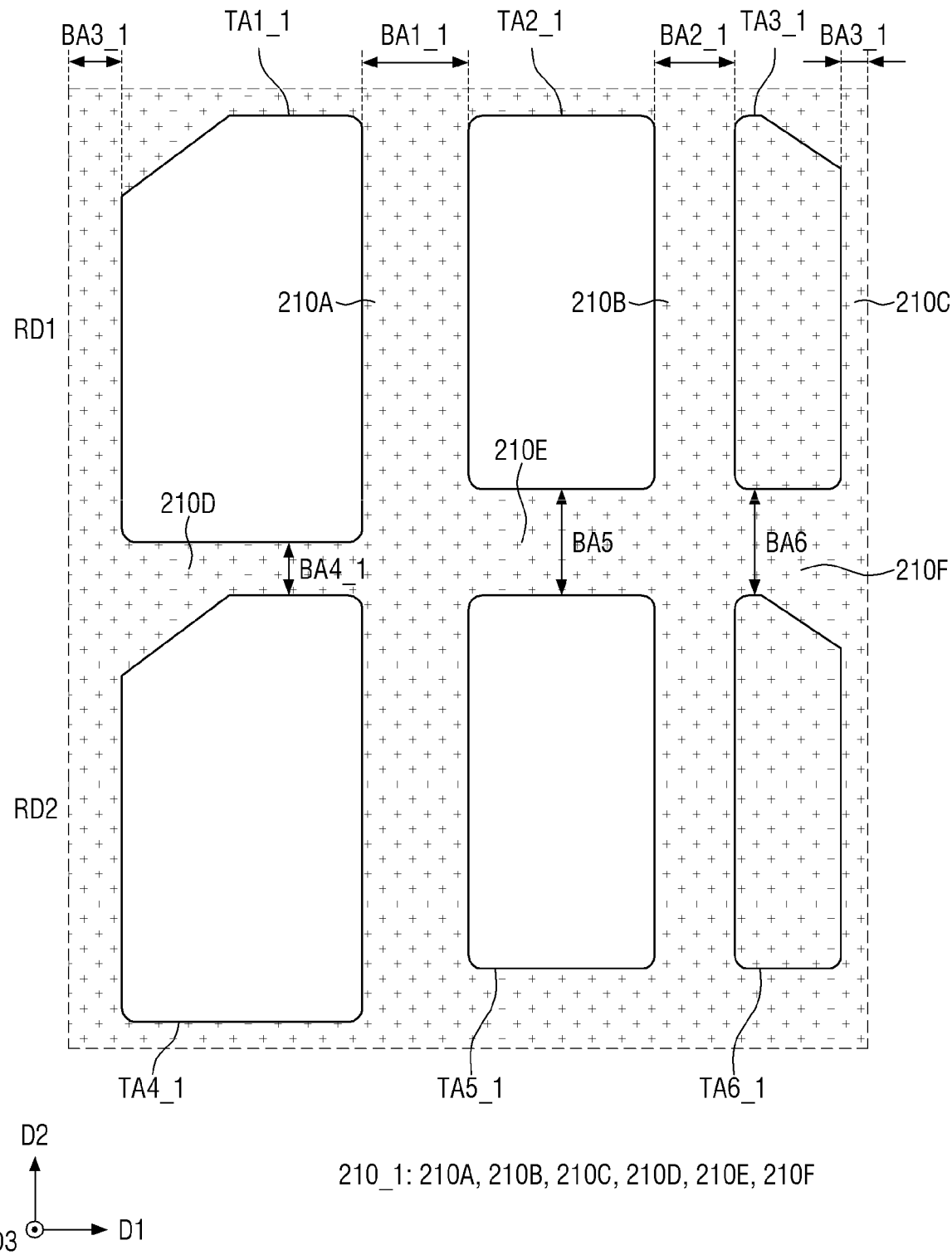
FIG. 35 is a plan view showing a layout of a third color filter and color patterns in a color conversion substrate according to an exemplary embodiment of the present disclosure.
Figure 36:
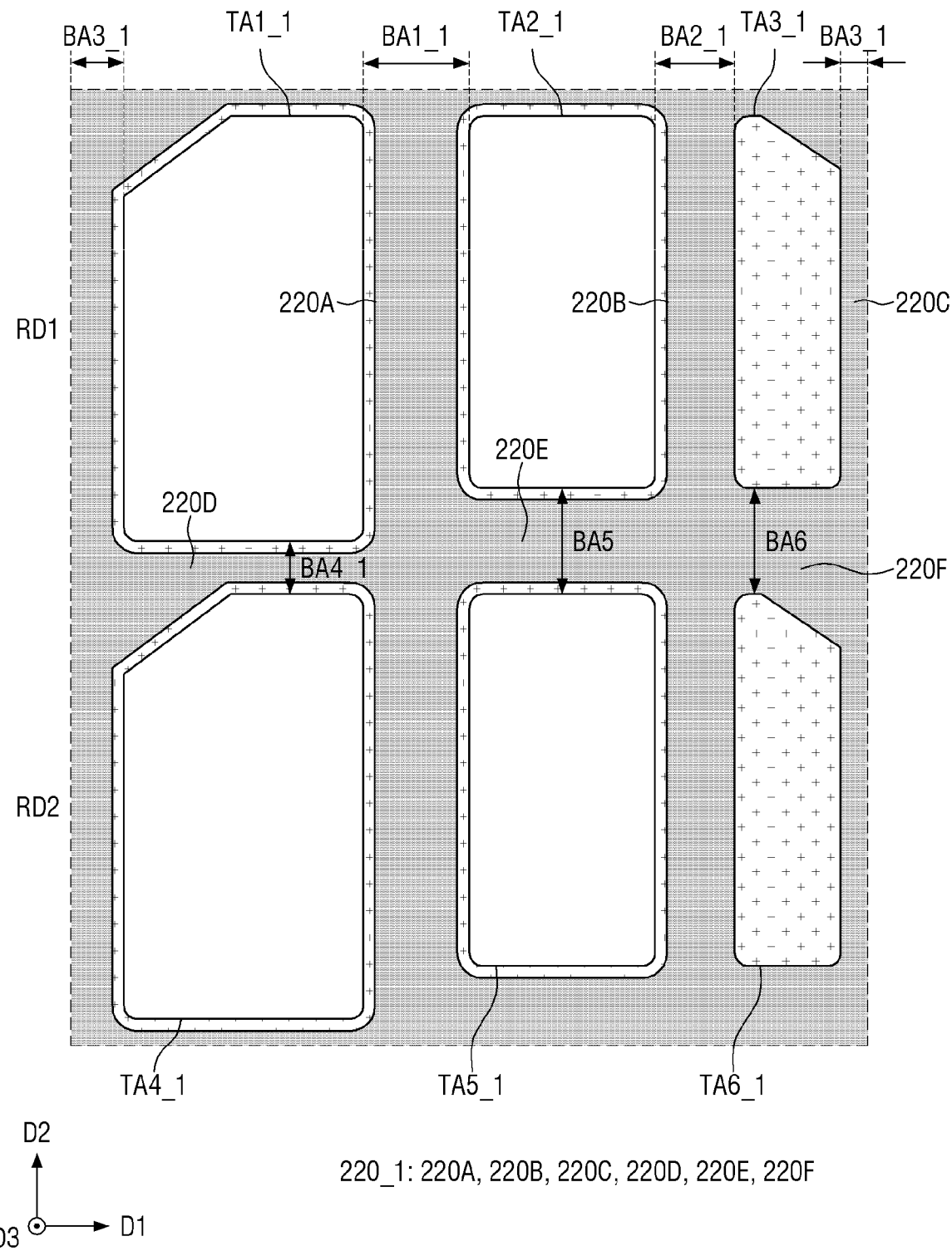
FIG. 36 is a plan view showing a layout of light-blocking members in the color conversion substrate according to the exemplary embodiment.
Figure 37:
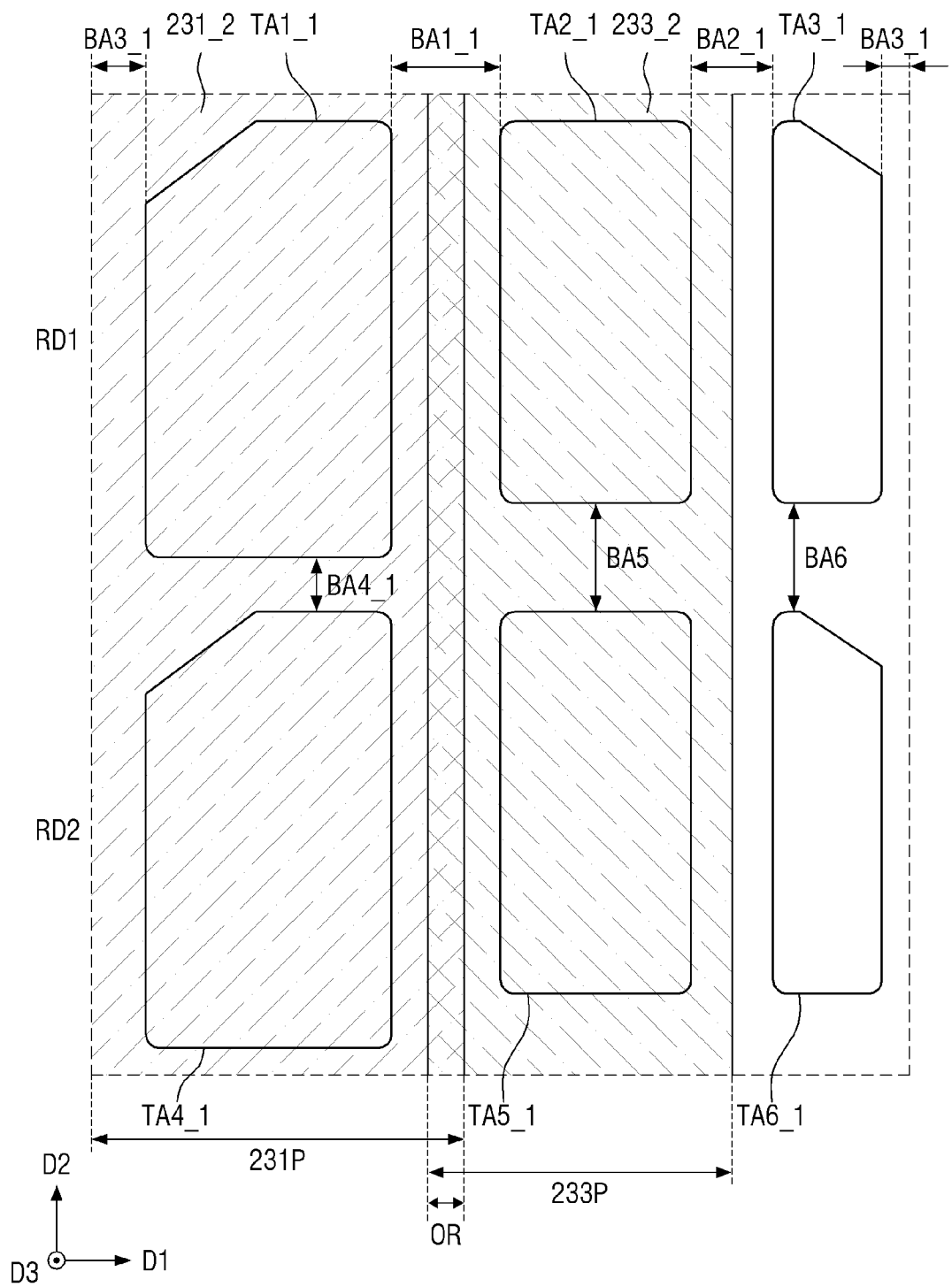
FIG. 37 is a plan view showing a layout of a first color filter and a second color filter in the color conversion substrate according to the exemplary embodiment of the present disclosure.
Figure 38:
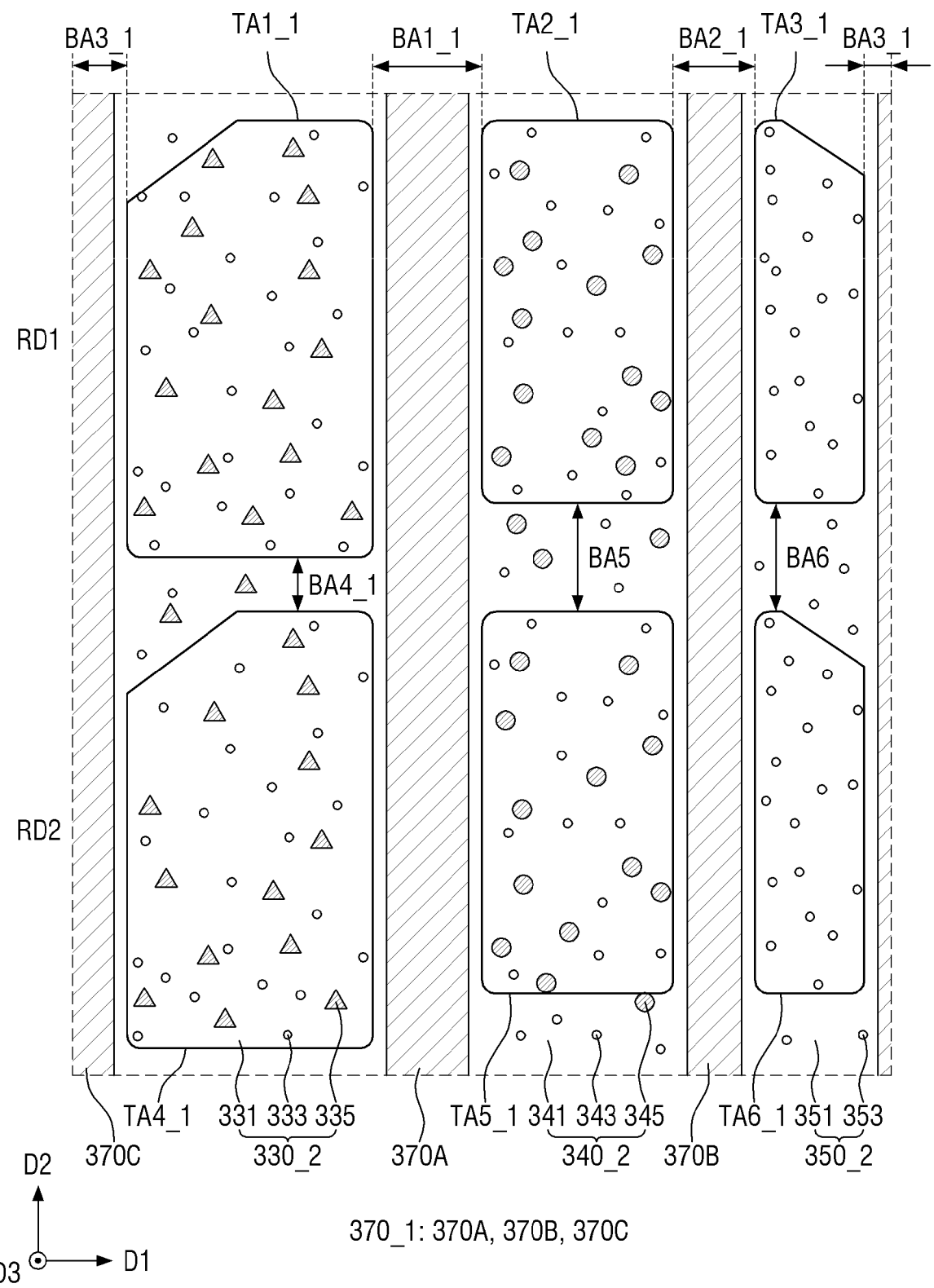
FIG. 38 is a plan view showing a layout of a first wavelength conversion pattern, a second wavelength conversion pattern and a light transmission pattern and an anti-color-mixing member in the color conversion substrate according to the exemplary embodiment of the present disclosure.

FIG. 34 is a plan view of a color conversion substrate according to another exemplary embodiment. FIG. 35 is a plan view showing a layout of a third color filter and color patterns in a color conversion substrate according to an exemplary embodiment of the present disclosure. FIG. 36 is a plan view showing a layout of light-blocking members in the color conversion substrate according to the exemplary embodiment. FIG. 37 is a plan view showing a layout of a first color filter and a second color filter in the color conversion substrate according to the exemplary embodiment of the present disclosure. FIG. 38 is a plan view showing a layout of a first wavelength conversion pattern, a second wavelength conversion pattern and a light transmission pattern and an anti-color-mixing member in the color conversion substrate according to the exemplary embodiment of the present disclosure. The exemplary embodiment of FIGS. 34-38 is different from the exemplary embodiment of FIGS. 4 and 11-15 in that the shapes of the light-transmitting areas and the light-blocking areas are different. The following description will focus on differences of the present embodiments, and therefore, description already provided herein will not be repeated here.

Referring to FIG. 34, on the color conversion substrate 30_1 in the display area DA, a plurality of light-transmitting areas TA1_1, TA2_1, TA3_1, TA4_1, TA5_1 and TA6_1 and light-blocking areas BA1_1, BA2_1, BA3_1, BA4_1 and BA6 may be defined.

In some embodiments, the first light-transmitting area TA1_1, the second light-transmitting area TA2_1 and the third light-transmitting area TA3_1 may be disposed in the first row RD1 along the first direction D1. In the second row RD2 adjacent to the first row RD1 along the second direction D2, the fourth light-transmitting area TA4_1, the fifth light-transmitting area TA5_1 and the sixth light-transmitting area TA6_1 may be repeatedly arranged in the stated order.

The first light-transmitting area TA1_1 may include a first chamfer CF1 at at least one corner. For example, the first light-transmitting area TA1_1 may include a first side T1A and a second side T1B arranged in parallel (e.g., substantially in parallel) in the second direction D2, a third side T1C and a fourth side T1D arranged in parallel (e.g., substantially in parallel) in the first direction D1, and a fifth side T1E that obliquely couples the end of the first side T1A with the end of the third side T1C. The first light-transmitting area TA1_1 may include the first chamfer CF1 by virtue of the fifth side T1E.

The first side T1A may be shorter than the second side T1B, and the third side T1C may be shorter than the fourth side T1D.

The second light-transmitting area TA2_1 may include a first side T2A and a second side T2B arranged in parallel (e.g., substantially in parallel) in the second direction D2, and a third side T2C and a fourth side T2D arranged in parallel (e.g., substantially in parallel) in the first direction D1.

The third light-transmitting area TA3_1 may include a second chamfer CF2 at at least one corner. In some embodiments, the third light-transmitting area TA3_1 may include a first side T3A and a second side T3B arranged in parallel (e.g., substantially in parallel) in the second direction D2, a third side T3C and a fourth side T3D arranged in parallel (e.g., substantially in parallel) in the first direction D1, and a fifth side T3E that obliquely couples the end of the first side T3A with the end of the third side T3D. The third light-transmitting area TA3_1 may include the second chamfer CF2 by virtue of the fifth side T3E. The first chamfer CF1 of the first light-transmitting area TA1_1 and the second chamfer CF2 of the third light-transmitting area TA3_1 may be opposed to each other. In some embodiments, the first chamfer CF1 and the second chamber CF2 may have opposing shapes (e.g., the shape of the first chamfer CF1 may be a mirror image of the second chamfer CF2). It is, however, to be understood that the present disclosure is not limited thereto. In some exemplary embodiments, the first chamfer CF1 of the first light-transmitting area TA1_1 and the second chamfer CF2 of the third light-transmitting area TA3_1 may be oriented in the same (e.g., substantially the same) direction.

The first light-transmitting area TA1_1 may have a first width WT1_1 in the first direction D1, the second light-transmitting area TA2_1 may have a second width WT2_1 that is smaller than the first width WT1_1 in the first direction D1, and the third light-transmitting area TA3_1 may have a third width WT3_1 that is smaller than the second width WT2_1 in the first direction D1.

The first light-transmitting area TA1_1 may have a first length HT1_1 in the second direction D2, the second light-transmitting area TA2_1 may have a second length HT2_1 that is smaller than the first length HT1_1 in the second direction D2, and the third light-transmitting area TA3_1 may have a third length HT3_1 that is equal to the second length HT2_1 in the second direction D2.

The first side T1A of the first light-transmitting area TA1_1, the first side T2A of the second light-transmitting area TA2_1 and the first side T3A of the third light-transmitting area TA3_1 may be aligned with one another in the first direction, and the second side T2B of the second light-transmitting area TA2_1 and the second side T3B of the third light-transmitting area TA3_1 may be aligned with one another in the first direction, but the second side T1B of the first light-transmitting area TA1_1 may be closer to the second row RD2 than the second side T2B of the second light-transmitting area TA2_1 and the second side T3B of the third light-transmitting area TA3_1 are.

The fourth light-transmitting area TA4_1, the fifth light-transmitting area TA5_1 and the sixth light-transmitting area TA6_1 adjacent to the first light-transmitting area TA1_1, the second light-transmitting area TA2_1 and the third light-transmitting area TA3_1 in the second direction D2, respectively, are substantially identical to the first light-transmitting area TA1_1, the second light-transmitting area TA2_1 and the third light-transmitting area TA3_1 except that they are located in the second row RD2. For example, the fourth light-transmitting area TA4_1 has a fourth width WT4_1, a fourth height HT4_1, a first side T4A, a second side T4B, a third side T4C, a fourth side T4D, and a fifth side T4E; the fifth light-transmitting area TA5_1 has a fifth width WT5_1, a fifth height HT5_1, a first side T5A, a second side T5B, a third side T5C, and a fourth side T5D; and the sixth light-transmitting area TA6_1 has a sixth width WT6_1, a sixth height HT6_1, a first side T6A, a second side T6B, a third side T6C, a fourth side T6D, and a fifth side T6E.

A light-blocking area BA may be located around the light-transmitting areas TA1_1, TA2_1, TA3_1, TA4_1, TA5_1 and TA6_1 of a color conversion substrate 30_1 in the display area DA. In some exemplary embodiments, the light-blocking area BA may be divided into a first light-blocking area BA1_1, a second light-blocking area BA2_1, a third light-blocking area BA3_1, a fourth light-blocking area BA4_1, a fifth light-blocking area BA5, a sixth light-blocking area BA6.

The first light-blocking area BA1_1 may be located between the first light-transmitting area TA1_1 and the second light-transmitting area TA2_1 along the first direction D1. The second light-blocking area BA2_1 may be located between the second light-transmitting area TA2_1 and the third light-transmitting area TA3_1 along the first direction D1. The third light-blocking area BA3_1 may be located between the third light-transmitting area TA3_1 and the first light-transmitting area TA1_1 along the first direction D1. The fourth light-blocking area BA4_1 may be located between the first light-transmitting area TA1_1 and the fourth light-transmitting area TA4_1 along the second direction D2. The fifth light-blocking area BA5 may be located between the second light-transmitting area TA2_1 and the fifth light-transmitting area TA5_1 along the second direction D2. The sixth light-blocking area BA6 may be located between the third light-transmitting area TA3_1 and the sixth light-transmitting area TA6_1 along the second direction D2.

In some exemplary embodiments, the width of the second light-blocking area BA2_1 in the first direction D1 (the distance between the fourth side T2D of the second light-transmitting area TA2_1 and the third side T3C of the third light-transmitting area TA3_1) may be smaller than the width of the first light-blocking area BA1_1 in the first direction D1 (the distance between the fourth side T1D of the first light-transmitting area TA1_1 and the third side T2C of the second light-transmitting area TA2_1). The width of the third light-blocking area BA3_1 in the first direction D1 (the distance between the fourth side T3D of the third light-transmitting area TA3_1 and the third side T1C of the first light-transmitting area TA1_1) may be smaller than the width of the second light-blocking area BA2_1 in the first direction D1

In some exemplary embodiments, the width of the fifth light-blocking area BA5_1 in the second direction D2 (the distance between the second side T6B of the second light-transmitting area TA2_1 and the third side T5A of the fifth light-transmitting area TA5_1) may be smaller than the width of the fourth light-blocking area BA4_1 in the second direction D2 (the distance between the second side T1B of the first light-transmitting area TA1_1 and the first side T4A of the fourth light-transmitting area TA4_1). The width of the sixth light-blocking area BA6 in the second direction D2 (the distance between the second side T1B of the third light-transmitting area TA3_1 and the first side T6A of the sixth light-transmitting area TA6_1) may be equal to the width of the fifth light-blocking area BA5 in the second direction D2

Referring to FIG. 35, a third color filter 235_2 and a color pattern 210_1 may be located on the color conversion substrate 30_1.

The third color filter 235_2 may be disposed in the third light-transmitting area TA3_1 and the sixth light-transmitting area TA6_1. The color patterns 210_1 may include a first color pattern 210A disposed in the first light-blocking area BA1_1, a second color pattern 210B disposed in the second light-blocking area BA2_1, a third color pattern 210C disposed in the third light-blocking area BA3_1, a fourth color pattern 210D disposed in the fourth light-blocking area BA4_1, a fifth color pattern 210E disposed in the fifth light-blocking area BA5, and a sixth color pattern 210F disposed in the sixth light-blocking area BA6. The first to third color patterns 210A, 210a, and 210C may be coupled to the fourth to sixth color patterns 210D, 210E and 210F to surround the first to sixth light-transmitting areas TA1_1, TA2_1, TA3_1, TA4_1, TA5_1, and TA6_1 in a lattice form.

In some exemplary embodiments, the width of the second color pattern 210B in the first direction D1 may be smaller than the width of the first color pattern 210A, and the width of the third color pattern 210C in the first direction D1 may be smaller than the width of the second color pattern 210B.

In some exemplary embodiments, the width of the fourth color pattern 210D in the second direction D2 may be smaller than the width of the fifth color pattern 210E, and the width of the fifth color pattern 210E in the second direction D2 may be smaller than the width of the sixth color pattern 210F.

Referring to FIG. 36, a light-blocking member 220_1 may be disposed on the color conversion substrate 30_1.

The light-blocking members 220_1 may include a first light-blocking member 220A disposed in the first light-blocking area BA1_1 and having a width smaller than the first color pattern 210A in the first direction D1, a second light-blocking member 220B disposed in the second light-blocking area BA2_1 and having a width smaller than the second color pattern 210B in the first direction D1, a third light-blocking member 220C disposed in the third light-blocking area BA3_1 and having a width smaller than the third color pattern 210C in the first direction D1, a fourth light-blocking member 220D disposed in the fourth light-blocking area BA4_1 and having a width smaller than the fourth color pattern 210D in the second direction D2, a fifth light-blocking member 220E disposed in the fifth light-blocking area BA5 and having a width smaller than the fifth color pattern 210E, and a sixth light-blocking member 220F disposed in the sixth light-blocking area BA6 and having a width equal to the width of the sixth color pattern 210F.

The first to third light-blocking members 220A, 220B and 220C may be coupled to the fourth to sixth light-blocking members 220D, 220E and 220F to surround the first to sixth light-transmitting areas TA1_1, TA2_1, TA3_1, TA4_1, TA5_1, and TA6_1 in a lattice form.

Referring to FIG. 37, a first color filter 231_2 and a second color filter 233_2 may be located on the color conversion substrate 30_1.

The first color filter 231_2 may be located in the first light-transmitting area TA1_1 and the fourth light-transmitting area TA4_1. The second color filter 233_2 may be located in the second light-transmitting area TA2_1 and the fifth light-transmitting area TA5_1.

In some exemplary embodiments, each of the first color filter 231_2 and the second color filter 233_2 may be in a stripe shape extending in the second direction D2, and may traverse the fourth light-blocking area BA4 and the fifth light-blocking area BA5_1 between the first row RD1 and the second row RD2. In some exemplary embodiments, in the first light-blocking area BA1_1, an overlap region OR where one side of the first color filter 231_2 overlaps with the other side of the second color filter 233_2 may be formed, and the width 231P of the first color filter 231_2 may be larger than the width 233P of the second color filter 233_2.

Referring to FIG. 38, in the color conversion substrate 30_1, a first wavelength conversion pattern 330_2 that traverses the first light-transmitting area TA1_1, the fourth light-transmitting area TA4_1 and the fourth light-blocking area BA4_1 in a stripe shape, a second wavelength conversion pattern 340_2 that traverses the second light-transmitting area TA2_1, the fifth light-transmitting area TA5_1 and the fifth light-blocking area BA5 in a stripe shape, and a light transmission pattern 350_2 that traverses the third light-transmitting area TA3_1, the sixth light-transmitting area TA6_1 and the sixth light-blocking area BA6 in a stripe shape may be disposed.

The width of the first wavelength conversion pattern 330_2 in the first direction D1 may be larger than the width of the second wavelength conversion pattern 340_2. The width of the second wavelength conversion pattern 340_2 in the first direction D1 may be larger than the width of the light transmission pattern 350_2.

The anti-color-mixing member 370_1 may include a first anti-color-mixing member 370A disposed between the first wavelength conversion pattern 330_2 and the second wavelength conversion pattern 340_2, a second anti-color-mixing member 370B disposed between the second wavelength conversion pattern 340_2 and the light transmission pattern 350_2, and a third anti-color-mixing member 370C disposed between the light transmission pattern 350_2 and the first wavelength conversion pattern 330_2.

The width of the first anti-color-mixing member 370A in the first direction may be larger than that of the second anti-color-mixing member 370B, and the width of the second anti-color-mixing member 370B in the first direction may be larger than that of the third anti-color-mixing member 370C.

According to the above-described exemplary embodiments, it is possible to prevent or reduce color mixing between adjacent light-transmitting areas in a display device, and the display quality can be improved.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" refers to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While embodiments of the present disclosure have been described herein, they are merely examples and are not intended to limit the present disclosure. It will be understood by those of ordinary skill in the art that various modifications and applications can be made without departing from the spirit and scope of the present disclosure. For example, the respective components which are specifically illustrated in the embodiments described in the present disclosure may be practiced with modifications. Further, the differences relating to such modifications and applications should be construed as being included in the scope of the present disclosure as defined by the appended claims, and equivalents thereof.

What is claimed is:

1. A display device comprising:
a display substrate on which a plurality of light-emitting areas are defined; and
a color conversion substrate on which a plurality of light-transmitting areas respectively associated with the plurality of light-emitting areas and light-blocking areas between the plurality of light-transmitting areas are defined, the color conversion substrate comprising color patterns in the light-blocking areas, and light-blocking members on the color patterns,
wherein at least one of the light-emitting areas has an area smaller than the area of the light-transmitting area that overlaps it in a thickness direction,
wherein the color patterns comprise a blue colorant,
wherein the color conversion substrate further comprises a wavelength conversion pattern and a light transmission pattern,
wherein the wavelength conversion pattern is configured to convert or shift a peak wavelength of an incident light into a light of another peak wavelength, and emit the light of another peak wavelength, and
wherein the light transmission pattern is configured to transmit an incident light and comprises a scatterer.

2. The display device of claim 1, wherein the plurality of light-emitting areas comprises a first light-emitting area, a second light-emitting area, and a third light-emitting area arranged in the stated order in a first direction,
wherein the plurality of light-transmitting areas comprises a first light-transmitting area in line with the first light-emitting area, a second light-transmitting area in line with the second light-emitting area, and a third light-transmitting area in line with the third light-emitting area, and
wherein the area of the first light-emitting area is smaller than the area of the first light-transmitting area, and the area of the second light-emitting area is smaller than the area of the second light-transmitting area.

3. The display device of claim 2, wherein the area of the third light-emitting area is smaller than the area of the third light-transmitting area.

4. The display device of claim 2, wherein the area of the third light-emitting area is equal to the area of the third light-transmitting area.

5. The display device of claim 3, wherein the light-blocking areas comprise a first light-blocking area located between the first light-transmitting area and the second light-transmitting area along a second direction intersecting the first direction, a second light-blocking area located between the second light-transmitting area and the third light-transmitting area in the second direction, and a third light-blocking area located between the third light-transmitting area and the first light-transmitting area in the second direction, and
wherein the color conversion substrate comprises a base, and the color patterns are located on the base and comprise a first color pattern in the first light-blocking area, a second color pattern in the second light-blocking area, and a third color pattern in the third light-blocking area.

6. The display device of claim 5, wherein the color conversion substrate comprises color filters on the base,
wherein the color filters comprise: a first color filter in the first light-transmitting area, a second color filter in the second light-transmitting area, and a third color filter in the third light-transmitting area, and
wherein the third color filter comprises a same colorant as the first to third color patterns.

7. The display device of claim 6, wherein the third color filter is formed integrally with the first to third color patterns.

8. The display device of claim 6, wherein the width of the first light-emitting area in the first direction is smaller than a distance between the third color pattern and the first color pattern in the first direction, and
wherein the width of the second light-emitting area in the second direction is smaller than a distance between the first color pattern and the second color pattern in the first direction.

9. The display device of claim 8, wherein the width of the third light-emitting area in the first direction is smaller than a distance between the second color pattern and the third color pattern in the first direction.

10. The display device of claim 8, wherein the width of the third light-emitting area in the first direction is equal to a distance between the second color pattern and the third color pattern in the first direction.

11. The display device of claim 6, wherein the light-blocking members further comprise first to third light-blocking members on the first to third color patterns, respectively, and
wherein the widths of the first to third light-blocking members are smaller than the widths of the first to third color patterns, respectively.

12. The display device of claim 11, wherein the wavelength conversion pattern comprises: a first wavelength conversion pattern on the first color filter and configured to convert light of a first color into light of a second color; a second wavelength conversion pattern on the second color filter and configured to convert the light of the first color into light of a third color; and a light transmission pattern on the third color filter and configured to transmit the light of the first color.

13. The display device of claim 12, wherein the first color filter is configured to transmit the light of the second color and configured to block the light of the first color and the light of the third color, the second color filter is configured to transmit the light of the third color and configured to block the light of the first color and the light of the second color, and the third color filter is configured to transmit the light of the first color and configured to block the light of the second color and the light of the third color.

14. The display device of claim 13, wherein the color conversion substrate further comprises a first capping layer covering the first to third color filters, the light-blocking members and the first to third color patterns,
wherein the first capping layer comprises an inorganic material, and
wherein the first wavelength conversion pattern, the second wavelength conversion pattern and the light transmission pattern are located on the first capping layer.

15. The device of claim 14, further comprising:
a second capping layer on the first capping layer and covering the first wavelength conversion pattern, the second wavelength conversion pattern and the light transmission pattern; and
an anti-color-mixing member on the second capping layer and located between the light transmission pattern and the first wavelength conversion pattern and between the first wavelength conversion pattern and the second wavelength conversion pattern.

16. The display device of claim 14, further comprising:
partition walls on the first capping layer,
wherein the partition walls comprise: a first partition wall associated with the first light-blocking member; a second partition wall associated with the second light-blocking member; and a third partition wall associated with the third light-blocking member,
wherein the first wavelength conversion pattern is located between the third partition wall and the second partition wall, the second wavelength conversion pattern is located between the first partition wall and the second partition wall, and the light transmission pattern is located between the second partition wall and the third partition wall, and
wherein the display device further comprises a second capping layer covering the first wavelength conversion pattern, the second wavelength conversion pattern, the light transmission pattern, the first partition wall, the second partition wall, and the third partition wall.

17. A display device comprising:
a display substrate comprising a pixel-defining layer defining a plurality of light-emitting areas;
a color conversion substrate comprising color patterns defining a plurality of light-transmitting areas overlapping with the light-emitting areas in a thickness direction, respectively; and
a filler between the display substrate and the color conversion substrate,
wherein the light-emitting areas comprise a first light-emitting area having a first area, a second light-emitting area having a second area smaller than the first area, and a third light-emitting area having a third area smaller than the second area,
wherein the light-transmitting areas comprise a first light-transmitting area overlapping with the first light-emitting area in the thickness direction and having a fourth area larger than the first area, a second light-transmitting area overlapping with the second light-emitting area in the thickness direction and having a fifth area larger than the second area, and a third light-transmitting area overlapping with the third light-emitting area in the thickness direction,
wherein the color patterns comprise a blue colorant,
wherein the first light-transmitting area comprises a first chamfer, and the third light-transmitting area comprises a second chamfer, and
wherein the first chamfer and the second chamfer have opposing shapes.

18. The display device of claim 17, wherein the third light-transmitting area has an area larger than the third light-emitting area.

19. The display device of claim 17, wherein the third light-transmitting area has an area equal to the third light-emitting area.

20. The display device of claim 18, wherein the display substrate comprises a first light-emitting element in the first light-emitting area, a second light-emitting element in the second light-emitting area, and a third light-emitting element in the third light-emitting area,
wherein the color conversion substrate comprises a light-blocking member overlapping with the color patterns, a red color filter overlapping with the first light-emitting element, a green color filter overlapping the second light-emitting element, a blue color filter overlapping with the third light-emitting element, and
wherein the width of the red color filter is larger than the width of the first light-emitting area, the width of the green color filter is larger than the width of the second light-emitting area, and the width of the blue color filter is larger than the width of the third light-emitting area.

21. The display device of claim 18, wherein the first light-transmitting area, the second light-transmitting area and the third light-transmitting area are sequentially arranged in a first direction, a first side of each of the first light-transmitting area, the second light-transmitting area, and the third light-transmitting area being aligned with one another in the first direction, a second side of each of the second light-transmitting area and the third light-transmitting area being aligned with one another in the first direction, and
wherein a second side of the first light-transmitting area protrudes more than the second sides of the second light-transmitting area and the third light-transmitting area in a second direction perpendicular to the first direction.

22. A display device comprising:
a display substrate on which a plurality of light-emitting areas are defined; and
a color conversion substrate on which a plurality of light-transmitting areas respectively associated with the plurality of light-emitting areas and light-blocking areas between the plurality of light-transmitting areas are defined, the color conversion substrate comprising color patterns in the light-blocking areas, and light-blocking members on the color patterns,
wherein at least one of the light-emitting areas has an area smaller than the area of the light-transmitting area that overlaps it in a thickness direction,
wherein the color patterns comprise a blue colorant,
wherein the plurality of light-emitting areas comprises a first light-emitting area, a second light-emitting area, and a third light-emitting area arranged in the stated order in a first direction,
wherein the plurality of light-transmitting areas comprises a first light-transmitting area in line with the first light-emitting area, a second light-transmitting area in line with the second light-emitting area, and a third light-transmitting area in line with the third light-emitting area,
wherein the light-blocking areas comprise a first light-blocking area located between the first light-transmitting area and the second light-transmitting area along a second direction intersecting the first direction, a second light-blocking area located between the second light-transmitting area and the third light-transmitting area in the second direction, and a third light-blocking area located between the third light-transmitting area and the first light-transmitting area in the second direction,
wherein the color patterns comprise a first color pattern in the first light-blocking area, a second color pattern in the second light-blocking area, and a third color pattern in the third light-blocking area,
wherein the light-blocking members comprise first to third light-blocking members on the first to third color patterns, respectively, and
wherein the widths of the first to third light-blocking members are smaller than the widths of the first to third color patterns, respectively.

* * * * *

UNITED STATES PATENT AND TRADEMARK OFFICE
CERTIFICATE OF CORRECTION

PATENT NO. : 11,404,492 B2
APPLICATION NO. : 16/728295
DATED : August 2, 2022
INVENTOR(S) : Jung Bae Song et al.

Page 1 of 1

It is certified that error appears in the above-identified patent and that said Letters Patent is hereby corrected as shown below:

In the Claims
Column 38, Line 61, Claim 15      Delete "The device",
                                  Insert -- The display device --

Signed and Sealed this
Fourth Day of October, 2022

Katherine Kelly Vidal
*Director of the United States Patent and Trademark Office*